United States Patent [19]
Nikoh et al.

[11] Patent Number: 5,989,929
[45] Date of Patent: Nov. 23, 1999

[54] APPARATUS AND METHOD FOR MANUFACTURING SEMICONDUCTOR DEVICE

[75] Inventors: Hideo Nikoh, Shiga; Shinichi Imai; Nobuhiro Jiwari, both of Osaka; Satoshi Nakagawa, Toyama; Shoji Matsumoto, Toyama; Yoji Bito, Toyama, all of Japan

[73] Assignee: Matsushita Electronics Corporation, Osaka, Japan

[21] Appl. No.: 09/119,588

[22] Filed: Jul. 21, 1998

[30] Foreign Application Priority Data

Jul. 22, 1997 [JP] Japan .................................... 9-195418
Nov. 5, 1997 [JP] Japan .................................... 9-320505

[51] Int. Cl.$^6$ .................................................. H01L 21/00
[52] U.S. Cl. .............................. 438/9; 156/345; 438/714
[58] Field of Search ......................... 438/9, 714; 216/59, 216/66, 67; 156/345 P, 345 MT

[56] References Cited

U.S. PATENT DOCUMENTS 5,593,539 1/1997 Kubota et al. ...................... 438/714 X
5,770,097 6/1998 O'Neill et al. ...................... 438/714 X

OTHER PUBLICATIONS

K. Kiozawa et al., "SiO$_2$ Etching in C$_4$F$_8$/O$_2$ ECR Plasma", Proc. of 1995 Dry Process Symposium, VIII–7, pp. 255–260, 1995.

*Primary Examiner*—William Powell
*Attorney, Agent, or Firm*—McDermott, Will & Emery

[57] ABSTRACT

A reactor is composed of a lower frame of a chamber, a quartz dome, an upper electrode, an 0 ring, and the like. A lower electrode and a substrate as a workpiece to be processed thereon are disposed in the reactor. The temperature of the quartz dome is maintained at a temperature of 180° C. or higher by means of a heater. Fluorocarbon gas such as C$_2$F$_6$ gas or C$_4$F$_8$ gas is introduced into the reactor through a gas inlet and RF power from a first RF power source is applied to an antenna coil to produce a plasma and thereby etch an oxide film on the substrate. By heating the quartz dome to a high temperature, a deposit which hinders the release of oxygen from a wall face is prevented from being attached and the deposit on the bottom of the hole which causes an etch stop during processing is removed with oxygen. This prevents the etch stop during an etching process for forming a deep hole.

36 Claims, 37 Drawing Sheets

WITHOUT ETCH STOP

WITH ETCH STOP

Fig. 10 (a) NORMAL

Fig. 10 (b) WITH ETCH STOP

Fig. 10 (c) AFTER DEPOSITION RESULTING FROM OVER-ETCHING

ALUMINUM-BASED DEPOSIT

APPARATUS AND METHOD FOR MANUFACTURING SEMICONDUCTOR DEVICE

BACKGROUND OF THE INVENTION

The present invention relates to an apparatus and method for manufacturing a semiconductor device by using a plasma.

At present, plasma processing technology using a plasma produced in a reactor to perform a variety of semiconductor fabrication processes, including dry etching and CVD, is essential to the processing of components contained in a highly integrated semiconductor device. Before a contact hole for providing a connection between a wire and an active region, such as the source/drain regions of a transistor, or a via hole for providing a connection between wires is formed in an interlayer insulating film composed of an oxide film, a plasma is generated in a reactor such that vertical etching proceeds at the bottom of the hole with ions impinging thereon, while lateral etching is suppressed with a sidewall protecting film covering the sidewall of the hole. Such anisotropic etching allows the formation of a contact hole or via hole having an extremely small diameter and yet extending through the interlayer insulating film substantially perpendicularly thereto.

With the increasing scaling down of a semiconductor device, the width of a wire and the diameter of the contact hole or via hole are also reduced increasingly. However, the interlayer insulating film has not substantially been reduced in size irrespective of the holes reduced in diameter. As a result, the ratio of the thickness of the interlayer insulating film to the diameter of the hole (aspect ratio) has been increased accordingly. With the aspect ratio increasing, there are more cases where normal holes are not formed in the process of forming the holes. In the case of forming a hole with a high aspect ratio, the phenomenon of so-called "microloading" is especially likely to occur in which the etch rate varies depending on the diameter of the hole. If the microloading effect occurs during the formation of a hole having an extremely small diameter, in particular, etching proceeds at progressively lower rates and, in some cases, etching may stop before a through hole is formed.

With recent improvements in dry-etching technology, there have been developed a technique termed TM (Time Modulation) etching whereby the formation of the sidewall protecting film and the etching process are alternately performed in order to maximally suppress the formation of the sidewall protecting film and a technique termed low-temperature etching whereby a wafer is cooled to a temperature at which the reaction of radicals is frozen at the sidewall in order to perform anisotropic etching without forming the sidewall protecting film. These techniques achieve anisotropy, while completely or maximally suppressing the formation of the sidewall protecting film. The techniques also suppress the occurrence of the aforesaid microloading phenomenon.

On the other hand, a low-pressure and high-density plasma such as an inductively coupled plasma or a helicon wave excited plasma has recently been used as a plasma source suitable for etching performed to form a hole with a high aspect ratio. Such a plasma is generated in a reactor with an antenna disposed on a wall portion thereof composed of an insulator. The use of such a plasma achieves high anisotropy, a high etch rate, and a high selectivity to a silicon substrate.

However, when the technique using the high-density plasma is applied to etching, the phenomenon occurs in which etching stops during processing and a through hole is not formed. Such "etch stop" is a phenomenon caused by an abrupt transition in etch rate from a substantially constant value maintained during normal etching to zero. The etch stop does not occur at a fixed time point but occurs at different time points during etching. For example, the etch stop may occur immediately after or some time after the initiation of etching. After several wafers were processed, the etch stop abruptly occurs during the processing of the subsequent wafer, which suggests the presence of some factors conspiring to cause the etch stop.

Although the cause of the etch stop occurring at different time points has not completely been tracked down thus far, the etch stop is a phenomenon obviously distinct from the microloading phenomenon. Hereinafter, the present inventors will refer to such a phenomenon in which etching stops as "etch stop".

FIG. 37 shows etching proceeding in the three cases of normal etching, microloading, and etch stop. In the drawing, the horizontal axis represents an etching period and the vertical axis represents the depth of an etched portion. The etching lines Etn, Eml, and Est represent the respective cases where normal etching is performed, where the microloading occurs, and where the etch stop occurs. As indicated by the etching line Eml shown in FIG. 37, the microloading is characterized by the etch rate lowering when etching proceeds to a certain depth. By contrast, the etch stop is characterized by the abrupt stop of the normal etching process, as indicated by the etching line shown Est in FIG. 37. In addition, the etch stop occurs at different time points during etching as stated previously. In contrast to the microloading effect which is a phenomenon caused by the progressive lowering of an etch rate, the phenomenon of "etch stop" is a phenomenon caused by an abrupt transition in etch rate from a substantially constant value maintained during normal etching to zero. Besides, the etch stop occurs under conditions free from the microloading effect.

In general, the etch rate R during plasma etching is represented by the following equation (1):

$$R = (1/\rho) \cdot \theta \Gamma i \cdot Ei - \theta \cdot \Gamma d \quad (1)$$

where $\rho$ is the density of a workpiece to be etched, $\theta$ is the surface coverage of radicals, $\Gamma i$ is a function representing the quantity of ion fluxes, $Ei$ is ion energy, and $\Gamma d$ is a function representing the quantity of radical fluxes. The first term of the equation (1) is a factor contributing to etching, while the second term thereof is a factor contributing to deposition.

When etching stops, the etch rate R in the foregoing equation (1) becomes 0 or less. To satisfy $R \leq 0$, the following conditions should be satisfied.

(a) When $\Gamma i \approx 0$

In this case, the quantity of ion fluxes coming into the contact hole is reduced, which is caused by an increase in the aspect ratio of the contact hole or surface charging.

(b) When $Ei \approx 0$

In this case, the energy of ions coming into the contact hole is reduced, which is particularly caused by the presence of charges inhibiting the ions from moving downward in the contact hole formed in the insulating film. For instance, this is the case where positive charges are present at the bottom of the contact hole and negative charges are present at the upper portion of the sidewall of the contact hole.

(c) when $(1/\rho) \cdot \theta \cdot \Gamma i \cdot Ei \leq \theta \cdot \Gamma d$ In this case, the quantity of radicals contributing to deposition is larger than the quantity of ions contributing to etching, which is caused by an increase in the $C_2/F$ ratio or $C/F$ ratio in the plasma.

The microloading effect may generally be considered as phenomena occurring when the foregoing condition (c) is satisfied. Although the mechanism of these phenomena still remains to be elucidated, it can be inferred that the microloading is the phenomenon in which the etch rate is gradually reduced due to a progressive increase in the quantity of radicals supplied into the hole to form a deposit so that the functions Γi, Γd are expressed as continuous functions, while the etch stop is the phenomenon in which the etch rate is abruptly reduced to zero so that the functions Γi Γd are expressed as discontinuous functions.

SUMMARY OF THE INVENTION

The present invention has been achieved based on the results of various experiments performed to determine the cause of the etch-stop phenomenon and it is therefore an object of the present invention to provide an apparatus and method for manufacturing a semiconductor device which positively prevent the etch stop by specifying conditions inducing the etch stop and conditions free from the etch stop.

To attain the above object, the present invention has provided means for removing a deposit which prevents plasma processing including etching by utilizing the effect of releasing oxygen from the wall surface of the reactor or by supplying gas containing oxygen.

A first apparatus for manufacturing a semiconductor device according to the present invention comprises: a reactor for performing etching with respect to a film on a wafer disposed therein; gas supplying means for introducing, into the reactor, etching gas containing at least carbon and fluorine; plasma generating means for changing the etching gas into a high-density plasma; concentration changing means for performing the function of changing at least one of an O concentration and a C concentration in the plasma, the concentration changing means being disposed in the reactor to have at least a part of a surface exposed therein; and adjusting means for adjusting the level of the concentration changing function performed by the concentration changing means.

The arrangement achieves the following effect. That is, if the O concentration is excessively low relative to the C concentration, the etch stop may occur because a carbon containing product deposited on the bottom of the hole cannot be removed. Conversely, if the O concentration is excessively high relative to the C concentration, the underlie for the wafer is also removed, resulting in degraded etching properties. Therefore, a through hole can be formed by using the adjusting means to adjust the O concentration or the C concentration and thereby preventing the occurrence of the etch stop.

In the first apparatus for manufacturing a semiconductor device, the concentration changing means is an oxygen containing member, the adjusting means is an antenna coil disposed in proximity to the oxygen containing member, and the plasma generating means generates the high-density plasma in the reactor by supplying RF power to the antenna coil such that the deposit on the surface of the oxygen containing member is more likely to evaporate. Consequently, oxygen is released from the surface of the oxygen containing member and the occurrence of the etch stop due to the lowering of the O concentration is prevented.

In the first apparatus for manufacturing a semiconductor device, the plasma generating means is preferably one of an inductively-coupled plasma generator, a helicon-wave plasma generator, and an ECR plasma generator, each for generating the high-density plasma with a density of $1 \times 10^{11}/cm^3$ or more.

In the first apparatus for manufacturing a semiconductor device, the etching gas preferably contains at least one of $CF_4$, $C_2F_6$, $C_3F_8$, $C_4F_8$, $C_5F_8$ and $C_6F_6$.

When the first apparatus for manufacturing a semiconductor device further comprises O-light-intensity detecting means for measuring an O light intensity in the plasma, the level of the concentration changing function of the concentration changing means can be adjusted by the adjusting means such that the O light intensity measured by the O-light-intensity detecting means is within a proper range predetermined.

When the first apparatus for manufacturing a semiconductor device further comprises: O-light-intensity detecting means for measuring an O light intensity in the plasma; and F-light-intensity detecting means for measuring the F light intensity in the plasma, the level of the concentration changing function of the concentration changing means can be adjusted by the adjusting means such that the ratio of the O light intensity measured by the O-light-intensity detecting means to the F light intensity measured by the F-light-intensity detecting means is within a proper range predetermined.

The arrangement implements an apparatus for manufacturing a semiconductor device having the function of preventing the occurrence of the etch stop without lowering the etch rate.

When the first apparatus for manufacturing a semiconductor device further comprises: O-light-intensity detecting means for measuring an O light intensity in the plasma; and $C_2$-light-intensity detecting means for measuring a $C_2$ light intensity in the plasma, the level of the concentration changing function of the concentration changing means can be adjusted by the adjusting means such that the ratio of the O light intensity measured by the O-light-intensity detecting means to the $C_2$ light intensity measured by the $C_2$-light-intensity detecting means is within a proper range predetermined.

The arrangement implements an apparatus for manufacturing a semiconductor device having the function of preventing the occurrence of the etch stop while retaining a high etching selectivity to the underlying film.

When the first apparatus for manufacturing a semiconductor device further comprises: O-light-intensity detecting means for measuring an O light intensity in the plasma; F-light-intensity detecting means for measuring a F light intensity in the plasma; and $C_2$-light-intensity detecting means for measuring a $C_2$ light intensity in the plasma, the adjusting means receives an output from each of the light-intensity detecting means and the level of the concentration changing function of the concentration changing means can be adjusted by the adjusting means such that the ratio of the O light intensity measured by the O-light-intensity detecting means to the F light intensity measured by the F-light-intensity detecting means is within a proper range predetermined and that the ratio of the O light intensity measured by the O-light-intensity detecting means to the $C_2$ light intensity measured by the $C_2$-light-intensity detecting means is within a proper range predetermined.

In the first apparatus for manufacturing a semiconductor device, the concentration changing means is an oxygen containing member and the adjusting means is a heater for heating the oxygen containing member such that the evaporation of a deposit on the surface of the oxygen containing member is accelerated. Consequently, oxygen is released from the surface of the oxygen containing member and the occurrence of the etching stop due to a reduction in the O concentration is prevented.

In the first apparatus for manufacturing a semiconductor device, the concentration changing means is a silicon containing member disposed in the reactor to have at least a part of a surface exposed therein and the adjusting means is a heater for heating the silicon containing member such that the F concentration is adjusted by utilizing the absorption of fluorine in the silicon containing member. Consequently, the etching function is adjusted, while the O concentration is relatively adjusted.

In the first apparatus for manufacturing a semiconductor device, each of the concentration changing means and the adjusting means is a carbon heater disposed in the reactor to have at least a part of a surface exposed therein such that the C concentration in the plasma is adjusted by using carbon released from the carbon heater. Consequently, the etching selectivity is adjusted, while the O concentration is relatively adjusted.

In the first apparatus for manufacturing a semiconductor device, the concentration changing means is composed of quartz, the etching gas is fluorocarbon gas, and the adjusting means heats the concentration changing means such that the temperature of the concentration changing means ranges from 180 to 300° C. Consequently, the amount of oxygen released into the reactor can be held within the proper range.

A second apparatus for manufacturing a semiconductor device according to the present invention comprises: a reactor for performing etching with respect to a film on a wafer disposed therein; gas supplying means for introducing etching gas into the reactor; and plasma generating means for changing the etching gas into a high-density plasma, wherein a metal member having at least a part of a surface exposed in the reactor is not disposed therein.

The arrangement suppresses the occurrence of the etch stop without reducing the etchant species in the plasma through the reaction with metal ions in the reactor.

In the apparatus for manufacturing a semiconductor device, the metal may be at least one of Al, Ti, Cu, W, and Co.

A first method of manufacturing a semiconductor device is for manufacturing a semiconductor device on a substrate and comprises: a first step of disposing, in a reactor, a wafer including the substrate, a film formed on the substrate, and a mask formed on the film; a second step of introducing gas into the reactor; and a third step of generating a plasma in the reactor and performing dry etching to form a hole in a portion of the film underlying an aperture of the mask, wherein the third step is performed while adjusting at least one of an O concentration and C concentration in the plasma such that an etch stop which is a phenomenon caused by an abrupt transition in etch rate from a substantially constant value maintained during normal etching to zero does not occur.

The method prevents the occurrence of the etch stop resulting from an excessively low O concentration relative to the C concentration in the plasma as well as a reduction in selectivity resulting from an excessively high O concentration relative to the C concentration in the plasma.

In the first method of manufacturing a semiconductor device, the O concentration in the plasma is preferably adjusted such that a carbon containing product is deposited on the substrate after the hole is formed completely.

In the first method of manufacturing a semiconductor device, a proper range of an O light intensity in the plasma is preferably predetermined such that the etch stop does not occur and the third step includes adjusting the O concentration in the plasma, while measuring the O light intensity in the plasma, such that the O light intensity is within the proper range.

In the first method of manufacturing a semiconductor device, a proper range of a ratio of an O light intensity to a F light intensity in the plasma may be predetermined such that the etch stop does not occur, the second step may include introducing, into the reactor, either one of fluorocarbon gas and a gas mixture of the fluorocarbon gas and inert gas, and the third step may include adjusting a concentration ratio between O and F in the plasma, while measuring the O light intensity and the F light intensity in the plasma, such that the ratio of the O light intensity to the F light intensity is within the proper range predetermined. In that case, a proper range of the concentration ratio between O and F in the plasma is preferably 4 to 10.

In the first method of manufacturing a semiconductor device, a proper range of a ratio of an O light intensity to a $C_2$ light intensity in the plasma may be predetermined such that the etch stop does not occur, the second step may include introducing, into the reactor, either one of fluorocarbon gas and a gas mixture of the fluorocarbon gas and inert gas, and the third step may include adjusting a concentration ratio between O and $C_2$ in the plasma, while measuring the O light intensity and the $C_2$ light intensity in the plasma, such that the ratio of the O light intensity to the $C_2$ light intensity is within the proper range predetermined. In that case, a proper range of the concentration ratio between O and C in the plasma is preferably 4 to 10.

In the first method of manufacturing a semiconductor device, a proper range of a ratio of an O light intensity to a F light intensity in the plasma and a proper range of a ratio of the O light intensity to a $C_2$ light intensity in the plasma are more preferably predetermined such that the etch stop does not occur, the second step more preferably include introducing, into the reactor, either one of fluorocarbon gas and a gas mixture of the fluorocarbon gas and inert gas, and the third step more preferably include adjusting a concentration ratio between O, F, and $C_2$ in the plasma, while measuring the O light intensity, the F light intensity, and the $C_2$ light intensity in the plasma, such that the ratio of the O light intensity to the F light intensity is within the proper range predetermined and that the ratio of the O light intensity to the $C_2$ light intensity is within the proper range predetermined.

In the first method of manufacturing a semiconductor device, at least one of a carbon containing member, a fluorine containing member, and an oxygen containing member may be disposed in the reactor and the third step may include adjusting a concentration ratio between O, F, and $C_2$ in the plasma by controlling at least one of the amounts of carbon, fluorine, and oxygen released from the respective members.

In the first method of manufacturing a semiconductor device, the third step may include adjusting a concentration ratio between O, F, and $C_2$ by introducing, into the reactor, gas containing at least one of carbon, fluorine, and oxygen.

In the first method of manufacturing a semiconductor device, the second step preferably includes introducing, into the reactor, gas containing at least one of $CF_4$, $C_2F_6$, $C_3F_8$, $C_4F_8$, $C_5F_8$, and $C_6F_6$.

In the first method of manufacturing a semiconductor device, the second step preferably includes introducing, into the reactor, gas containing a compound represented by $C_xF_yO_z$, (where x, y, and z represent a component ratio).

The method allows the adjustment of the O, F, and C concentrations in the plasma by using one type of gas so that the number of mass flow controllers is reduced, resulting in lower equipment cost and simplified control.

The present invention achieves a remarkable effect when it is applied to the case where an aspect ratio of the aperture of the mask to the entire hole is 4 or higher and the hole has a diameter of 1 μm or less.

In the first method of manufacturing a semiconductor device, the film is preferably an oxide film.

A second method of manufacturing a semiconductor device according to the present invention is implemented by using an apparatus comprising a reactor having an oxygen containing member composed of a material containing oxygen at a wall portion thereof and an antenna coil disposed in proximity to the oxygen containing member and comprises: a first step of measuring, in replacing the oxygen containing member, the amount of oxygen released from an oxygen containing member and composing the reactor of the oxygen containing member if it releases a desired amount of oxygen; a second step of introducing gas into the reactor with a wafer to be formed with the semiconductor device being disposed in the reactor; and a third step of generating a high-density plasma in the reactor by supplying RF power to the antenna coil and performing etching for forming the semiconductor device.

In accordance with the method, the oxygen containing member can be attached to satisfy conditions free from the etch stop even when the amount of released oxygen varies with variations in the attachment of the oxygen containing member. Moreover, since etching is performed in the reactor, a through hole can surely be formed.

A third method of manufacturing a semiconductor device according to the present invention is implemented by using an apparatus comprising a reactor having an oxygen containing member composed of a material containing oxygen at a wall portion thereof and an antenna coil disposed in proximity to the oxygen containing member and comprises: a first step of measuring, in replacing the oxygen containing member, the amount of oxygen released from the oxygen containing member and determining a flow rate of gas containing oxygen such that a desired amount of oxygen is released; a second step of introducing gas into the reactor with a wafer to be formed with the semiconductor device being disposed in the reactor; a third step of generating a high-density plasma in the reactor by supplying RF power to the antenna coil; and a fourth step of performing etching for forming the semiconductor device, while introducing the gas containing oxygen into the chamber at the flow rate determined in the first step.

The method surely prevents the occurrence of the etch stop with a supply of oxygen from the gas containing oxygen even when a sufficient amount of oxygen to circumvent the occurrence of the etch stop cannot be obtained due to variations in the attachment of the oxygen containing member.

A fourth method of manufacturing a semiconductor device according to the present invention is implemented by using an apparatus comprising a reactor having an oxygen containing member composed of a material containing oxygen at a wall portion thereof, an antenna coil disposed in proximity to the oxygen containing member, gas supplying means for introducing gas into the reactor, plasma generating means for generating an inductively coupled plasma, a helicon-wave plasma, or an ECR plasma in the reactor by supplying RF power to the antenna coil, and light-intensity detecting means for measuring an O light intensity in the plasma and comprises: a first step of introducing gas into the reactor with a wafer to be formed with the semiconductor device being disposed in the reactor; a second step of generating a plasma in the reactor by using the plasma generating means and performing etching for forming a hole in a part of the wafer; and a third step of preventing the subsequent wafer from being etched when a detect value from the light-intensity detecting means satisfies a condition inducing an etch stop which is a phenomenon caused by an abrupt transition in etch rate from a substantially constant value maintained during normal etching to zero.

In that case, it is preferred that the gas supplying means supplies fluorocarbon gas, the light-intensity detecting means also measures a F light intensity in the plasma, the method further comprises the step of calculating a ratio of the O light intensity to the F light intensity, and the third step includes preventing the subsequent wafer from being etched when the light intensity ratio calculated by the calculating means satisfies a condition inducing the etch stop.

These methods prevent the manufacture of a defective product due to the etch stop.

A fifth method of manufacturing a semiconductor device according to the present invention is implemented by using an apparatus comprising a reactor for performing etching with respect to a film on a wafer disposed therein, gas supplying means for introducing etching gas into the reactor, plasma generating means for changing the etching gas into a high-density plasma, and a metal member disposed in the reactor to have at least a part of a surface exposed therein and comprises: a first step of introducing the etching gas into the reactor with the wafer to be formed with the semiconductor device being disposed in the reactor; a second step of generating the plasma in the reactor by using the plasma generating means and performing etching for forming a hole in apart of the wafer; and a third step of supplying, after forming the hole, a flow of the etching gas for a given period of time to remove metal ions generated from the metal member in the reactor.

The method prevents the occurrence of the etch stop resulting from the accumulation of the metal ions.

In the fifth method of manufacturing a semiconductor device, the second step preferably includes performing the etching for forming a hole in a part of the wafer at an etch rate lower than a standard value to remove the metal ions generated from the metal member in the reactor and also serves as the third step for the preceding wafer.

This allows a reduction in the number of process steps.

DETAILED DESCRIPTION OF THE INVENTION

Figure 1:
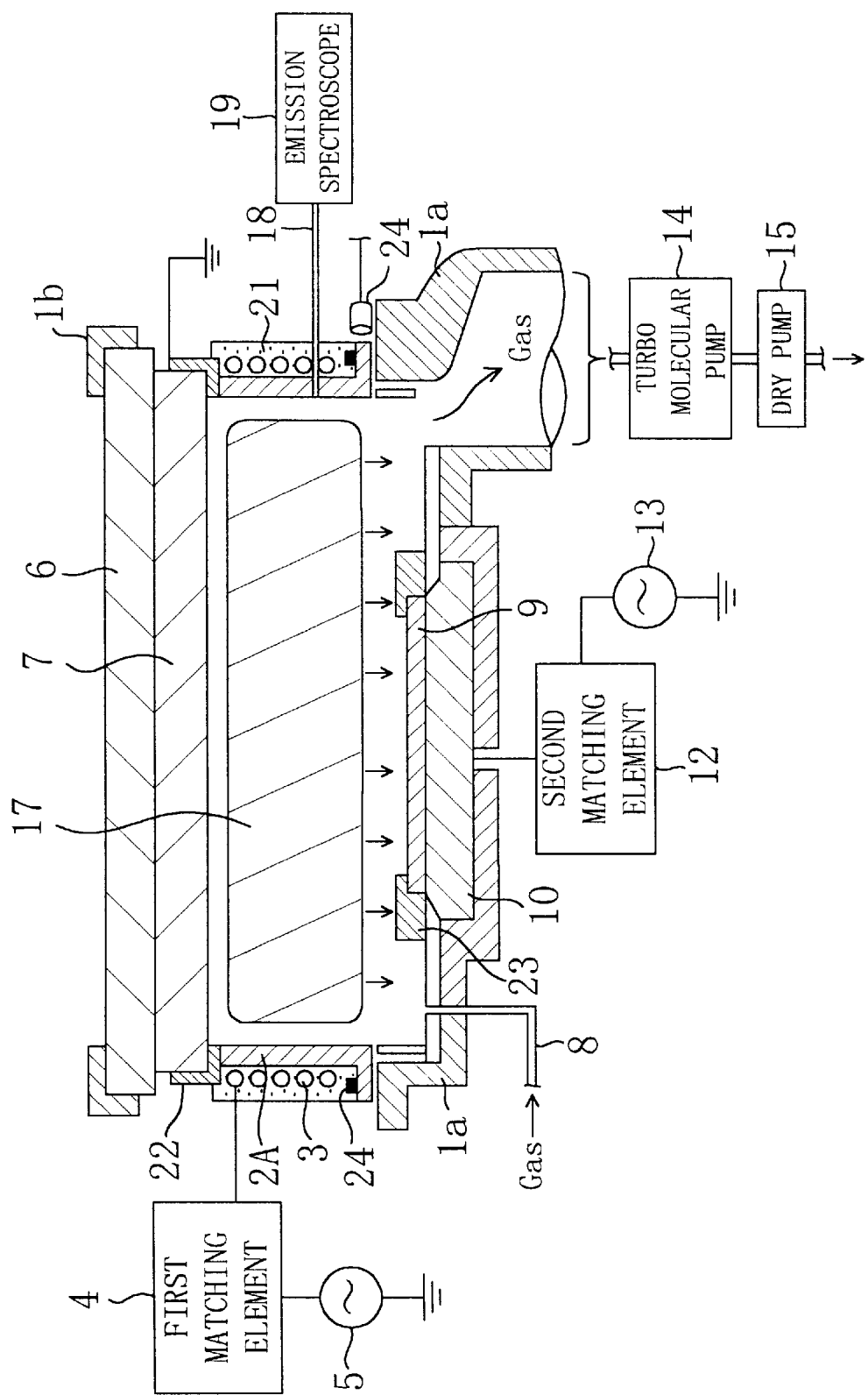
FIG. 1 is a block diagram partially showing in cross section an exemplary structure of an apparatus for manufacturing a semiconductor device according to the present invention.

Referring now to the drawings, a description will be given first to data obtained through various experiments performed to examine the relationship between an etch stop and the concentration ratio between carbon, fluorine, and oxygen in a plasma according to the embodiments of the present invention.

FIG. 1 illustrates a structure of an apparatus for manufacturing a semiconductor device used in the experiments. In the drawing are shown: a lower frame 1a of a chamber surrounding a reactor; an upper frame 1b of the chamber; a quartz dome 2A (oxygen containing member) composing the center portion of the chamber; an antenna coil 3 wound around the outer circumferential portion of the quartz dome 2A; a first matching element 4 for RF power supplied to the antenna coil 3; a first RF power source 5; an upper electrode 7 made of polysilicon; a top heater 6 for heating the upper electrode 7; a gas inlet 8; a substrate 9 as a workpiece to be processed; a lower electrode 10; a second matching element 12 for RF power supplied to the lower electrode 10; a second RF power source 13; a turbo molecular pump 14; a dry pump 15; a plasma 17; an optical fiber 18 for transmitting light from the plasma 17; an emission spectroscope 19; an alumina cylinder 21 for protecting the antenna coil 3; a cooling ring 22; a wafer clamp 23 made of quartz; and a dome heater 24 disposed on the lower end portion of the alumina cylinder 21 to heat the quartz dome 2A. The gas inlet 8 receives supplies of various gas necessary for etching from a gas supply system (not shown). The flow rate of the various gas can be adjusted to a desired value by means of a mass flow controller and a control valve.

As shown in FIG. 1, the lower frame 1a of the chamber, the quartz dome 2, and the upper frame 1b of the chamber form the reactor which is evacuated by means of the turbo molecular pump 14 and the dry pump 15. The lower electrode 10 is disposed in the reactor. The substrate 9 as a workpiece to be processed is placed on the lower electrode 10. The temperature of the upper electrode 7 can be adjusted by means of the top heater 6. The temperature of quartz dome 2A can be adjusted by means of the dome heater 24.

Prior to processing the substrate 9, fluorocarbon gas such as gas containing $C_2F_6$ is introduced at a flow rate of 40 sccm into the reactor through the gas inlet 8 with the addition of no $O_2$ gas. With the pressure adjusted to 5 mTorr (0.67 Pa) in the reactor, the first RF power source 5 applies RF power of about 2700 W as source power to the antenna coil 3 and the first matching element 4 suppresses the reflected power of the RF power, whereby the plasma 17 is generated in the reactor. The second RF power 13 applies RF power of about 1300 W as bias power to the lower electrode 10 and the second matching element 12 suppresses the reflected power of the RF power, whereby a bias voltage for biasing the plasma 17 in the direction of the substrate 9 is applied to a portion overlying the substrate 9. A region to be processed over the substrate 9, such as an interlayer insulating film, is etched by using ions accelerated by the bias voltage, resulting in a hole. For example, $C_xF_y$ radicals (x=0, 1, 2, ...; y=0, 1, 2, ...) generated from $C_2F_6$ decomposed in the plasma react with a silicon oxide composing the interlayer insulating film so that etching proceeds while retaining a high etching selectivity to the underlying silicon substrate. In particular, the apparatus is capable of generating a plasma with a high density of $1 \times 10^{11}/cm^3$ or more in a high vacuum of several millitorrs and thereby performing anisotropic etching during the formation of a hole without forming a sidewall protecting film.

Figure 2A:
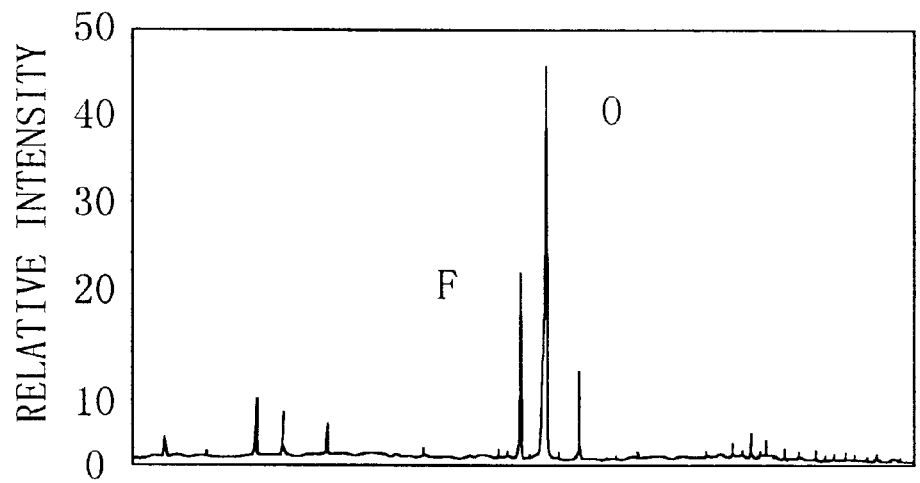
FIGS. 2(a) and 2(b) show optical emission spectra when processing was smoothly performed with no etch stop.
Figure 2B:
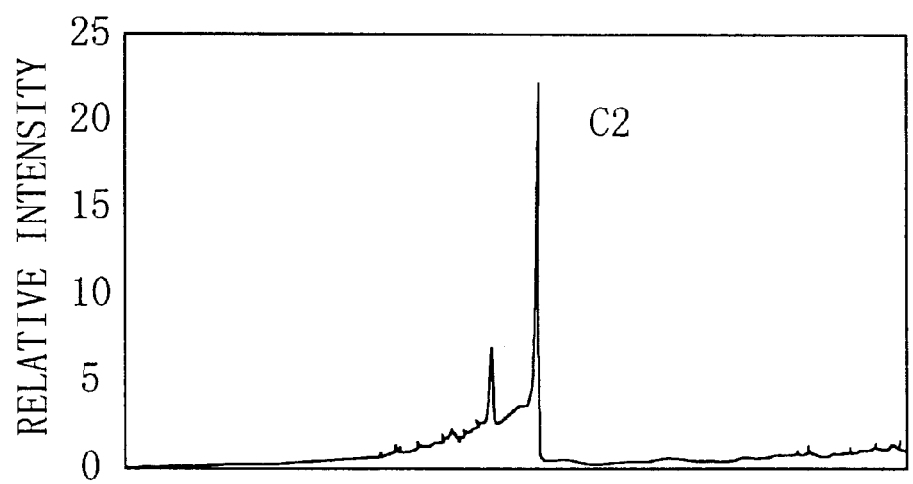
Figure 3A:
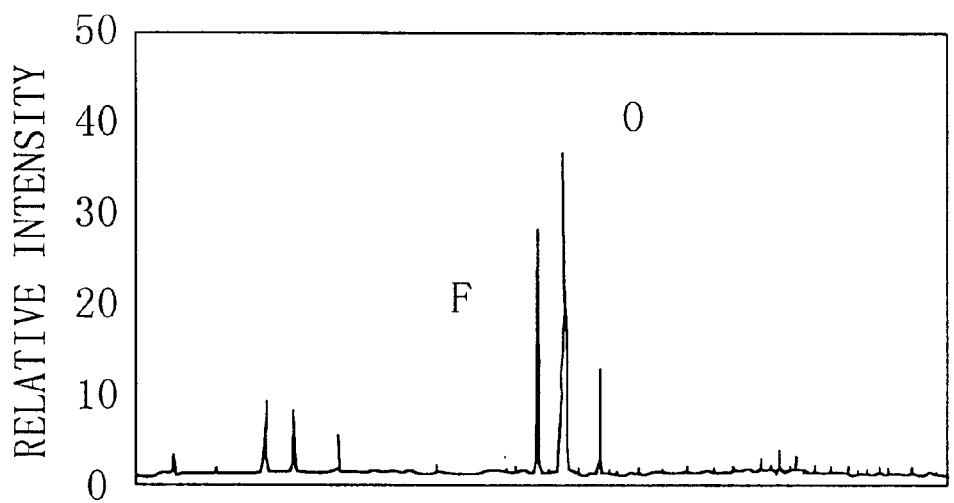
FIGS. 3(a) and 3(b) show optical emission spectra when the occurrence of an etch stop prevented the formation of a through hole.
Figure 3B:
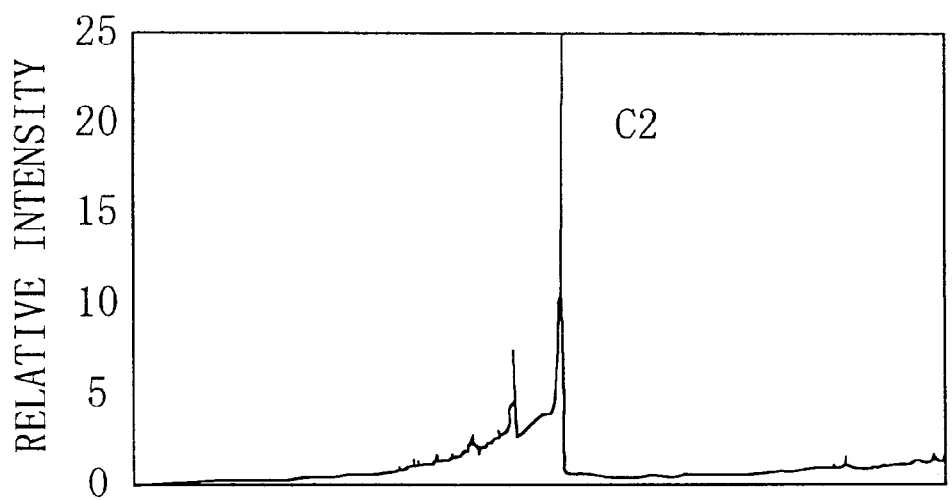

FIGS. 2(a) and 2(b) and FIGS. 3(a) and 3(b) show optical emission spectra obtained as a result of an optical emission spectral analysis performed with respect to the plasma in relation to the present invention. In each of the drawings, the vertical axis represents a light intensity and the horizontal axis represents a wavelength (wave number). Each of FIGS. 2(a) and 2(b) shows the optical emission spectrum obtained in the case where processing was performed smoothly with no etch stop. Specifically, FIG. 2(a) shows the optical emission spectrum in the vicinity of wavelengths at which the O and F light intensities reach their respective peak values of 774 nm and 777 nm. FIG. 2(b) shows the optical emission spectrum in the vicinity of a wavelength at which the $C_2$ light intensity reaches its peak value. Each of FIGS. 3(a) and 3(b) shows the optical emission spectrum in the case where the occurrence of an etch stop during processing prevented the formation of a through hole. Specifically, FIG. 3(a) shows the optical emission spectrum in the vicinity of wavelengths at which the O and F light intensities reach their peak values. FIG. 3(b) shows the optical emission spectrum in the vicinity of a wavelength at which $C_2$ reaches its peak value. Although the peak intensity of SiF is not shown in FIGS. 2 and 3, it was also observed. The peak intensities of the other substances were not observed.

It is assumed here that, in the following description, the light intensities are compared based on their peak values and the widths of the peak portions are ignored.

From the comparison between FIGS. 2(a) and 3(a), it will be understood that the O light intensity is low when an etch stop occurs. It will also be understood that an etch stop is less likely to occur as the O/F light intensity ratio is higher. From the comparison between FIGS. 2(b) and 3(b), it will be understood that the $C_2$ light intensity is high when an etch stop occurs. However, it is necessary to refer to the other data which will be described later before determining whether the tendencies shown in FIGS. 2(a) and 2(b) and FIGS. 3(a) and 3(b) are significant or not.

It is generally said that CO, $CO_2$, CF, and the like are generated as a result of etching a silicon oxide film through a reaction between O resulting from decomposed $SiO_2$ and C resulting from decomposed fluorocarbon gas as etching gas. To detect an end point for etching, variations in the amount of CO in the plasma is observed properly. In the case of etching performed by using the apparatus shown in FIG. 1, however, CO and $CO_2$ were hardly present in the plasma. The reason for this may be that fluorocarbon has efficiently been separated into C and F because of an extremely high dissociation efficiency achieved in the plasma formed by the apparatus.

Figure 4A:
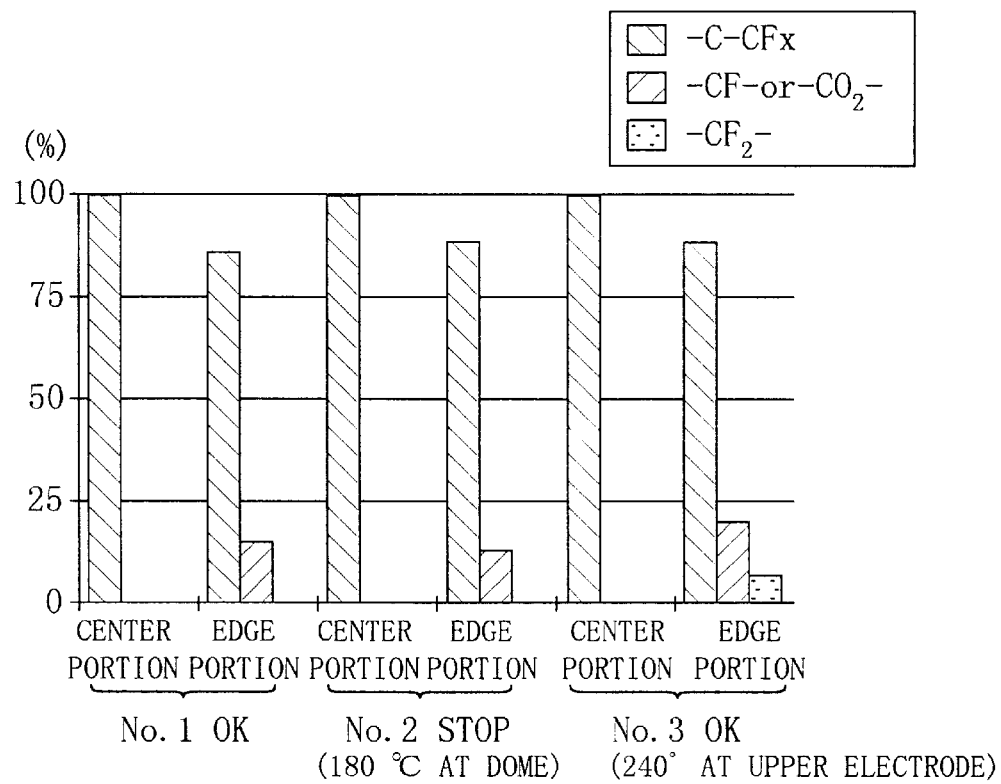
FIGS. 4(a) and 4(b) show the results of ESCA performed at the center and end portions of the substrate of each of samples 1 to 6 in order to examine the bonding state in a deposited film accumulated on the bottom of a hole.
Figure 4B:
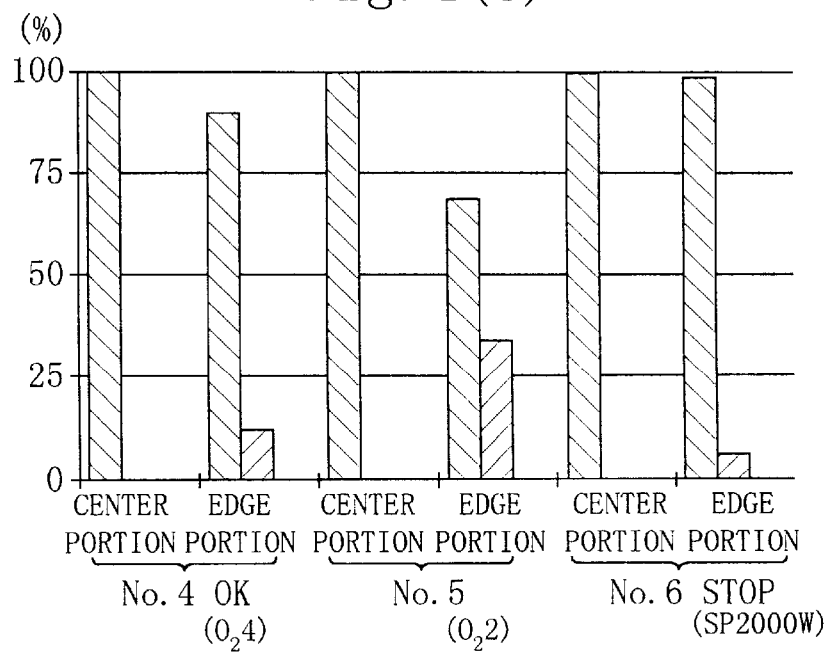

FIGS. 4(a) and 4(b) are histograms indicative of the results of ESCA performed at the center and edge portions of the substrate in order to examine the bonding state in a deposited film accumulated on the bottom of the hole during etching for forming the hole. In the drawings, rectangles in different hatched patterns show the respective abundance ratios of different atomic bonds. Specifically, FIG. 4(a) shows the results of ESCA performed with respect to samples Nos. 1–3, while FIG. 4(b) shows the results of ESCA performed with respect to samples Nos. 4–6. The sample No. 1 was etched under normal conditions (with the temperature of the upper electrode being 260° C., the temperature of the quartz dome being 220° C., the source power being 2700 W, and the $O_2$ flow rate being 0 sccm), resulting in no etch stop. The sample No. 2 was etched under the foregoing normal conditions except that the temperature of the quartz dome 2A was changed to 180° C., resulting in an etch stop. The sample No. 3 was etched with the source power adjusted to 2500 W and the temperature of the upper electrode 7 adjusted to 240° C., resulting in no etch stop. The sample No. 4 was etched with the source power being 2500 W and the $O_2$ flow rate being 4 scam, resulting in no etch stop. The sample No. 5 was etched with the source power being 2500 W and the $O_2$ flow rate being 2 scam, resulting in no etch stop The sample No. 6 was etched under the foregoing normal conditions except that the power source was changed to 2500 W, resulting in an etch stop.

The foregoing results of the experiments are summarized in the following Table 1.

TABLE 1

| No. | UPPER ELECTRODE | QUARTZ DOME | SOURCE POWER | $O_2$ FLOW RATE | ETCHING |
|-----|-----------------|-------------|--------------|-----------------|---------|
| 1 | 260° C. | 220° C. | 2700 W | 0 sccm | GOOD |
| 2 | 260° C. | 180° C. | 2700 W | 0 sccm | NO GOOD |

TABLE 1-continued

| No. | UPPER ELECTRODE | QUARTZ DOME | SOURCE POWER | O₂ FLOW RATE | ETCHING |
|-----|-----------------|-------------|--------------|--------------|---------|
|     |                 |             |              |              | (STOP)  |
| 3   | 240° C.         | 220° C.     | 2500 W       | 0 sccm       | GOOD    |
| 4   | 260° C.         | 220° C.     | 2500 W       | 4 sccm       | GOOD    |
| 5   | 260° C.         | 220° C.     | 2500 W       | 2 sccm       | GOOD    |
| 6   | 260° C.         | 220° C.     | 2500 W       | 0 sccm       | NO GOOD (STOP) |

Figure 5A:
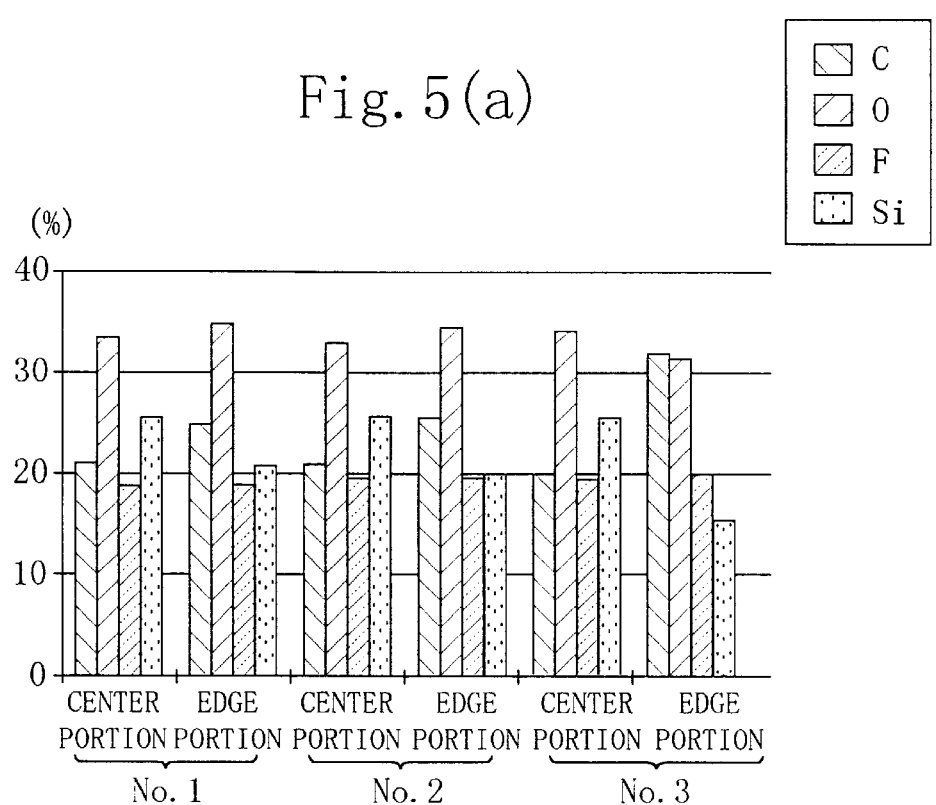
FIGS. 5(a) and 5(b) show the result of analyzing the component of the deposited film accumulated on the bottom of the hole for each of the samples 1 to 6.
Figure 5B:
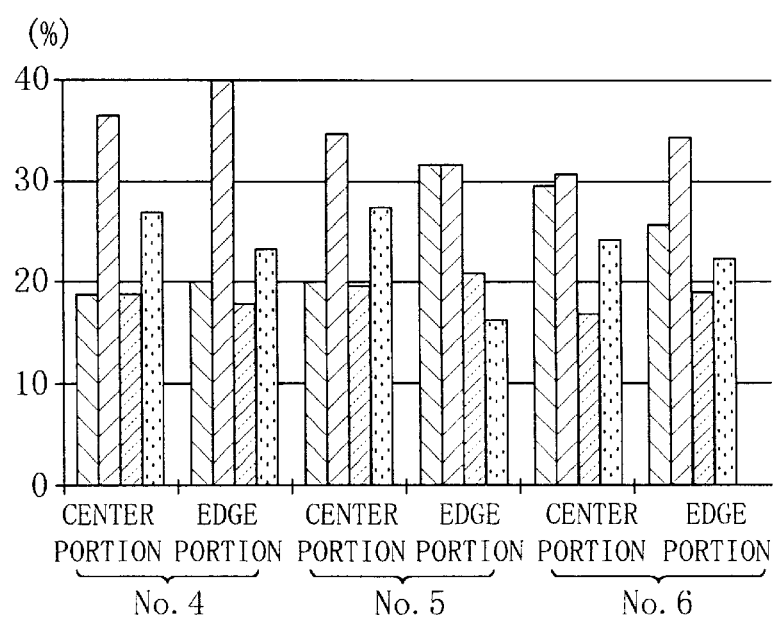

FIGS. 5(a) and 5(b) show the result of analyzing the components of a deposited film accumulated on the bottom of a hole for each of samples identical to the samples Nos. 1 to 6 shown in FIG. 4(a) and 4(b).

From the comparison between FIGS. 4(a) and 4(b) and FIG. 5(a) and 5(b), it will be understood that C-C bonds account for the majority of atomic bonds in the deposited film accumulated on the bottom of the hole, though the deposited film contains C, O,F, and Si in considerable amounts. As for F and Si, they are assumed to be present as free radicals.

Figure 6:
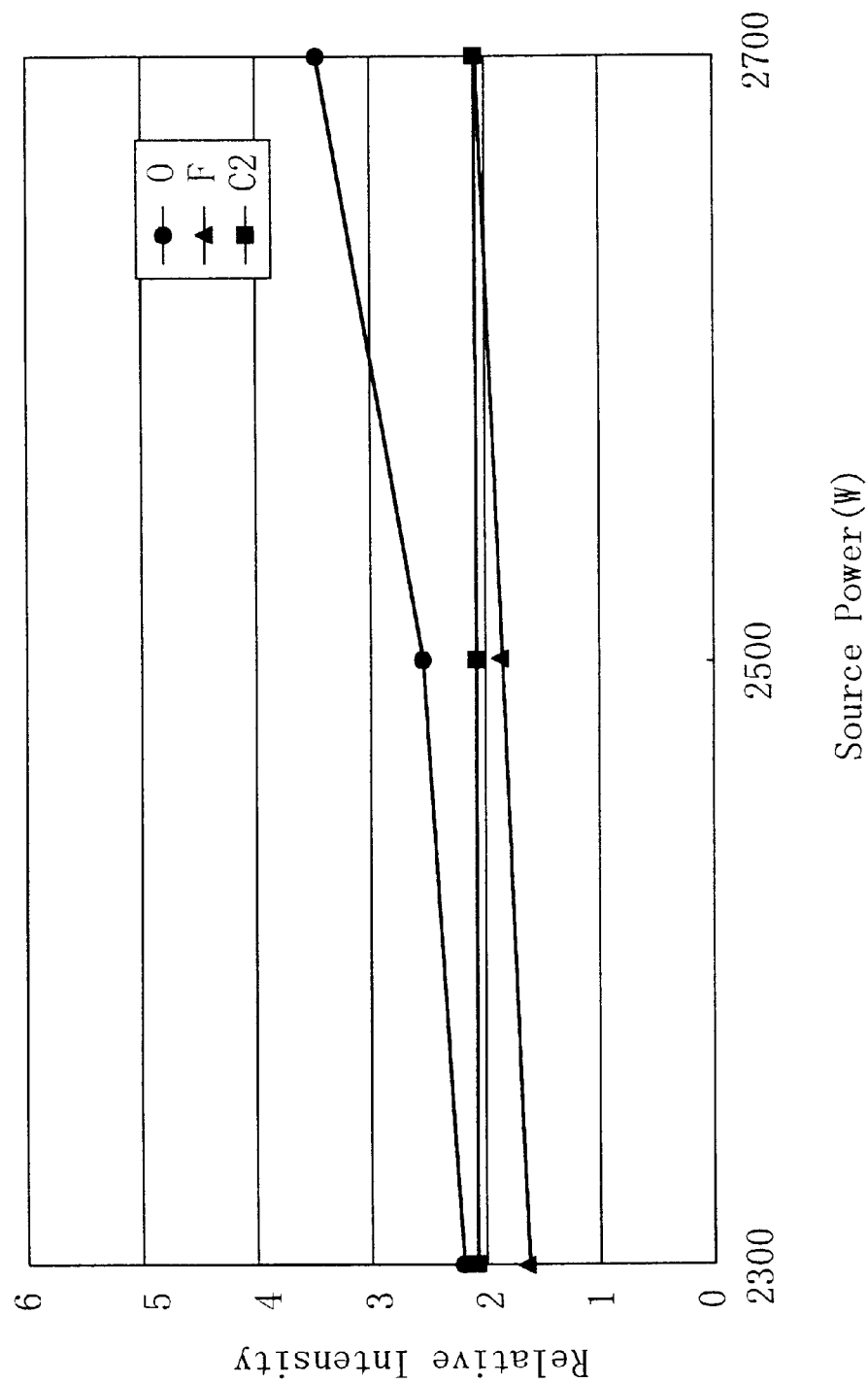
FIG. 6 shows data on the dependence of O, F, and $C_2$ light intensities on source power.
Figure 7:
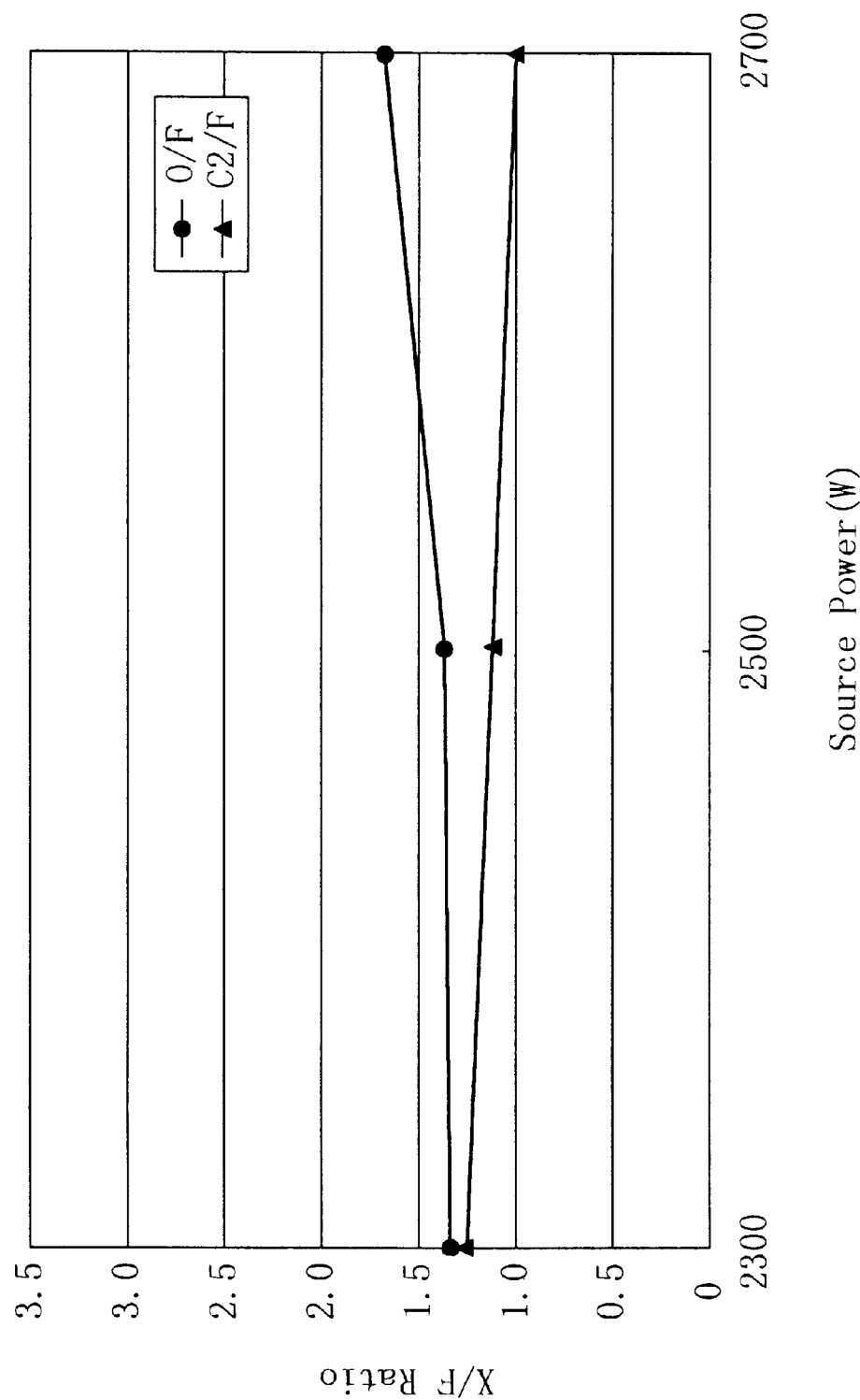
FIG. 7 shows the dependence of each of the O/F light intensity ratio and the $C_2$/F light intensity ratio on source power.

FIG. 6 shows the dependences of the O, F, and $C_2$ light intensities on source power. FIG. 7 shows the dependences of the O/F light intensity ratio and the $C_2$/F light intensity ratio on source power. As will be understood from FIG. 6, the O light intensity increases as the source power increases. This may be because oxygen is more likely to be released from the quartz dome 2A as the quartz dome 2A is more likely to be etched. On the other hand, the F light intensity increases slightly as the source power increases, which may naturally be attributed to an increase in the degree of dissociation of $C_2F_6$ in a plasma. Even when the source power varies, the $C_2$ light intensity shows substantially no variation. Accordingly, the O/F light intensity ratio increases as the source power increases as shown in FIG. 7, while the $C_2$/F light intensity ratio decreases as the source power increases. However, the decreasing tendency of the $C_2$/F light intensity ratio is not so remarkable as the increasing tendency of the O/F light intensity ratio.

Figure 8:
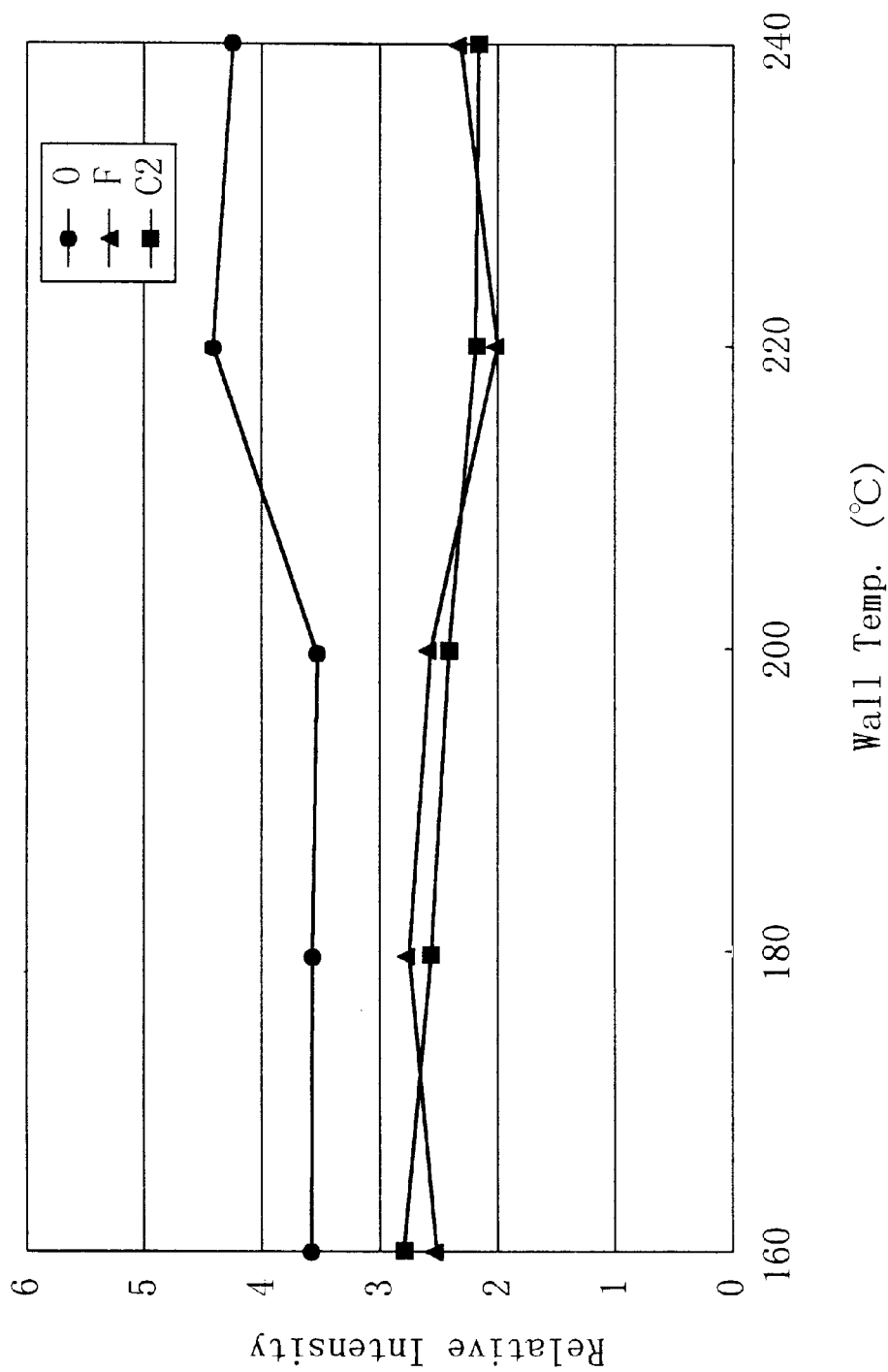
FIG. 8 shows the dependence of the O, F, and $C_2$ light intensities on a wall temperature.
Figure 9:
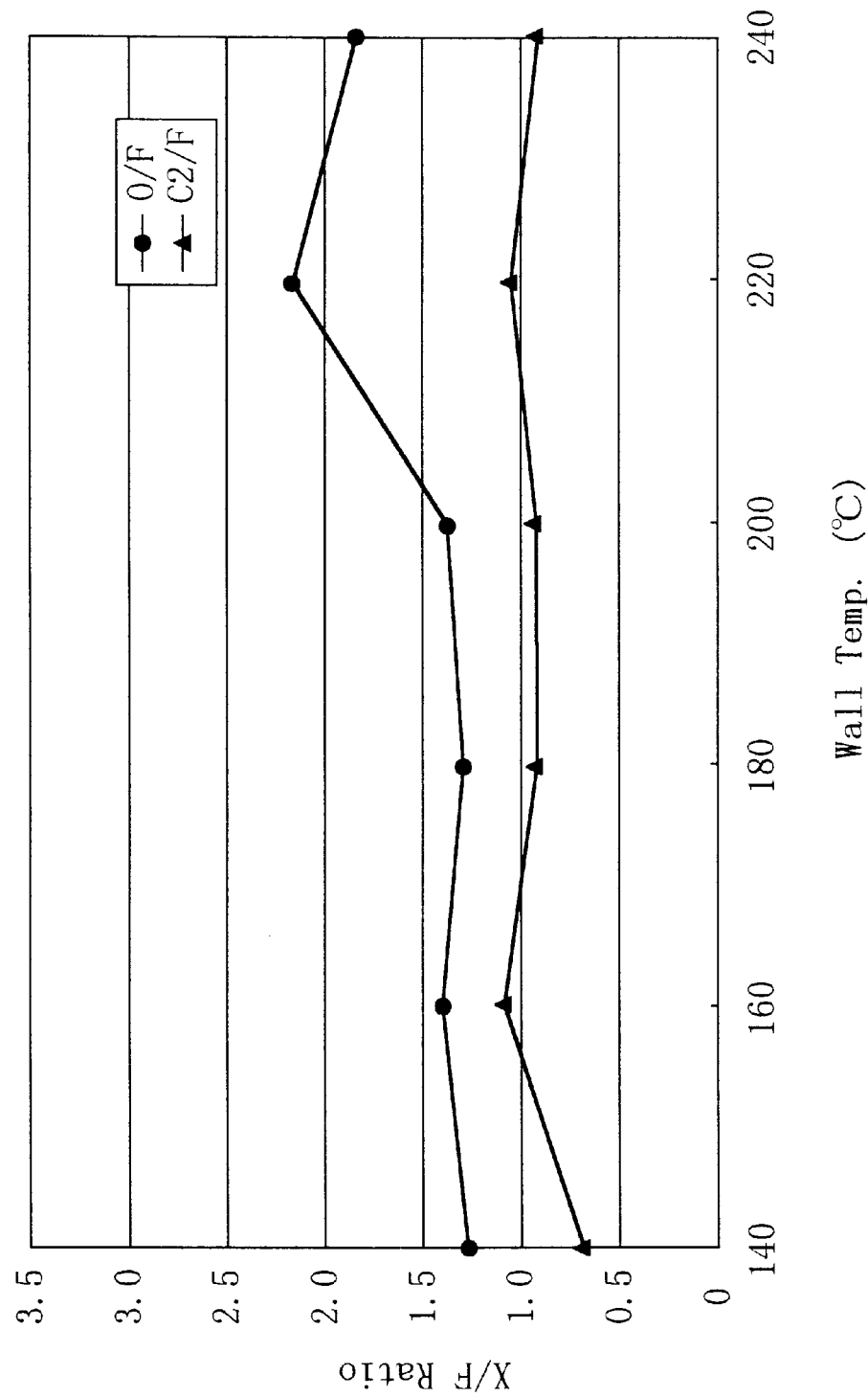
FIG. 9 shows the dependence of each of the O/F light intensity ratio and the $C_2$/F light intensity ratio on the wall temperature.

FIG. 8 shows the dependences of the O, F, and $C_2$ light intensities on the wall temperature of the quartz dome 2A (dome temperature). FIG. 9 shows the dependences of the O/F light intensity ratio and the $C_2$/F light intensity ratio on the dome temperature. As will be understood from FIG. 8, the O light intensity increases as the dome temperature increases. This may be because oxygen is more likely to be released from the quartz dome 2A as the deposit attached to the quartz dome 2A is heated and becomes more likely to be evaporated. On the other hand, the $C_2$ and F light intensities decrease slightly as the dome temperature increases. Accordingly, the O/F light intensity ratio increases as the source power increases, as shown in FIG. 9, while the $C_2$/F light intensity ratio does not vary significantly. Although an etch stop occurred when the dome temperature was 200° C. or lower in the experiment performed under the foregoing conditions, no etch stop was observed when the dome temperature exceeded 200° C.

Figure 10:
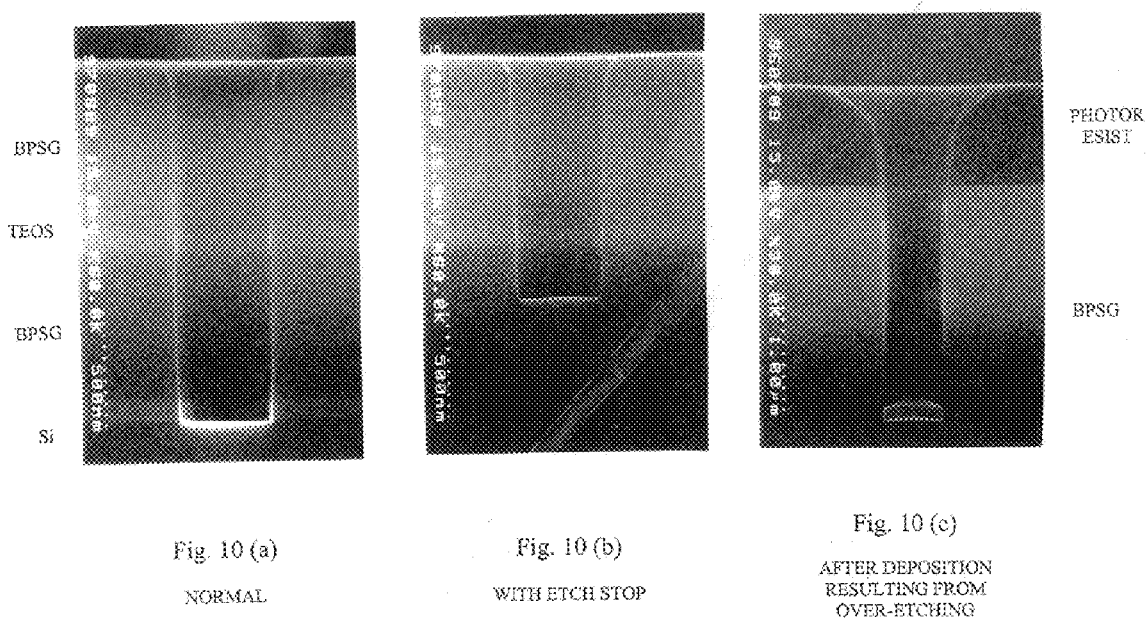
FIGS. 10(a) to 10(c) are photocopies of SEM photographs showing the respective states in which a normal through hole was formed by dry etching, in which an etch stop occurred, and in which over-etching was performed after the formation of the through hole.

FIGS. 10(a) to 10(c) are photocopies of SEM photographs taken when dry etching was performed to form a contact hole in an interlayer insulating film overlying a silicon substrate, which show the respective states in which a normal through hole was formed, in which the occurrence of an etch stop prevented the formation of a through hole, and in which over-etching was performed after the formation of the through hole. It is to be noted that a photoresist mask remained in FIGS. 10(a) and 10(b), while the photoresist mask was formed in FIG. 10(c).

A consideration will be given below to the cause of an etch stop during processing based on the data shown in FIGS. 2 to 10.

The etch stop in question is different from a so-called microloading effect (RIE lag) resulting from the continual lowering of an etch rate. When the etch stop occurred, the diameter at the bottom of the hole shown in FIG. 10(b) is substantially the same as the diameter of the normal through hole shown in FIG. 10(a), which is under formation and has not been completed yet.

It is said that the formation of a hole in a silicon oxide film when fluorocarbon gas is used as etching gas proceeds under the following effect.

While the hole is formed in the silicon oxide film, a CF-based deposit abundant in C is accumulated on the bottom of the hole, as described above. When a damaged layer is formed in the silicon oxide film underlying the deposit due to ions directed thereto, $SiO_2$ is decomposed to generate Si and O. The deposit is removed by the reaction of Si and O with C and F contained in the deposit, while the etching of the silicon oxide film proceeds. Since the effect of removing the deposit and the silicon oxide film exceeds the effect of accumulating the deposit on the bottom of the hole, etching proceeds downward.

However, the following problems occur when the aspect ratio of the hole becomes 4 or more and the diameter of the hole becomes approximately 1 μm as a result of the increasing packing-density of the semiconductor device. With such a deep hole, the ions are incident upon the bottom of the hole at a reduced angle of incidence so that the incident ions are reduced in quantity and therefore the etching effect is reduced, resulting in an etch stop (condition (a)).

Under the foregoing conditions, the major component of the deposit accumulated on the bottom of the hole is assumed to be a —C-C—polymer rather than a CF compound. When such a carbon-based compound is deposited as the —C-C—polymer on the bottom of the hole, the damaged layer is assumedly less likely to be formed in the underlying silicon oxide film which is not decomposed by the ions impinging thereon and therefore an etch stop occurs (condition (c)). Once such a hard —C-C—polymer is formed, it is necessary to decompose the principal chain of the —C-C—polymer with O.

In most cases, however, $O_2$ gas is not added to fluorocarbon gas during etching performed to form the hole in the silicon oxide film overlying the silicon substrate. This is because a carbon-based residue which is likely to be deposited on the bottom of the hole is readily decomposed by O generated from decomposed $SiO_2$, as described above, without involving the addition of $O_2$ On the contrary, the over-etching of the underlying silicon substrate can be prevented more positively without involving the addition of $O_2$ gas (i.e., a higher selectivity is achieved). In actually forming the contact hole in the interlayer insulating film (silicon oxide film) by using the apparatus shown in FIG. 1, O is present in the plasma as shown in FIGS. 2 and 3, though $O_2$ gas has not been added.

It has been understood from FIGS. 2 and 3 that the O concentration in the plasma is higher in the case where no etch stop occurs during processing than in the case where an etch stop occurs. In the case where no etch stop occurs, there should be a supply source for supplying an excessive amount of O. An experiment was also performed to prove that no etch stop occurred when the temperature of the quartz dome was high, as shown in FIG. 6. In other words, it has been proved that the presence or absence of an etch stop which has occurred sporadically in the conventional embodiment is dependent on the temperature of the quartz dome. This may be because $SiO_2$ composing the quartz dome partially reacts with the application of RF power to generate SiF and $O_2$. Although the deposit generated during plasma processing is accumulated on the quartz dome, the deposit is more likely to evaporate as the temperature of the quartz dome is higher. Consequently, the thickness of the deposit film on the surface is reduced and it is assumed that $O_2$ is more likely to supply from the quartz dome into the reactor. The validity of the assumption has been endorsed by the temperature of the quartz dome for the sample No. 2 shown in FIG. 15 and the data shown in FIG. 8.

As will be understood from the source power for the sample No. 6 shown in FIG. 4 and the data shown in FIG. 6, the etch stop is less likely to occur as the source power is higher. This may be because the quartz dome is more likely to be etched as the source power increases and the amount of $O_2$ generated from the quartz dome increases accordingly.

From the foregoing, it has been concluded that the etch stop can be prevented by maintaining the amount of $O_2$ in the reactor to a proper value by any means. If the amount of $O_2$ is excessively large, however, the silicon substrate is etched disadvantageously after the formation of the through hole as described above, resulting in a reduced selectivity.

It can also be considered that the presence of an element other than O had seriously influenced the etching effect. Most of all, the abundance ratio of F to O in the plasma is important because the etching effect is reduced when F is small in amount, while the etching effect is increased when F is excessively large in amount so that the etching selectivity to the silicon oxide film is reduced.

On the other hand, the etch stop is more likely to occur when the abundance ratio of C to O in the plasma is excessively high, while the etching selectivity of the silicon oxide film to the silicon substrate is reduced when the abundance ratio of C to O in the plasma is excessively low.

To prevent the etching of the underlying silicon substrate and the etch stop during the formation of the hole in the silicon oxide film, not only the amount of $O_2$ but also the abundance ratio between O, F, and C is important.

Figure 31:
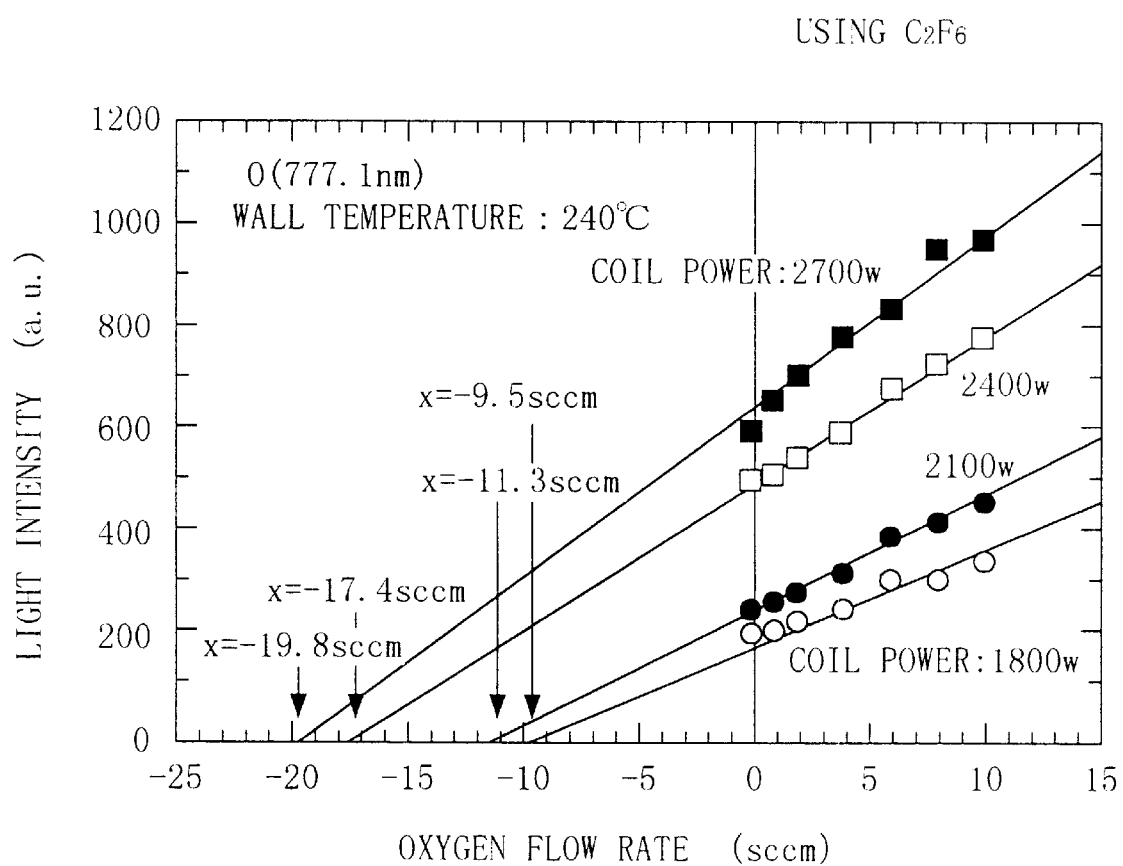
FIG. 31 shows the O light intensity by using coil power as a parameter when oxygen gas is supplied while using a quartz dome and holding the wall temperature thereof constant.

FIG. 31 shows data representing the O light intensity by using coil power as a parameter when oxygen gas was supplied to a quartz dome having its temperature held constant (240° C.). As the etching gas, $C_2F_6$ was used. In the drawings, the horizontal axis represents the flow rate of oxygen and the vertical axis represents the O light intensity. The amount of oxygen released from the quartz dome corresponding to the flow rate of oxygen is indicated by a value (negative value) of the oxygen flow rate at a point of intersection of the line on which the light intensity is zero (horizontal line) and a line connecting points at which equal coil power was measured. For example, the value (x=−19.8) at the point of intersection of the horizontal axis and the line connecting points at which power of 2700 W was measured is assumed to indicate the release of oxygen corresponding to an oxygen flow rate of 19.8 sccm.

As shown in FIG. 31, the O light intensity increases as the flow rate of oxygen gas increases. This is because the deposit attached to the inner surface of the quartz dome is heated and becomes more likely to evaporate so that oxygen is more likely to be released from the quartz dome, as described above. The data indicates that the flow rate of oxygen gas may be controlled appropriately to provide the O light intensity which is higher than a specified value (e.g., 300 in arbitrary units shown in FIG. 2) free from the etch stop.

As shown in FIG. 31, the O light intensity also increases as coil power increases. This is because the deposit attached to the inner surface of the quartz dome is decomposed and becomes more like to evaporate so that oxygen is more likely to be released from the quartz dome, as described above. The data also indicates that coil power may be controlled to provide the O light intensity which is higher than a specified value free from the etch stop by holding the oxygen flow rate constant or supplying no oxygen gas at all.

It is also expected that the etch stop can be prevented more effectively by properly adjusting the coil power and the oxygen flow rate.

Figure 32:
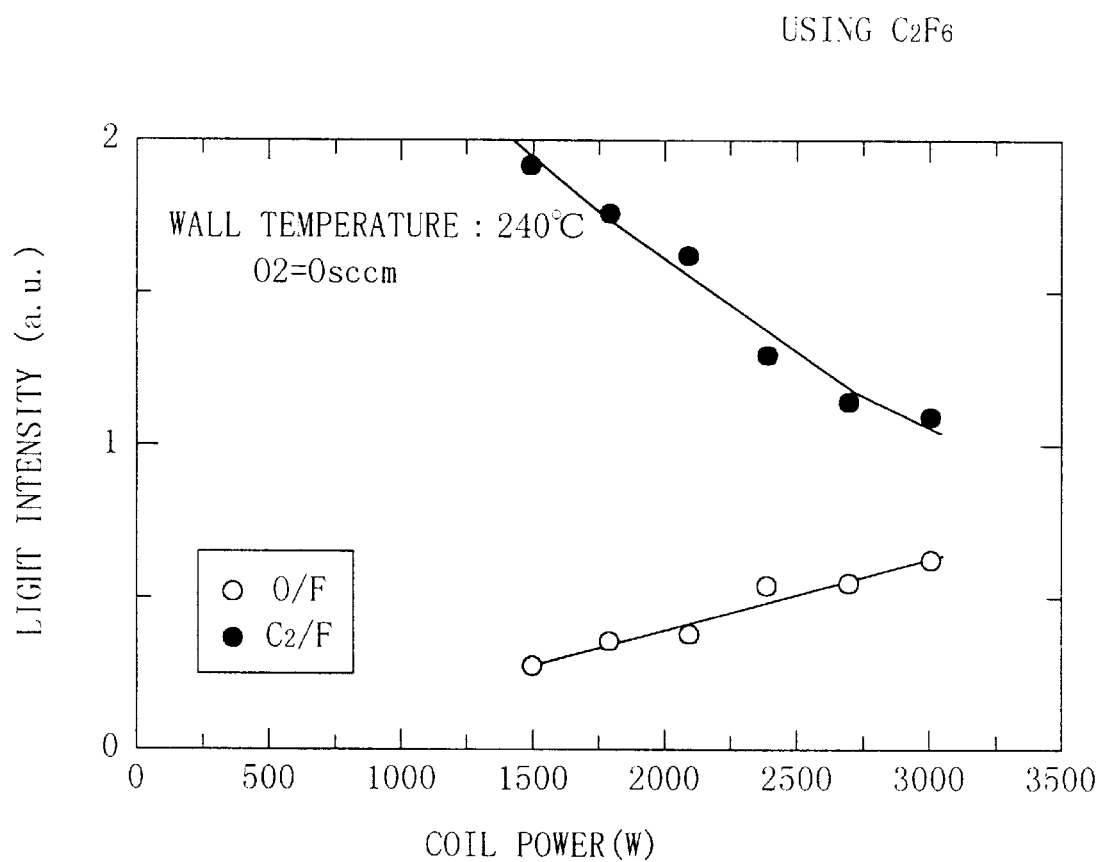
FIG. 32 shows variations in the O/F light intensity ratio and in the $C_2$/F light intensity ratio responsive to variations in coil power.

FIG. 32 shows data representing variations in the O/F light intensity ratio and in the $C_2$/F light intensity ratio responsive to variations in coil power. According to the data, the temperature of the quartz dome 2A was held constant at 240° C. and no oxygen gas was supplied. As the etching gas, $C_2F_6$ was used. As shown in FIG. 32, the O/F light intensity ratio increases as the coil power increases, while the $C_2$/F light intensity ratio decreases as the coil power increases. This indicates that, in either case, the etch stop is less likely to occur as the coil power is higher.

The following are the embodiments of the present invention which has been achieved based on the considerations endorsed by the foregoing experimental data.

Embodiment 1

A first embodiment will describe a first method of adjusting the concentration of oxygen in the reactor by using the apparatus for manufacturing a semiconductor device shown in FIG. 1.

In processing the substrate 9, the plasma 17 is generated in the reactor by introducing fluorocarbon gas such as $C_2F_6$ gas or $C_4F_6$ gas into the reactor through the gas inlet 8 and applying RF power from the first RF power source 5 to the antenna coil 3, while suppressing the reflected power of the RF power by means of the first matching element 4. Then, a bias voltage for biasing the plasma 17 in the direction of the substrate 9 is applied to a portion overlying the substrate 9 by applying RF power from the second RF power source 13 to the lower electrode 10 via the blocking capacitor 11, while suppressing the reflected power of the RF power by means of the second matching element 12. The substrate 9 is etched by ions accelerated by the bias voltage.

The manufacturing method according to the present embodiment is characterized in that the temperature in the quartz dome 2A is adjusted to about 180° C., while the intensity of light emitted from O of light from the plasma 17 is monitored by the emission spectroscope 19.

Figure 11:
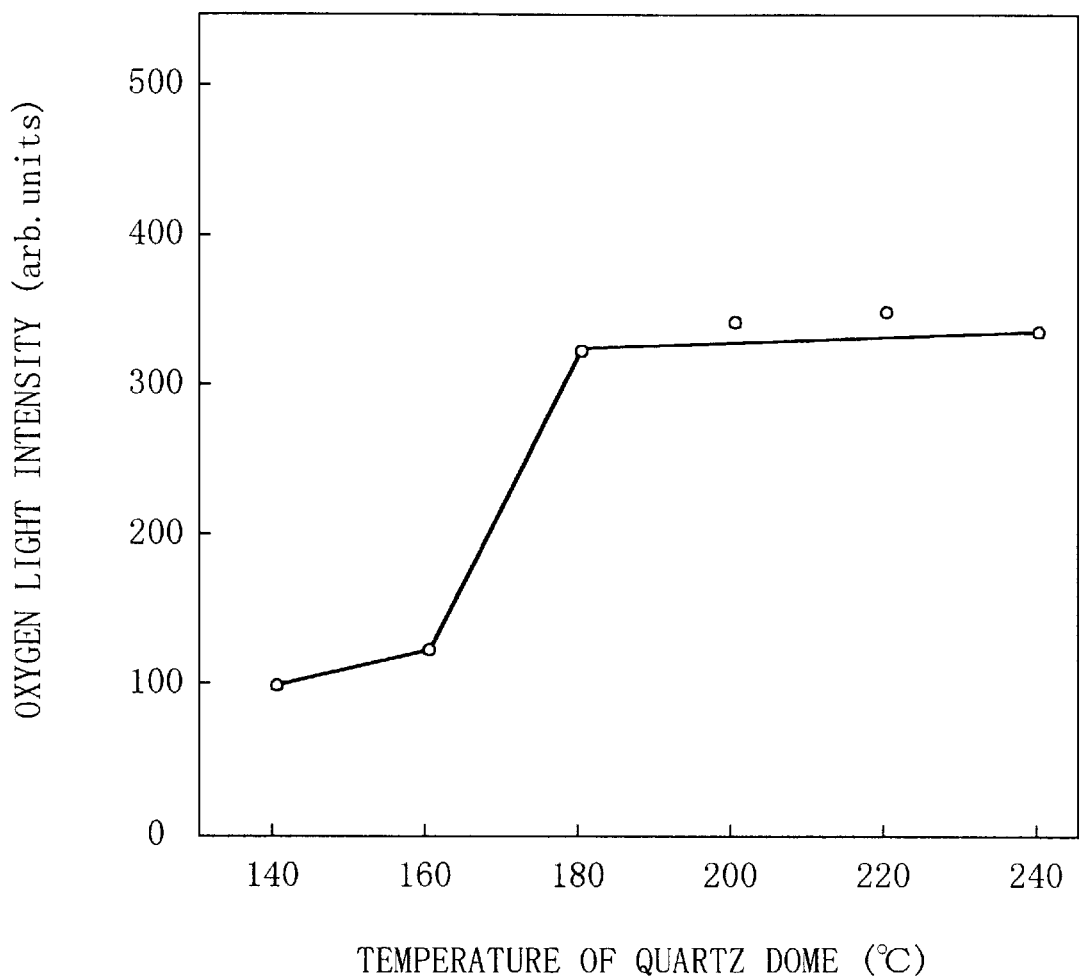
FIG. 11 shows the dependence of the O light intensity obtained by performing an optical emission spectral analysis with respect to oxygen on the temperature of a quartz dome.

FIG. 11 shows the result of an optical emission spectral analysis performed with respect to the plasma in relation to the present embodiment. In FIG. 11, the vertical axis represents the intensity (in arbitrary units) of light from oxygen with a wavelength of, e.g., 777 nm and the horizontal axis represents the temperature of the quartz dome. As etching gas, $C_2F_6$ is used with supply of no oxygen gas. As shown in the drawing, the O light intensity increases slowly as the temperature of the quartz dome increases in the range of 160° C. or lower, while the O light intensity increases gradually when the temperature of the quartz dome is over 160° C. At a temperature of 180° C. or higher, the O light intensity barely varies even when the temperature of the quartz dome increases.

As described above, it is assumed that oxygen increasing the light intensity is primarily contained in quartz (silicon oxide) composing the quartz dome 2A and generated and released into the plasma 17 when the quartz dome 2A is etched with an electric field produced by the antenna coil 3 wound around the outer circumferential portion of the quartz dome 2A. In this case, when the temperature of the quartz dome is 160° C. or lower, oxygen is not released into the plasma because a reaction product is deposited on the inner wall face of the quartz dome 2A so that the light intensity remains low. However, the reaction product is less likely to be deposited on the inner wall face of the quartz dome 2A when the temperature of the quartz dome is over 160° C., so that oxygen is released into the plasma 17 and increases the light intensity.

Figure 12A:
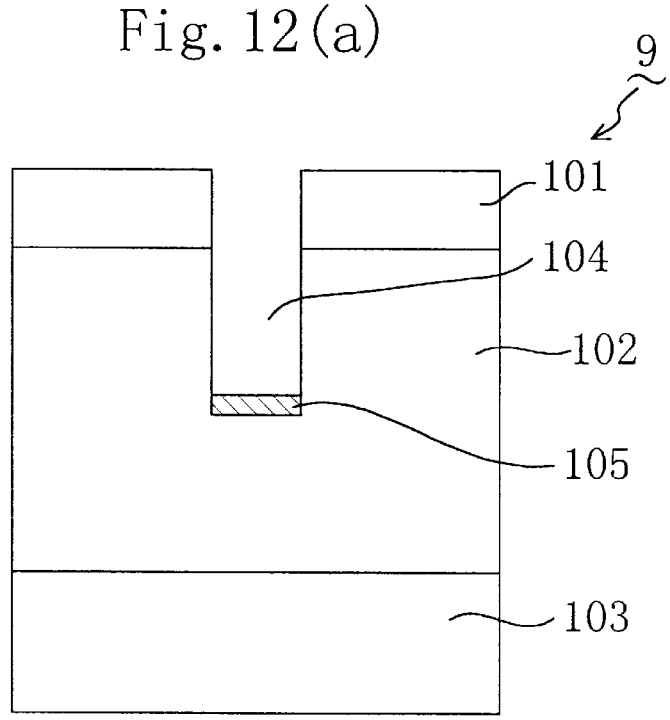
FIGS. 12(a) and 12(b) are cross-sectional views showing the respective states in which an etch stop occurred during etching for forming a contact hole and in which a through hole was formed according to the first embodiment.
Figure 12B:
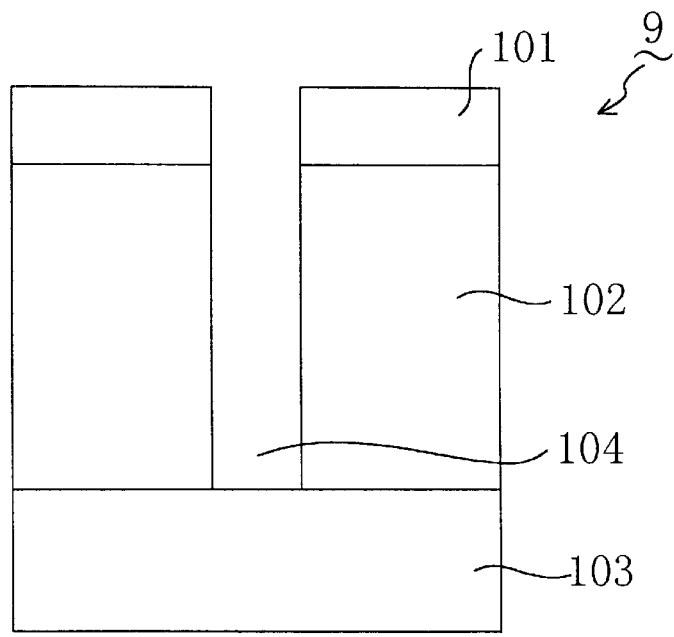

The presence or absence of oxygen released from the inner wall face of the quartz dome 2A depending on the temperature range of the quartz dome as described above has produced a difference in etching as shown in FIGS. 12(*a*) and 12(*b*).

FIG. 12(*a*) is a cross-sectional view of the substrate 9 when etching is performed by adjusting the temperature of the quartz dome to 140 ° C. In FIG. 12(*a*) are shown: a resist film 101; an oxide film 102; a silicon substrate 103; a contact hole 104; and a deposit 105. Under the conditions shown in FIG. 12(*a*), etching proceeds till the contact hole 104 reaches the vicinity of the midpoint of the oxide film 102. As the contact hole 104 becomes deeper, however, a polymer film containing carbon resulting from the etching gas polymerized in the plasma and the deposit containing carbon contained in the resist film 101 are gradually deposited on the bottom of the contact hole 104 under formation. Since the deposit shields the ions for etching, etching stops during processing so that the contact hole 104 is not formed completely.

FIG. 12(*b*) shows the configuration of the contact hole 104 formed with the temperature of the quartz dome adjusted to 180° C. according to the present embodiment. Under such a condition, oxygen is released from the inner wall face of the quartz dome 2A as described above, so that a reaction between carbon and oxygen prevents the reaction product from being deposited on the bottom of the contact hole 104. Consequently, the deposit which may induce an etch stop during processing is not accumulated on the bottom of the contact hole 104 even when the contact hole 104 becomes deep. As a result, the contact hole 104 extending through the oxygen film 102 and reaching the silicon substrate 103 can be formed, as shown in FIG. 12(*b*).

Thus, the present embodiment suppresses the deposition of the reaction product on the inner wall face of the quartz dome 2A by adjusting the temperature of the quartz dome to 180° C. or higher. During etching, the effect of suppressing the deposition of the reaction product allows oxygen to be supplied stably from the inner wall face of the quartz dome 2A, which ensures the formation of the contact hole with a high aspect ratio without causing an etch stop during processing.

Although the present embodiment has measured the temperature of the quartz dome based on the O light intensity in the plasma 17, the temperature may be measured otherwise. For example, there are methods wherein the relationship between a power supply to the heater and the temperature of the quartz dome is empirically predetermined so that the power supply is controlled and wherein a thermometer is attached directly to the quartz dome. Any method permits processing such as etching to be performed smoothly.

Figure 33:
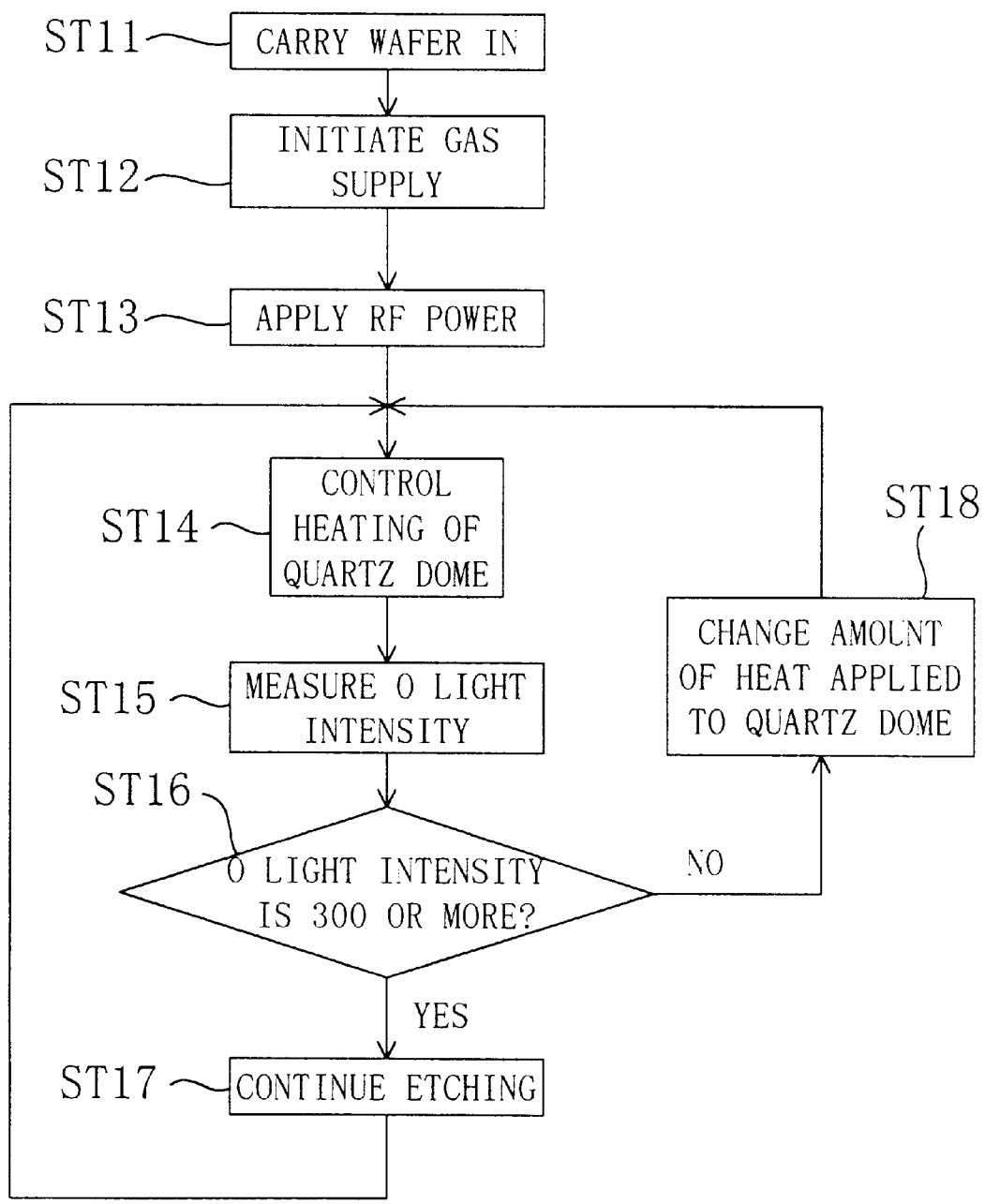
FIG. 33 is a flow chart illustrating the procedure for controlling the temperature of a quartz dome such that the O light intensity is within a proper range in the first embodiment.

In addition, the present embodiment measures the O light intensity in the plasma to control the concentration of oxygen in the plasma more directly by utilizing the characteristic shown in FIG. 11 such that oxygen is surely released from the quartz dome. FIG. 33 is a flow chart illustrating the procedure for preventing the etch stop by controlling the temperature of the quartz dome such that the O light intensity is within a proper range.

In a step ST11, a wafer is carried in the reactor. In a step ST12, the supply of gas into the reactor is initiated. In a step ST13, RF power is applied to the antenna coil 3 and to the lower electrode 10 to initiate the etching of an oxide film on the wafer. Then, in a step ST14, the quartz dome 2A is heated by the dome heater 24. In a step ST15, the O light intensity is measured. Next, in a step ST16, it is judged whether or not the O light intensity is the given value of 300 (the value in arbitrary units shown in FIG. 2) or higher. If the O light intensity is 300 or higher, the whole process goes on to a step ST17 to continue etching. On the other hand, if the O light intensity is under 300, the whole process goes on to a step ST18 to change the amount of heat applied to the quartz dome 2A and return to the step ST14.

As a result of the foregoing procedure, the concentration of oxygen in the reactor can be adjusted to a range free from the etch stop.

Embodiment 2

A second embodiment will describe a second method of adjusting an oxygen atmosphere in the reactor by using the apparatus for manufacturing a semiconductor device shown in FIG. 1.

In the present embodiment, however, processing is performed by heating the quartz dome 2A and the upper electrode 7 by means of heaters 6 and 24 to adjust the temperature of the quartz dome 2A to 140° C. Moreover, a gas mixture of fluorocarbon gas such as $C_2F_6$ gas or $C_4F_8$ gas and oxygen gas at a flow rate corresponding to 5% or less of the flow rate of the fluorocarbon gas is introduced into the reactor through the gas inlet 8. To etch the substrate 9, the second embodiment generates the plasma 17 with a supply of power from the RF first power source 5 and applies a bias voltage to the substrate 9 with a supply of RF power from the second RF power source 13, similarly to the first embodiment.

Figure 13:
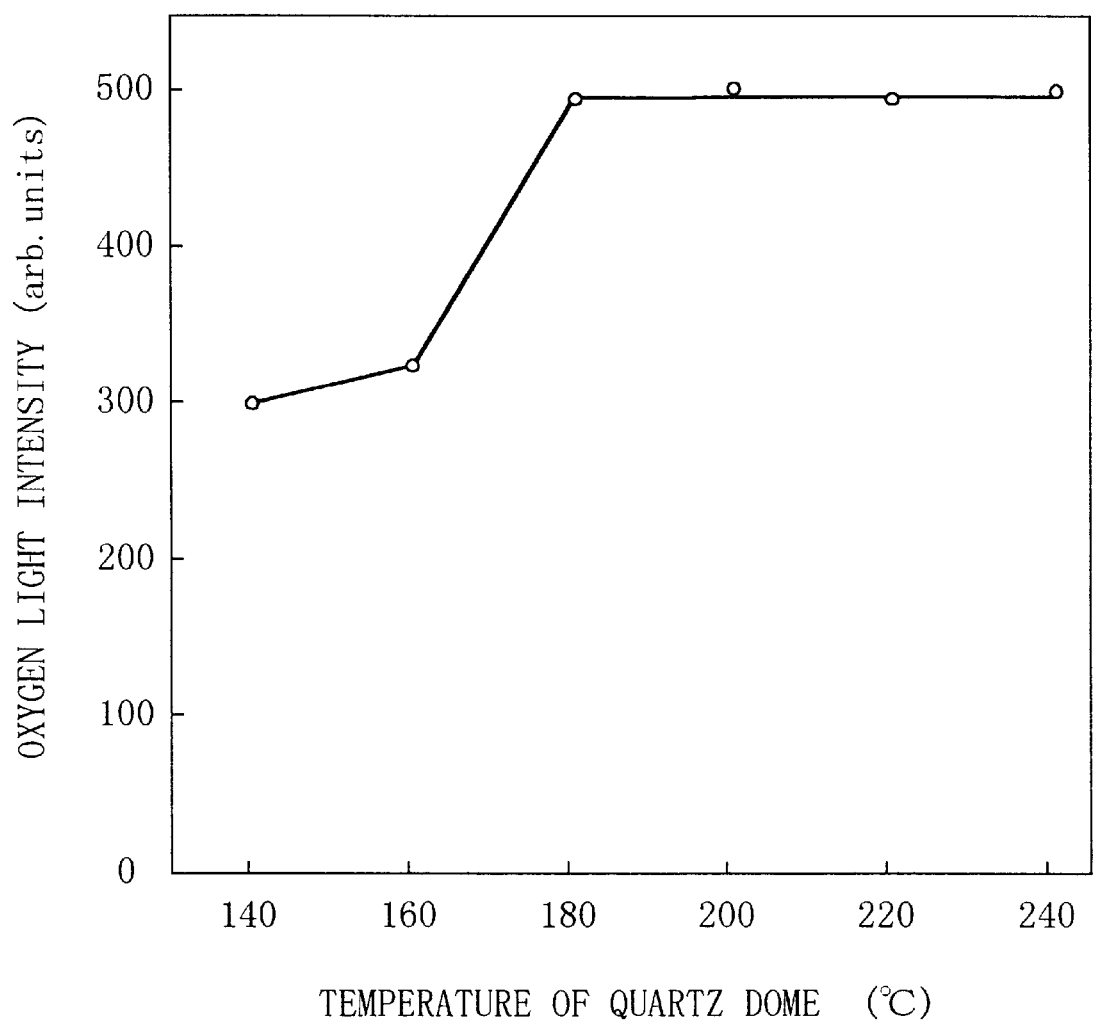
FIG. 13 is a graph showing the dependence of the O light intensity obtained by performing an optical emission spectral analysis with respect to oxygen on the temperature of a quartz dome according to a second embodiment.

FIG. 13 shows the result of an emission spectral analysis performed with respect to the plasma in relation to the present embodiment. In FIG. 13, the vertical axis represents the intensity (in arbitrary units) of light from oxygen with a wavelength of, e.g., 777 nm and the horizontal axis represents the temperature of the quartz dome. As shown in the drawing, the O light intensity is increased accordingly due to the oxygen gas introduced into the reactor, which is different from the first embodiment. As a result, the O light intensity is on the order of 300 even when the temperature of the quartz dome is 140° C., which is the same value of the O light intensity when the temperature of the quartz dome is 180° C. in the case where no oxygen gas is introduced as in the first embodiment shown in FIG. 11. From the result, it can be deduced that similar effects are achievable by adding the oxygen gas without heating the quartz dome to a high temperature and forcing the quartz dome to release a large amount of oxygen.

The present embodiment performed etching to form the contact hole 104 in the substrate 9, similarly to the first embodiment, while introducing the oxygen gas and adjusting the temperature of the quartz dome to 140° C. During etching, the deposit which might induce an etch stop during processing was not formed on the bottom of the contact hole 104 so that the contact hole 104 extending through the oxide film 102 and reaching the silicon substrate 103 was formed.

Although the gas mixture of the fluorocarbon gas such as $C_2F_6$ gas or $C_4F_8$ gas and the oxygen gas at a flow rate corresponding to 5% of the flow rate of the fluorocarbon gas was introduced into the reactor in the present embodiment, a gas mixture of the fluorocarbon gas such as $C_2F_6$ gas or $C_4F_8$ gas and dilute gas (inert gas) of Ar, He, Xe, or Kr may be mixed with the oxygen gas at a flow rate corresponding to 5% of the flow rate of the gas mixture to be used in the present embodiment. Although the oxygen gas was used as an additive in the present embodiment, there may also be used gas composed of molecules partially containing oxygen, such as CO gas or $CO_2$ gas.

Embodiment 3

A third embodiment will describe a method of adjusting the concentration of oxygen in the reactor by controlling the flow rate of oxygen gas.

Figure 14:
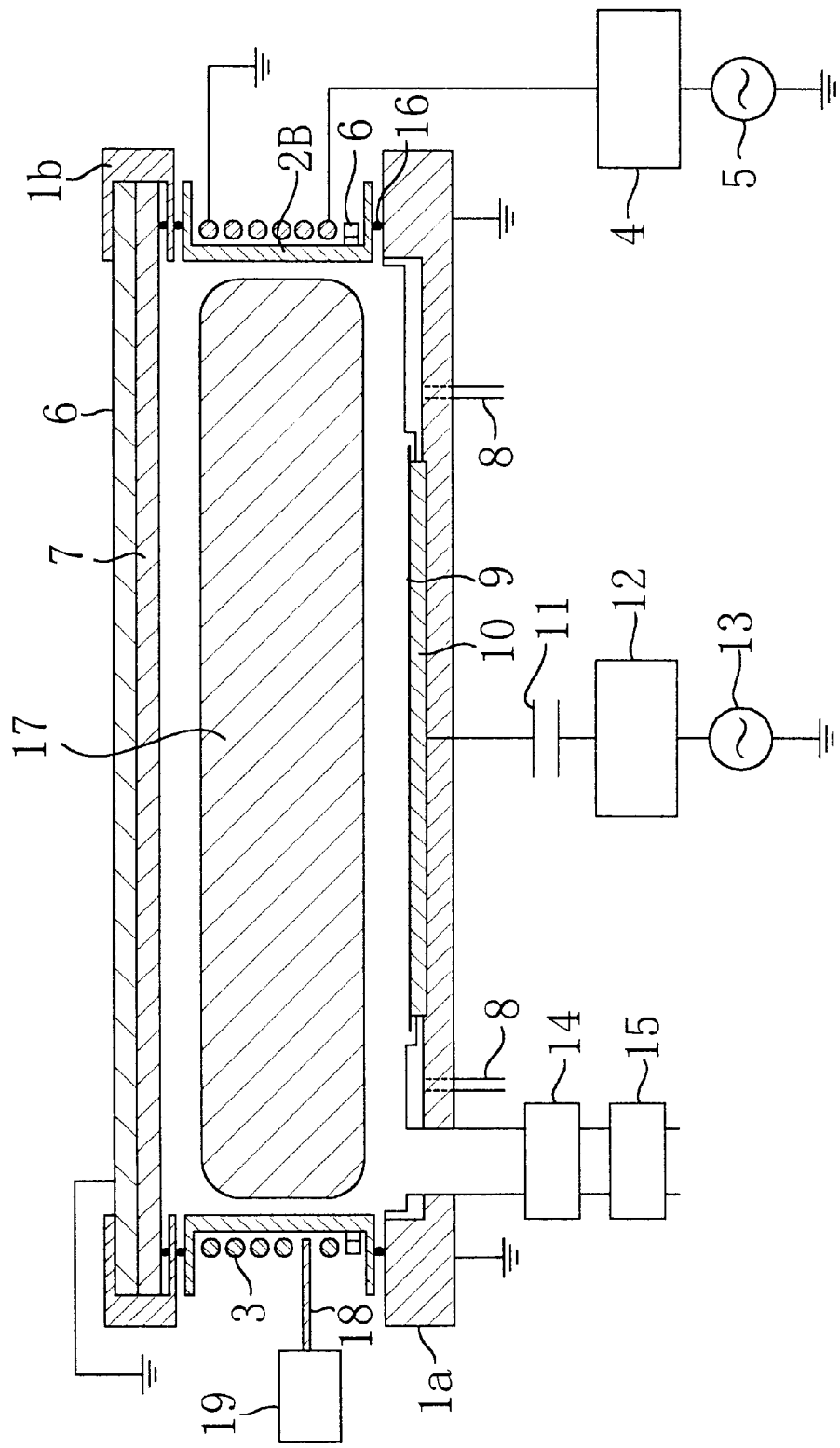
FIG. 14 is a block diagram partially showing in cross section a structure of an apparatus for manufacturing a semiconductor device according to a third embodiment.

FIG. 14 shows a structure of an apparatus for manufacturing a semiconductor device according to the third embodiment of the present invention. As shown in the drawing, the apparatus for manufacturing a semiconductor device according to the present embodiment has the same structure as the apparatus for manufacturing a semiconductor device according to the first embodiment shown in FIG. 1, except that it uses a silicon nitride dome 2B in place of the quartz dome 2A. It is to be noted that the O ring 16 shown in FIG. 14 is also provided at substantially the same position in the apparatus shown in FIG. 1.

In the present embodiment, the silicon nitride dome 2B and the upper electrode 7 are heated by the heater 6 which is controlled to maintain the temperature of the silicon nitride dome 2B at 180° C. or higher. The gas mixture of the fluorocarbon gas such as $C_2F_6$ gas or $C_4F_8$ gas and the oxygen gas at a flow rate corresponding to 5% of the flow rate of the fluorocarbon gas is introduced into the reactor through the gas inlet 8. To etch the substrate 9, the third embodiment generates the plasma 17 with a supply of power from the RF first power source 5 and applies a bias voltage to the substrate 9 with a supply of RF power from the second RF power source 13, similarly to the first embodiment.

Figure 15:
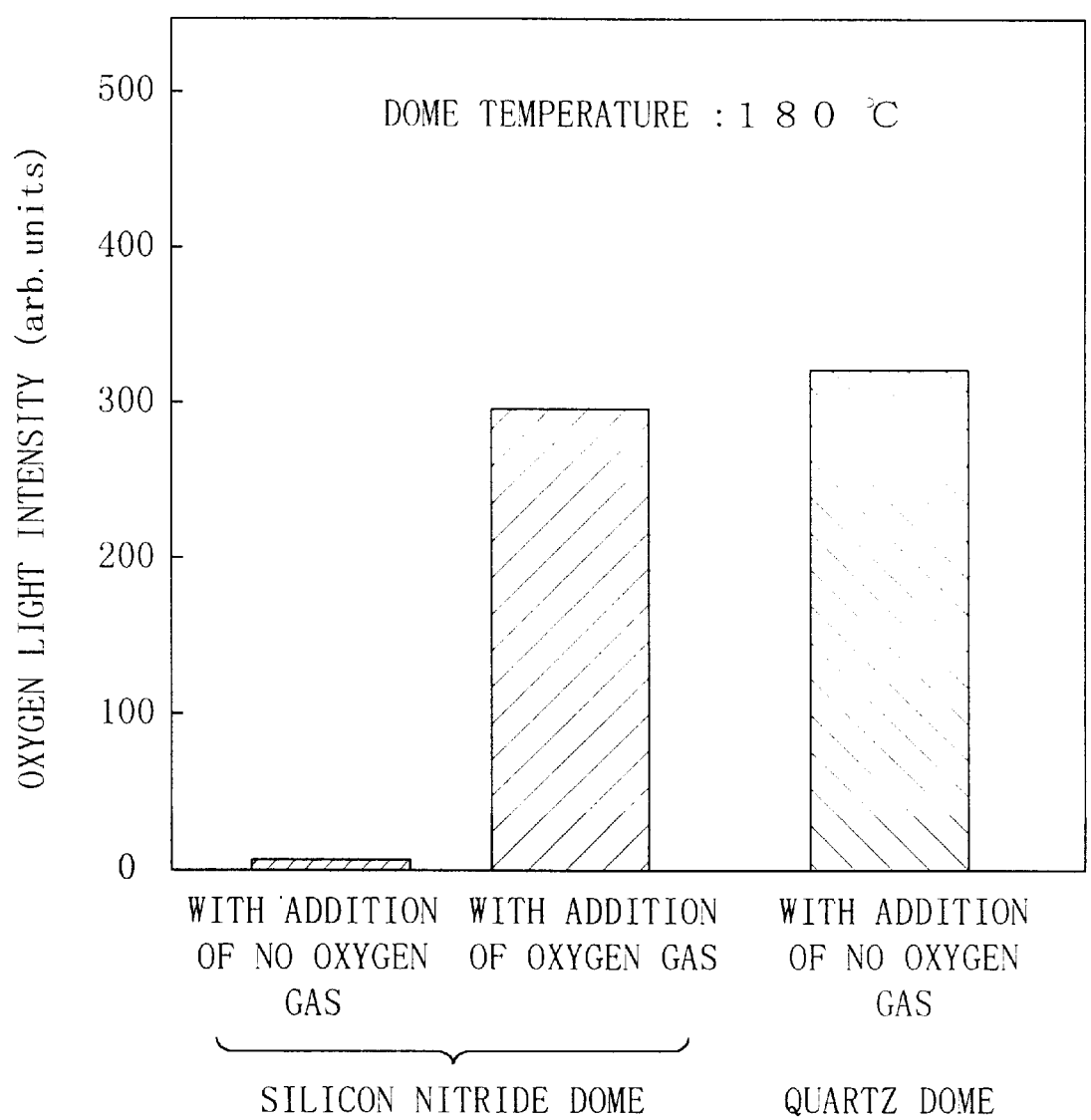
FIG. 15 shows a difference between the O light intensities in the case of using a silicon nitride dome and in the case of using a quartz dome, which were obtained through an experiment performed in relation to the third embodiment.

FIG. 15 shows a difference between the oxygen light intensity in the plasma in the case of using the silicon nitride dome containing no oxygen measured in relation to the present embodiment and the oxygen light intensity in the plasma in the case of using the quartz dome containing oxygen. In either case, the temperature of the dome was as high as 180° C. As described in the first embodiment, oxygen is released from the inner wall face of the quartz dome 2A since $SiO_2$ is etched with an electric field produced by the antenna coil 3. However, the silicon nitride dome 2B is not etched under the same conditions so that nothing is released from the inner wall thereof. This is because bond energy between Si and N composing the silicon nitride dome 2B is higher than bond energy between Si and O composing quartz.

Even if the silicon nitride dome is etched, oxygen is not released from the silicon nitride dome because of material without oxygen. A carbon-based deposit is accumulated on the bottom of the contact hole 104 during etching performed to form the contact hole 104 in the substrate 9, which causes an etch stop during processing (see FIG. 12(b)).

Figure 34:
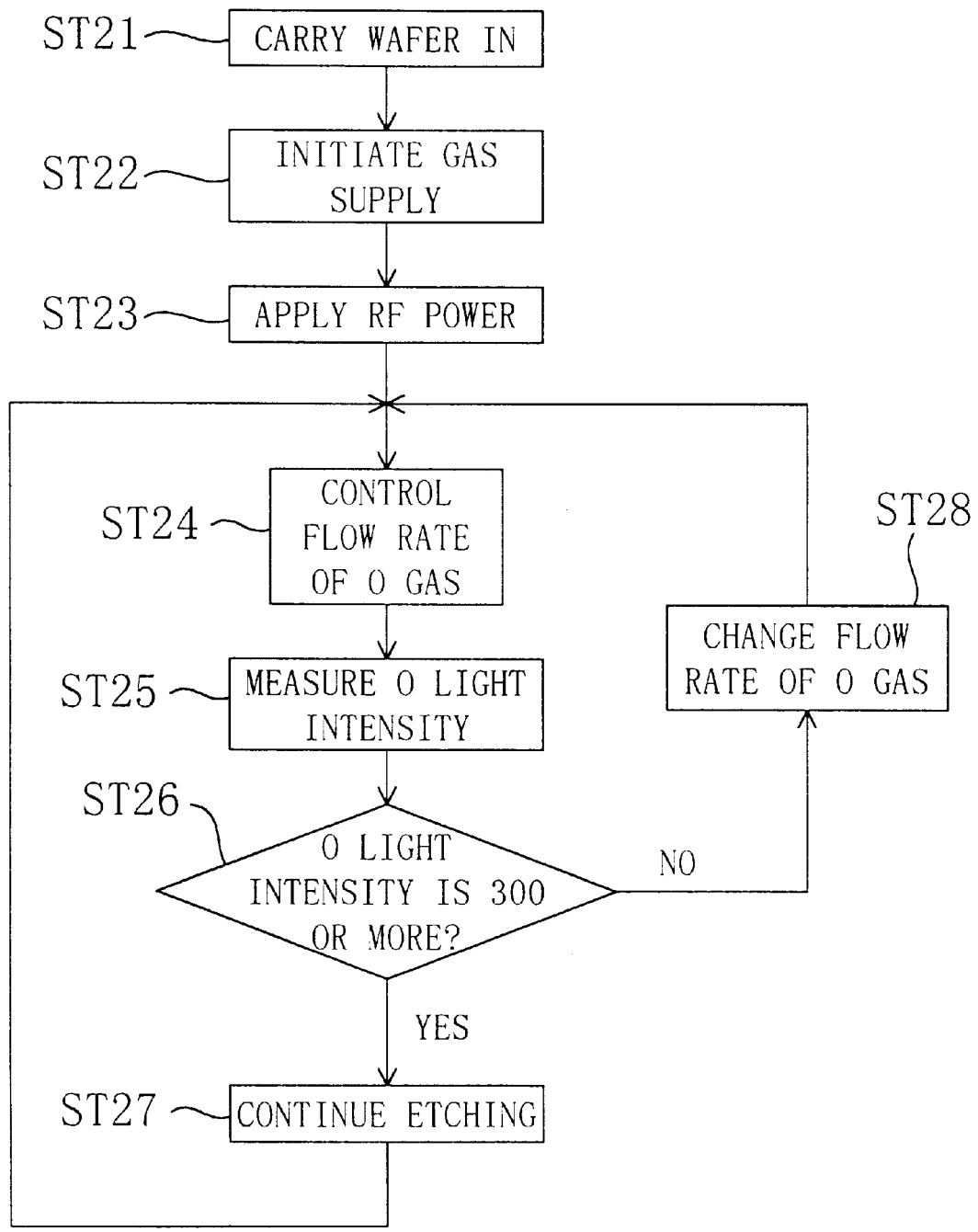
FIG. 34 is a flow chart illustrating the procedure for controlling the flow rate of oxygen gas such that the O light intensity is within a proper range in the third embodiment.

If oxygen gas is added to achieve the O light intensity equal to or higher than the O light intensity achieved with the quartz dome 2A shown in FIG. 15, the carbon-based deposit is removed and etching proceeds with no stop, resulting in the contact hole 104 extending through the oxide film 102 and reaching the silicon substrate 103. FIG. 34 is a flow chart illustrating the procedure for preventing the etch stop by controlling the flow rate of the oxygen gas such that the O light intensity is within a proper range.

In a step ST21, a wafer is carried in a reactor. In a step ST22, the supply of gas into the reactor is initiated. In a step ST23, RF power is applied to the antenna coil 3 and to the lower electrode 10 to initiate the etching of an oxide film on the wafer. Then, in a step ST24, the opening of a control valve for a gas supply system is adjusted to control the flow rate of the oxygen gas. In a step ST 25, the O light intensity is measured. Next, in a step ST26, it is judged whether or not the O light intensity is the given value of 300 (the value in arbitrary units shown in FIG. 2) or higher. If the O light intensity is 300 or higher, the whole process goes on to a step ST27 to continue etching. On the other hand, if the O light intensity is under 300, the whole process goes on to a step ST28 to change the flow rate of oxygen gas and return to the step ST24.

As a result of the foregoing procedure, the O concentration in the reactor can be adjusted to a range free from the etch stop.

With the silicon nitride dome 2B provided in place of the quartz dome 2A, no oxygen is released from the inner wall face of the dome so that the etching properties are not influenced by the material composing the inner wall of the reactor. This allows easy control of the concentration of oxygen through mere adjustment of the flow rate of the oxygen gas.

Although silicon nitride was used as a material composing the inner wall of the reactor in the present embodiment, there may be used any insulator containing no oxygen, such as aluminum nitride, silicon carbide, or AlF, instead of silicon nitride.

Although the gas mixture of the fluorocarbon gas such as $C_2F_6$ gas or $C_4F_8$ gas and the oxygen gas at a flow rate corresponding to 5% of the flow rate of the fluorocarbon gas was introduced into the reactor in the present embodiment, a gas mixture of the fluorocarbon gas such as $C_2F_6$ gas or $C_4F_8$ gas and dilute gas (inert gas) of Ar, He, Xe, or Kr may be mixed with the oxygen gas at a flow rate corresponding to 5% of the flow rate of the gas mixture to be used in the present embodiment. Although the oxygen gas was used as an additive in the present embodiment, there may also be used gas composed of molecules partially containing oxygen, such as CO gas or $CO_2$ gas. Alternatively, a gas mixture of the fluorocarbon gas such as $C_2F_6$ gas or $C_4F_8$ gas, dilute gas (inert gas) of Ar, He, Xe, or Kr, and CO gas or $CO_2$ gas may be mixed with the oxygen gas at a flow rate corresponding to 5% of the flow rate of the mixture gas to be used in the present embodiment.

Embodiment 4

A fourth embodiment will describe a method of judging whether or not a quartz dome should be used in the apparatus for manufacturing a semiconductor device shown in FIG. 1.

As described in the first embodiment, when the inner wall of the reactor is composed of a material containing oxygen, the amount of oxygen released from the reactor greatly influences the etching properties. In the apparatus for manufacturing a semiconductor device shown in FIG. 1 which has been used in the first embodiment, the quartz dome 2A is etched with an electric field produced by the antenna coil 3 wound around the quartz dome 2A so that oxygen is released from the inner wall face of the quartz dome 2A into the plasma 17.

Therefore, when the quartz dome at the end of its life is replaced with a new one, e.g., the amount of oxygen released from the inner wall thereof differs depending on the amount of oxygen contained in the quartz dome or on the degree of ruggedness produced by processing on the inner wall face of the quartz dome, which greatly influences the etching properties. In accordance with the conventional method, it was not until the etch stop actually occurred during the processing of a product and caused product defects that the quartz dome proved to be problematic.

Figure 16:
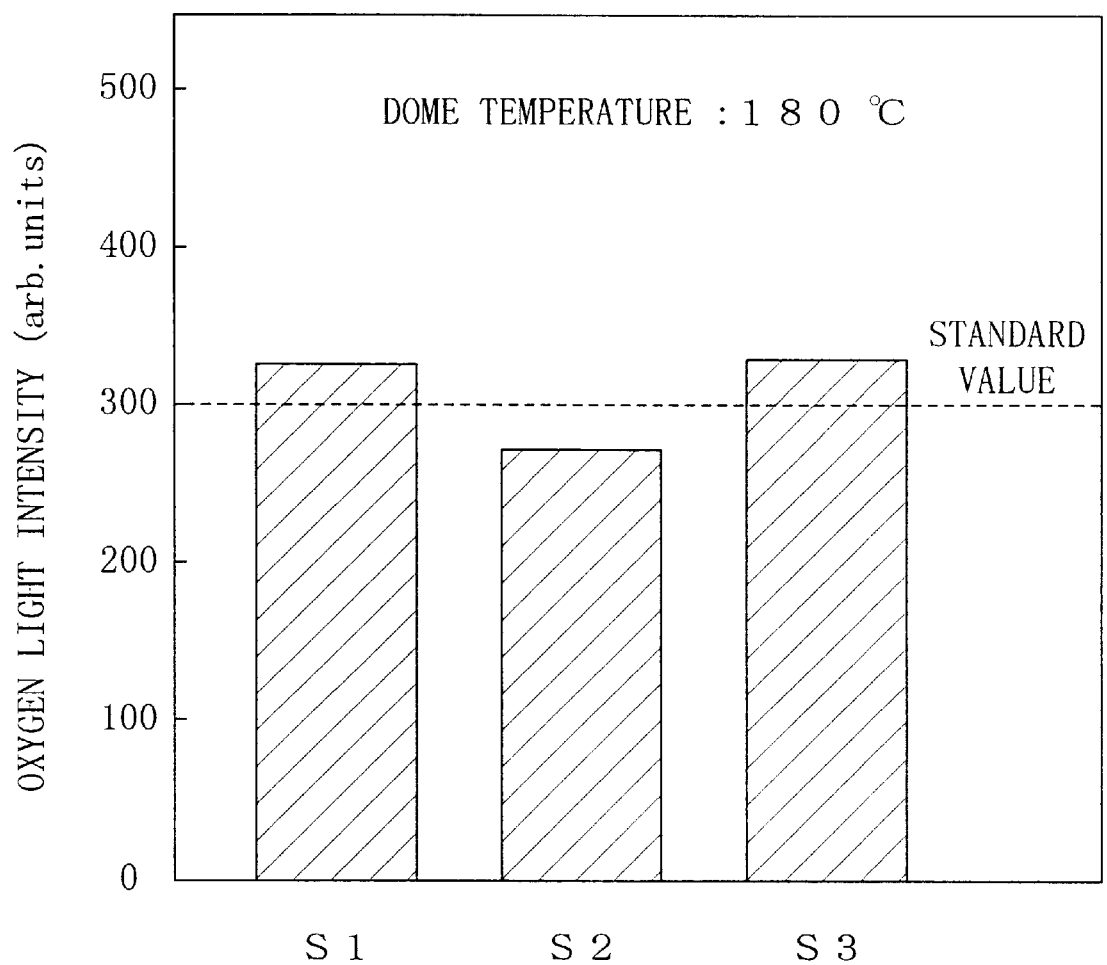
FIG. 16 shows the dependence of the O light intensity on the lot of a quartz dome when the temperature of the quartz dome is adjusted to 180° C. according to a fourth embodiment.

FIG. 16 shows the dependence of the O light intensity on the lot of the quartz dome when the temperature of the quartz dome 2A was set to 180° C. in the apparatus for manufacturing a semiconductor device shown in FIG. 1. Although quartz domes S1, S2, and S3 were produced in all the same manner, the O light intensities are different as shown in FIG. 16. When the quartz dome S2 in which the O light intensity was lower than a standard value was used, the amount of oxygen supplied from the inner wall thereof was insufficient and a carbon-based deposit was accumulated on the bottom of the contact hole during etching performed to form the contact hole, resulting in an etch stop. When the quartz domes S1 and S3 in each of which the O light intensity was higher than the standard value were used, a sufficient amount of oxygen was supplied from the inner wall thereof so that the carbon-based deposit was prevented from being accumulated on the bottoms of the contact holes, resulting in contact holes formed completely with no etch stop.

In the apparatus for manufacturing a semiconductor device according to the present embodiment, since the amount of oxygen released from a component thereof, such as the quartz dome, is measured previously in replacing the component with a new one prior to the manufacture of a product, devices to be manufactured can be prevented in advance from incurring defects.

Embodiment 5

A fifth embodiment will describe a method of controlling, during the process of manufacturing a semiconductor device, an atmosphere in the reactor based on the pre-use condition of a new quartz dome which has replaced the previous quartz dome of the apparatus for manufacturing a semiconductor device shown in FIG. 1.

As described in the first embodiment, when the inner wall of the reactor is composed of a material containing oxygen, the amount of oxygen released from the reactor greatly influences the etching properties. In the apparatus for manufacturing a semiconductor device shown in FIG. 1 which has been used in the first embodiment, the quartz dome 2A is etched with an electric field produced by the antenna coil 3 wound around the quartz dome 2A so that oxygen is released from the inner wall face of the quartz dome 2A into the plasma 17.

Therefore, when the quartz dome at the end of its life is replaced with a new one, e.g., the closeness of contact between the quartz dome and accuracy with which errors depending on the accuracy with which the quartz dome is processed or the adjustment performed in attaching the quartz dome. As a result, the amount of oxygen released from the inner wall face of the quartz dome differs and greatly influences the etching properties. In accordance with the conventional method, it was not until the etch stop actually occurred during the processing of a product and caused product defects that the quartz dome proved to be problematic.

Figure 17:
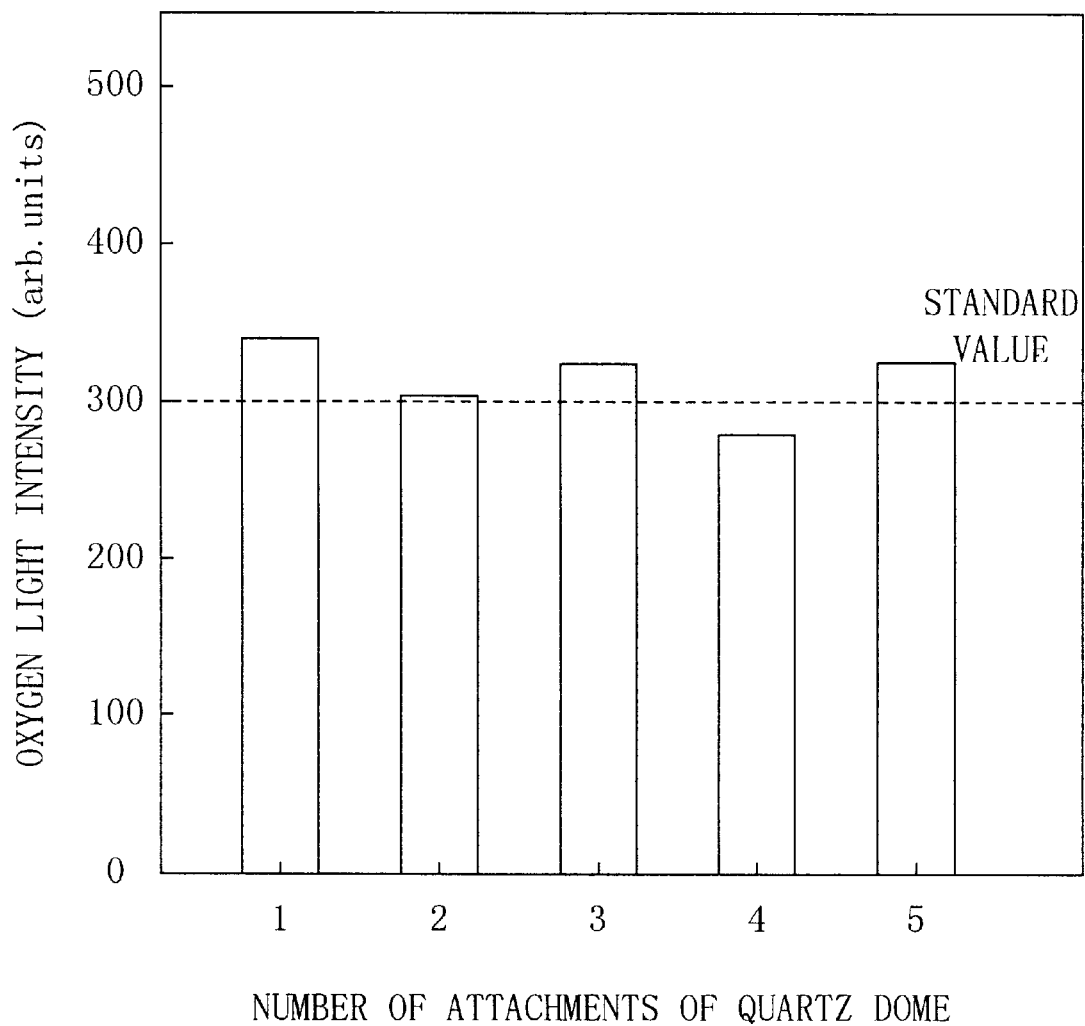
FIG. 17 shows variations in O light intensity when a quartz dome in which the O light intensity is higher than a standard value is over several times attached to and detached from an apparatus for manufacturing a semiconductor device according to a fifth embodiment.

FIG. 17 shows variations in the O light intensity when a quartz dome in which the O light intensity was higher than a standard value (such as the quartz dome S3 shown in FIG. 16) was attached over several times to the apparatus for manufacturing a semiconductor device shown in FIG. 1 when the O light intensity has dependence on the lot of the quartz dome as shown in FIG. 16 illustrating the fourth embodiment. As shown in FIG. 17, the O light intensity varied when the number of attachments varied, though the same quartz dome was used. There were cases where the O light intensity was lower than the standard value.

The variations in the O light intensity may be attributed to the closeness of contact between the quartz dome and the antenna coil which differs depending on the state in which the quartz dome is attached. When etching is performed to form the contact hole in spite of variations in the oxygen light intensity, a carbon-based deposit is accumulated on the bottom of the contact hole during etching, resulting in an etch stop.

To prevent this, the present embodiment measures the O light intensity in replacing the quartz dome and adds oxygen gas so that the O light intensity is higher than the standard value. For this purpose, the procedure as illustrated by the flow chart shown in FIG. 34 is performed properly. As a result, the carbon-based deposit is removed from the bottom of the contact hole and the contact hole extending though the oxide film and reaching the silicon substrate was formed with no etch stop.

Thus, in replacing the quartz component of the apparatus for manufacturing a semiconductor device, the amount of oxygen released from the component is measured in advance prior to the manufacture of a product and, when the amount of released oxygen does not satisfy the standard value, oxygen gas is introduced. By controlling the amount of the gas introduced, product defects can be prevented in advance.

Instead of oxygen gas, another gas containing oxygen may also be used. The gas containing oxygen is not limited to $O_2$ gas but may be CO gas, $CO_2$ gas, or the like each containing oxygen as a component.

The etching gas that can be used in the present embodiment preferably contains at least one of $CF_4$, $C_2F_6$, $C_3F_8$, $C_4F_8$, and $C_6F_6$. The use of gas represented by $C_xF_yO_z$ (such as $C_2F_2O_2$, $C_4F_6O_3$, or $C_6F_4O_2$) further permits simultaneous adjustment of the concentration of oxygen. Consequently, the number of mass flow controllers required to adjust the flow rate of gas can also be reduced, which achieves a reduction in equipment cost and simplified control.

Embodiment 6

A sixth embodiment will describe a method of manufacturing a semiconductor device while controlling the O/F light intensity ratio, which is implemented by using the apparatus for manufacturing a semiconductor device shown in FIG. 1.

In the present embodiment, however, processing is performed by heating the quartz dome 2A and the upper electrode 7 by means of the heaters 6, 24 to adjust the temperature of the quartz dome 2A to 180° C. Moreover, a gas mixture of fluorocarbon gas such as $C_2F_6$ gas or $C_4F_8$ gas and oxygen gas at a flow rate corresponding to 5% or less of the flow rate of the fluorocarbon gas is introduced into the reactor through the gas inlet 8. To etch the substrate 9, the sixth embodiment generates a plasma 17 with a supply of power from the RF first power source 5 and applies a bias voltage to the substrate 9 with a supply of RF power from the second RF power source 13, similarly to the first embodiment.

The present embodiment is characterized in that the O light intensity and the F light intensity in the plasma 17 are measured by the emission spectroscope 19 via an optical fiber 18.

Figure 18:
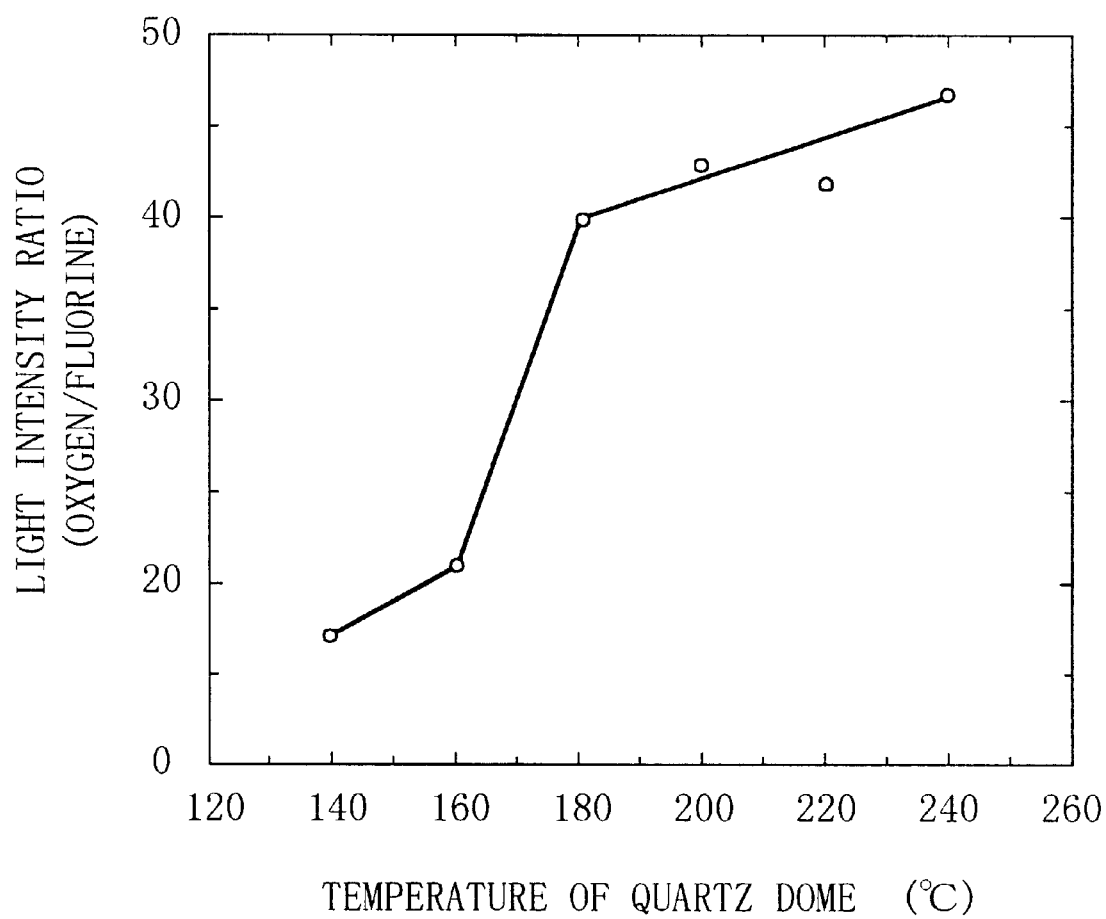
FIG. 18 is a graph showing the dependence of the ratio of the O light intensity to the F light intensity on the temperature of a quartz dome according to a sixth embodiment.

FIG. 18 shows the relationship between the O and F light intensities in the plasma 17 and the temperature of the quartz dome. In FIG. 18, the vertical axis represents the ratio of the intensity of light (with a wavelength of 777 nm) from oxygen to the intensity of light (with a wavelength of 685 nm) from fluorine (hereinafter simply referred to as the light intensity ratio). As shown in the drawing, the light intensity ratio increases as the temperature of the quartz dome increases. This is because the amount of oxygen released from the inner wall face of the quartz dome increases as the temperature of the quartz dome increases, while the amount of fluorine generated from the fluorocarbon gas as etching gas is constant irrespective of the temperature of the quartz dome. When etching is performed to form a contact hole with the temperature of the quartz dome being 160° C. and the light intensity ratio being 20, a carbon-based deposit is accumulated on the bottom of the contact hole due to a reduced amount of oxygen, which causes an etch stop and prevents the formation of the contact hole. By contrast, etching proceeds with no deposit accumulated on the bottom of the contact hole when the temperature of the quartz dome is 180° C. or higher and the light intensity ratio is 40 to 50, resulting in a contact hole formed completely. In particular, the characteristic of the temperature of the quartz dome plotted against the light intensity ratio shown in FIG. 18 is advantageous over the characteristic of the temperature of the quartz dome plotted against the light intensity shown in FIG. 14 in that it ensures recognition of the state when the temperature of the quartz dome reaches 180° C. based on a variation in the light intensity ratio actually measured. It is to be noted that the proper range of the O/F light intensity ratio is different from the data shown in FIGS. 4 to 9 because the O/F light intensity ratio shown in FIGS. 2 to 9 was calculated by using the F peak value at the wavelength of 774 nm proximate to the wavelength of 777 nm at which the O peak value was observed in consideration of controllability.

In the method of manufacturing a semiconductor device according to the present embodiment, etching is performed with the O/F light intensity ratio being 40 to 50.

Figure 19:
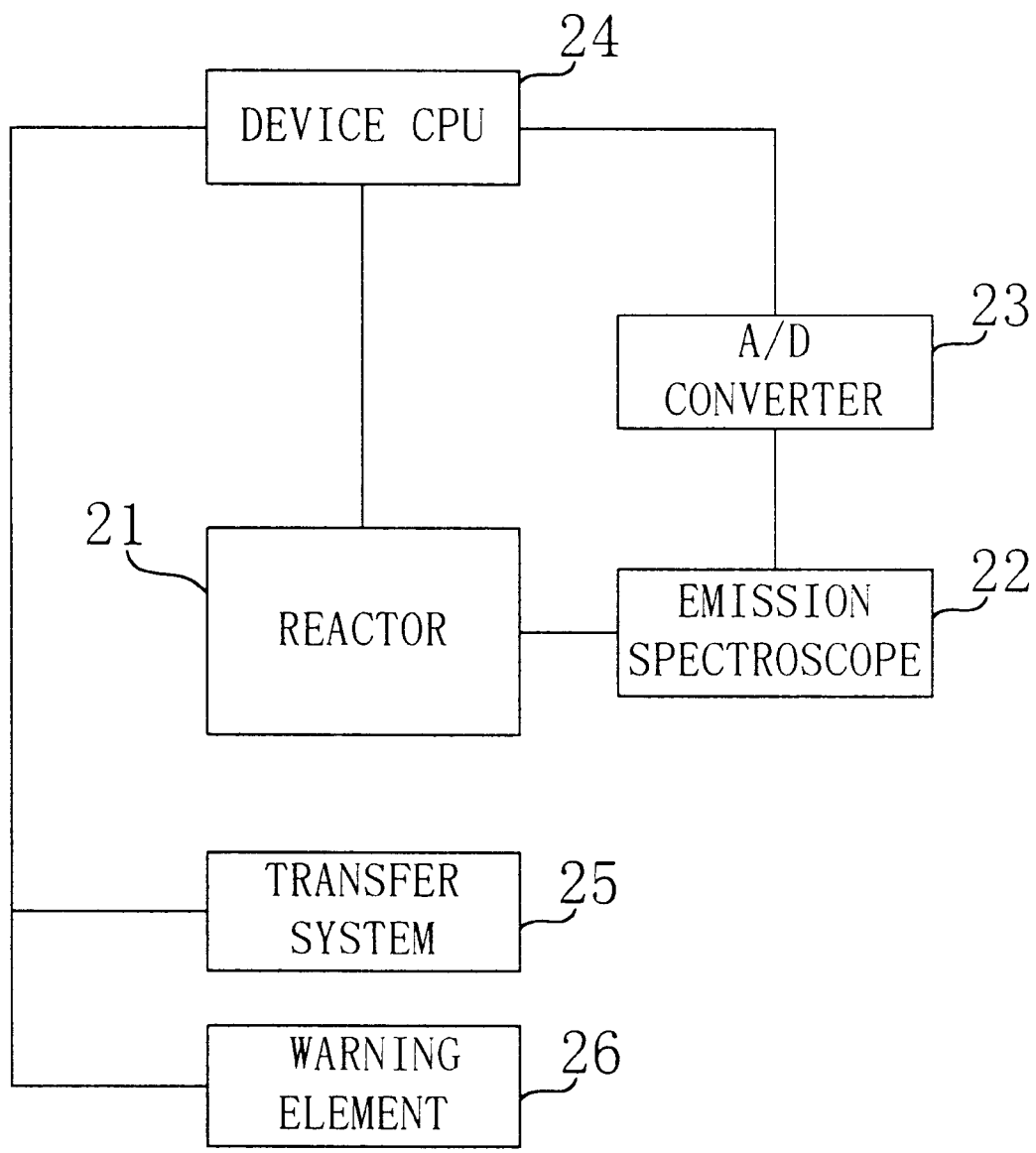
FIG. 19 shows a control system in an apparatus for manufacturing a semiconductor device according to the sixth embodiment.

FIG. 19 is a block diagram schematically showing a structure of a control system in the apparatus for manufacturing a semiconductor device according to the present embodiment. In the drawings are depicted: a reactor 21 including the equipment as shown in FIG. 1; an emission spectroscope 22; an A/D converter 23 for converting an analog signal to a digital signal; a device CPU 24 for controlling the operation of each member; a transfer system 25 for carrying products in and out of the reactor; and a warning device 26 for indicating abnormal conditions.

Figure 20:
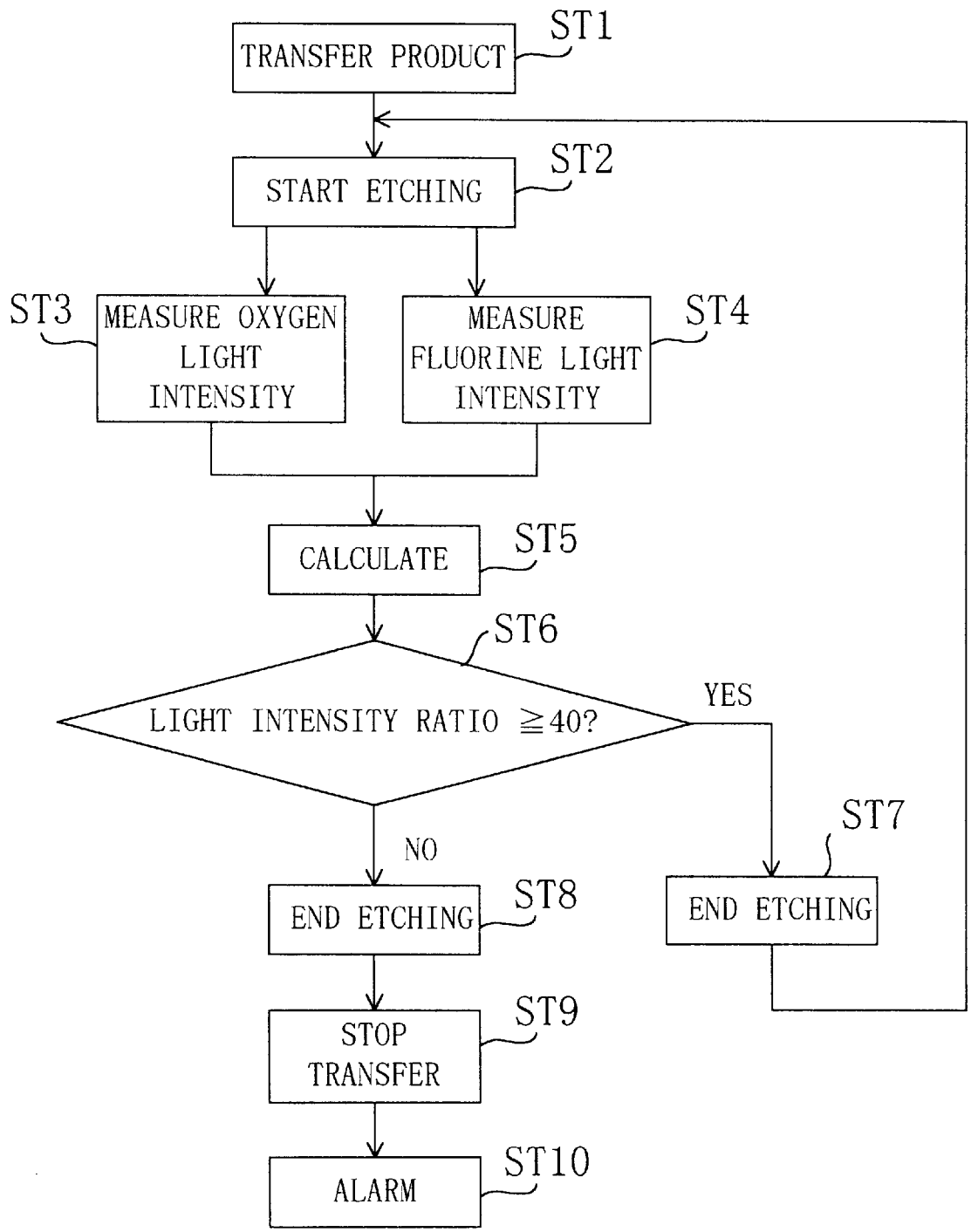
FIG. 20 is a flow chart illustrating the procedure for an etching process performed with respect to a semiconductor device according to the sixth embodiment.

FIG. 20 is a flow chart indicating the control procedure performed by the device CPU 24 shown in FIG. 19 during the etching process. Referring to FIG. 19, a description will be given below to the etching process in accordance with the flow chart illustrated in FIG. 20.

First, in a step ST1, the transfer system 25 carries out of the reactor 21 the etched product, while carrying in the reactor 21 the subsequent product to be etched. Then, in a step ST2, the etching of the product for forming a contact hole therein, e.g., is initiated.

Next, in steps ST3 and ST4, the light intensity in a plasma during etching is measured by an emission spectroscope 22. In the present embodiment, the O and F light intensities are measured. Analog signals detected are converted by the A/D converter 23 to digital signals and inputted to the device CPU 24, which calculates the light intensity ratio between oxygen and fluorine in a step ST6.

Next, in the step ST6, it is judged whether or not the light intensity ratio is 40 or higher and the whole process goes on to a step ST7 and continues etching when the intensity ratio is 40 or higher. When etching is completed, the whole process returns to the step ST1.

When the light intensity ratio is under 40 in the step ST6, etching currently performed is continued but, when etching is completed in a step ST9, the etched product is carried out of the reactor (quartz dome) by the transfer system 25, while the subsequent product to be etched is not carried in the reactor by the process performed in the step ST9. Next, in a step ST10, the warning device 26 is forced to produce an alarm indicating abnormal conditions.

The use of the apparatus and method for manufacturing a semiconductor device prevents product defects in advance. There may be cases where, at the completion of etching in the step ST8, a through contact hole is formed (see FIG. 12(b)) or an etch stop occurs during processing so that the through contact hole is not formed (see FIG. 12(a)).

Although the present embodiment has measured the O and F light intensities and used the O/F light intensity ratio, it is also possible to use only the O light intensity.

The present embodiment may also be modified by performing etching while introducing oxygen gas such that the ratio of the O light intensity to the F light intensity is 40 or higher during etching.

Embodiment 7

A seventh embodiment will describe a method of manufacturing a semiconductor device while adjusting the concentration ratio between oxygen, fluorine, and carbon in the reactor by using the apparatus for manufacturing a semiconductor device shown in FIG. 1.

Figure 21:
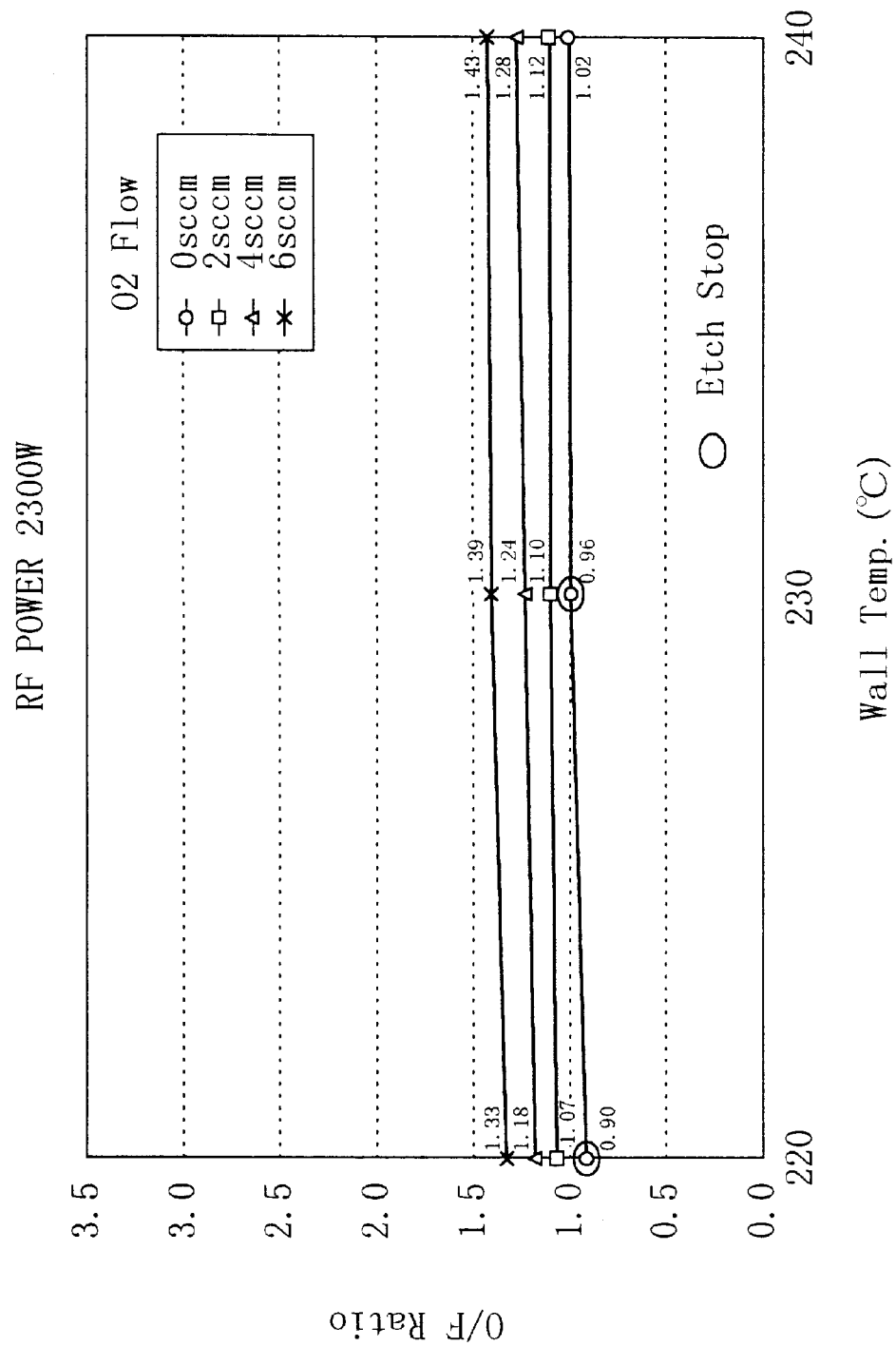
FIG. 21 shows the O/F light intensity ratio when the flow rate of $O_2$ gas added to $C_2F_6$ gas and the wall temperature of a quartz dome are varied in a second specific example of a seventh embodiment.

FIG. 21 shows the O/F light intensity ratio which is the ratio of an O peak value to a F peak value in emission spectra obtained by using the apparatus shown in FIG. 1 supplied with fluorocarbon gas ($C_2F_6$ gas) when RF power was set at 2700 W and the flow rate of $O_2$ gas to be added to the fluorocarbon gas and the temperature of the quartz dome 2A were varied. Although the conditions were varied as shown in FIG. 21, the etch stop occurred only when the flow rate of $O_2$ gas was zero and the temperature of the quartz dome 2A was 220° C., and 230° C., which indicates that the etch stop occurred when the O/F light intensity ratio was 1.0 or less. The O/F concentration ratio in the plasma does not coincide with the O/F light intensity ratio which is 1.0 or less. However, since the O/F light intensity ratio free from the etch stop was obtained previously, it becomes possible to positively circumventing the etch stop and thereby forming the contact hole by controlling the flow rate ratio between $O_2$ gas and fluorocarbon gas such that the O/F light intensity ratio is within a proper range free from the etch stop.

Figure 22:
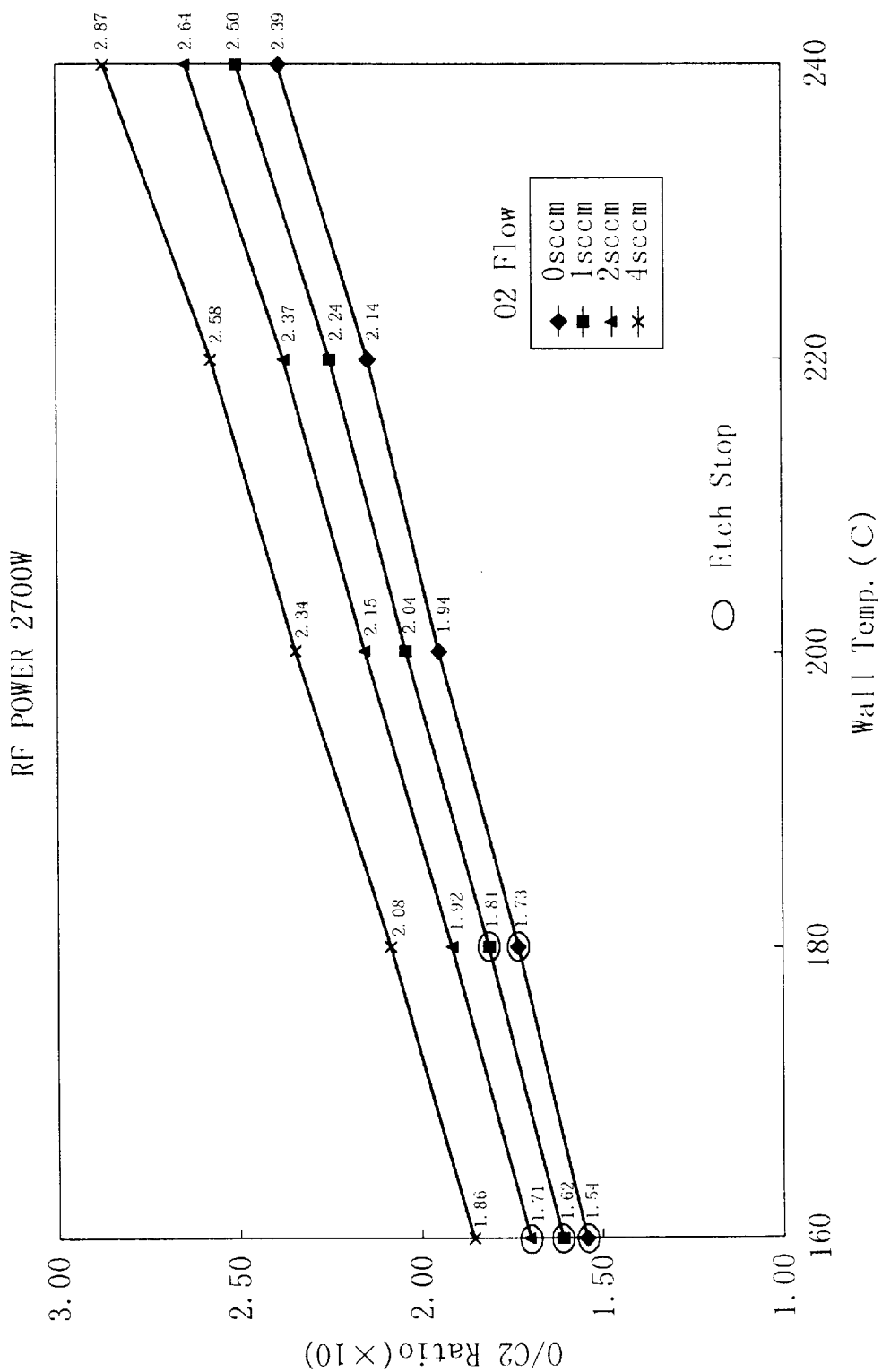
FIG. 22 shows the O/$C_2$ light intensity ratio when the flow rate of $O_2$ gas added to $C_2F_6$ gas and the wall temperature of the quartz dome are varied in the second specific example of the seventh embodiment.

FIG. 22 shows the $O/C_2$ light intensity ratio which is the ratio of an O peak value to a $C_2$ peak value in emission spectra obtained by using the apparatus shown in FIG. 1 supplied with fluorocarbon gas ($C_2F_6$ gas) when RF power was set at 2300 W and the flow rate of $O_2$ gas to be added to the fluorocarbon gas and the temperature of the quartz dome 2A were varied. Although the conditions were varied as shown in FIG. 22, the etch stop occurred when the flow rate of $O_2$ gas was zero and the temperature of the quartz dome 2A was 160° C. and 180° C., when the flow rate of $O_2$ gas was 1 sccm and the temperature of the quartz dome 2A was 160° C. and 180° C., and when the flow rate of $O_2$ gas was 2 sccm and the temperature of the quartz dome 2A was 160° C., which indicates that the etch stop occurred when the $O/C_2$ light intensity ratio was 19 or less. The $O/C_2$ concentration ratio in the plasma does not coincide with the $O/C_2$ light intensity ratio which is 19 or less. However, since the $O/C_2$ light intensity ratio free from the etch stop was obtained previously, it becomes possible to positively circumventing the etch stop and thereby forming the contact hole by controlling the flow rate ratio between $O_2$ gas and fluorocarbon gas such that the $O/C_2$ light intensity ratio is within a proper range free from the etch stop. Although the temperature at which the etch stop occurred is lower in FIG. 22 than in FIG. 21, this may be because the RF power shown in FIG. 22 was 2300 W, which is slightly lower than the RF power shown in FIG. 21.

From the data shown in FIGS. 21 and 22, it will be understood that the concentration ratio between C, F, and O in the plasma can be controlled such that the light intensity ratio between $C_2$, F, and O in the plasma is within a proper range. However, the concentration ratio between carbon and fluorine becomes substantially constant once the type of etching gas such as fluorocarbon gas is determined. Therefore, it is generally sufficient to control the flow rate of $O_2$ gas while measuring the O/F light intensity ratio and the $O/C_2$ light intensity ratio. In that case, the use of $O/C_2$ light intensity ratio as a control parameter exerts more direct control over the flow rate of $O_2$ gas such that the effect of depositing a product containing carbon on the bottom of the hole and the effect of removing the product containing carbon are properly kept in balance. However, since the wavelengths at which O and $C_2$ reach their peak values in the emission spectra are greatly different from each other, as shown in FIGS. 2(a) and 2(b), it is troublesome to accurately measure the $O/C_2$ light intensity ratio. On the other hand, the wavelengths at which O and F reach their peak values in the emission spectra are extremely close to each other, the O/F light intensity ratio can be measured accurately and promptly. Moreover, since the concentration ratio between carbon and fluorine may be considered substantially constant once the type of fluorocarbon gas is determined, as shown in FIG. 21, the O/F light intensity ratio can be used as the control parameter as a substitute for the $O/C_2$ light intensity ratio. In that case, the O/F light intensity ratio when the etch stop occurred shown in FIG. 21 may be considered actually indicative of the $O/C_2$ light intensity ratio when the etch stop occurred, i.e., the O/C concentration ratio in the plasma. However, since the F concentration also affects the etching effect in terms of another function, the O/F light intensity ratio can also be used as a control parameter to prevent the etch stop to the extent that the etching effect is not degraded.

In order to prevent the etch stop during processing, it is considered that the concentration ratio between C, F, and O in the plasma is preferably in the following range in terms of the presence and absence of the etch stop shown in the foregoing data and the light intensity ratio between C, F, and O.

It is considered that the O/F concentration ratio is preferably 4 or more in terms of preferring the etch stop and more preferably 10 or less since an excessively high O/F concentration ratio reduces the etching selectivity of the silicon oxide film to the silicon substrate and therefore lowers the etch rate. It is also considered that the O/C concentration ratio is preferably 2 or more since an excessively low O/C concentration ratio causes an etch stop during processing and more preferably 5 or less since an excessively high O/C concentration ratio prevents an increase in the etching selectivity of the silicon oxide film to the silicon substrate.

The occurrence of an abrupt etch stop cannot positively be avoided by merely supplying a flow of $O_2$ gas at a given flow rate because the concentration ratio between C, F, and O in the plasma in the reactor gradually deviates from the proper range as an increased number of wafers are processed. This may be because a slight deviation of the concentration ratio between C, F, and O from the optimum range is progressively aggravated as etching proceeds. Therefore, constant adjustment of the concentration ratio between C, F, and O in the plasma to the proper range has the advantage that the etch stop is prevented more positively.

To provide the foregoing proper concentration ratio between C, F, and O, there can be adopted the following methods.

In accordance with the first method, the temperature of the quartz dome 2A is controlled without involving the addition of $O_2$ gas. Since the method adjusts the O concentration, it is possible to hold each of the O/C concentration ratio and the O/F concentration ratio within the proper range. The first method has been described previously.

However, the conditions for implementing the proper range may be limited by merely controlling the heating of the quartz member. To prevent this, there can be adopted the following method.

When the upper electrode 7 made of polysilicon is heated first by means of the top heater 6, F reacts directly with polysilicon, which enhances the fluorine-absorbing effect of polysilicon. When the quartz dome 2A was heated to 220° C., the upper electrode 7 was heated, and source power of 2500 was applied without supplying $O_2$ gas, the etch stop did not occur at 240° C. but occurred at 260° C. This may have been because the F concentration ratio was reduced. Hence, the F concentration can be adjusted by controlling the degree to which the upper electrode 7 made of polysilicon (hereinafter referred to as the polysilicon electrode) is heated by the top heater 6.

Figure 35:
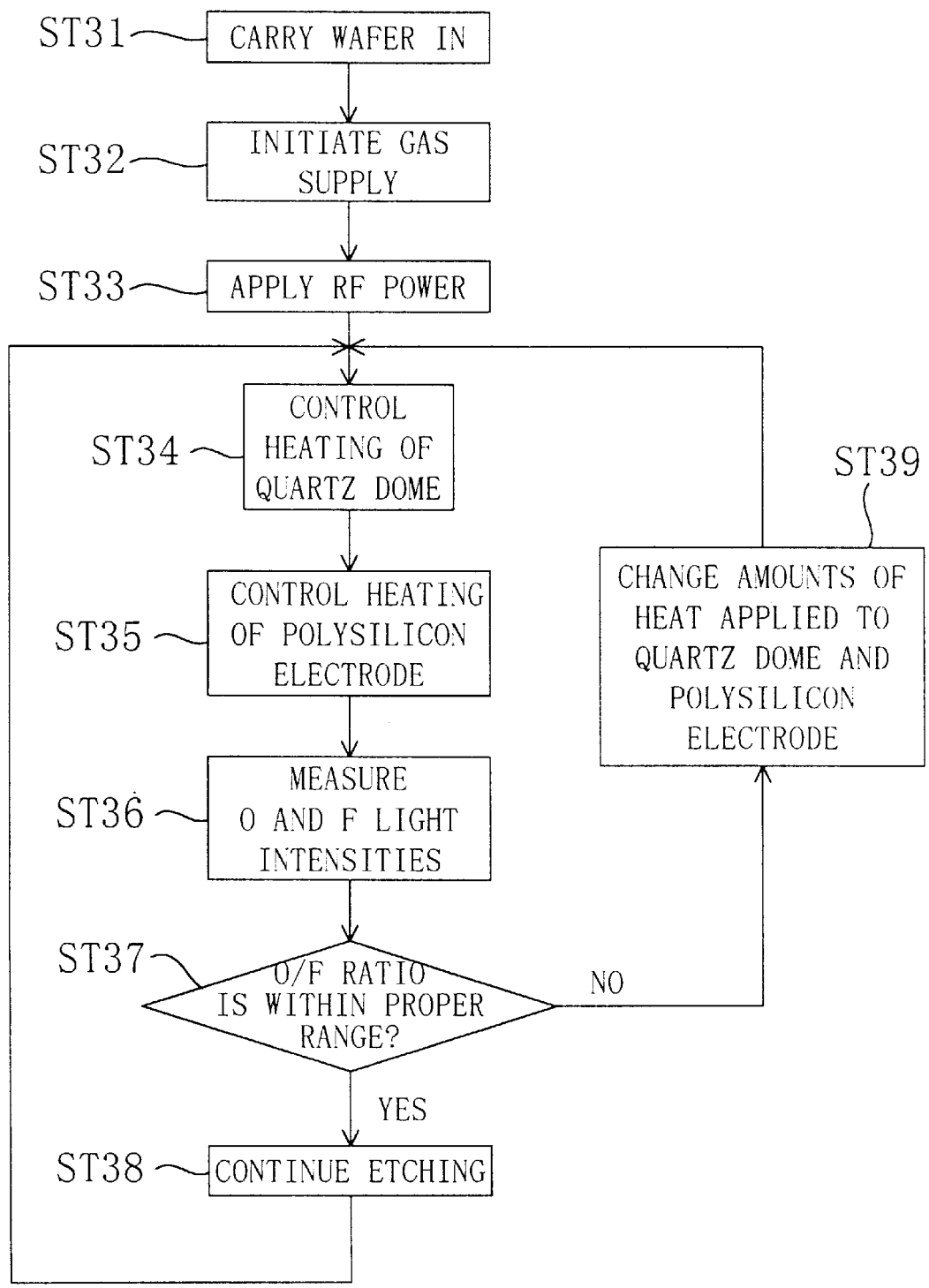
FIG. 35 is a flow chart illustrating the procedure for controlling the amount of heat applied to the quartz dome and the amount of heat applied to a polysilicon electrode such that the O/F light intensity ratio is within a proper range in the seventh embodiment.

FIG. 35 is a flow chart illustrating the procedure for preventing the etch stop by controlling the amounts of heat applied to the quartz dome and to the silicon electrode such that the O/F light intensity ratio is within the proper range.

In a step ST31, a wafer is carried in the reactor. In a step ST32, the supply of gas into the reactor is initiated. In a step ST33, RF power is applied to the antenna coil 3 and to the lower electrode 10 to initiate the etching of an oxide film on the wafer. Then, in a step ST34, the quartz dome 2A is heated by the dome heater 24. In a step ST35, the polysilicon electrode is heated by the top heater 6. In a step ST36, the O and F light intensities are measured. Next, in a step ST37, it is judged whether or not the O/F light intensity ratio is within the proper range. If it is within the proper range, the whole process goes on to a step ST38 to continue etching. On the other hand, if the O/F light intensity ratio is not within the proper range, the whole process goes on to a step ST39 to change the amount of heat applied to the quartz dome or to the polysilicon electrode and return to the step ST34.

As a result of the foregoing procedure, the O/F concentration ratio in the plasma can be adjusted to the range free from the etch stop.

It is also possible to dispose the carbon containing member in the reactor such that the carbon containing member is heated. For example, the top heater 7 may be composed of carbon (hereinafter referred to as the carbon heater) and heated, whereby the amount of C released into the reactor is controlled and the concentration of C in the plasma is adjusted.

Figure 36:
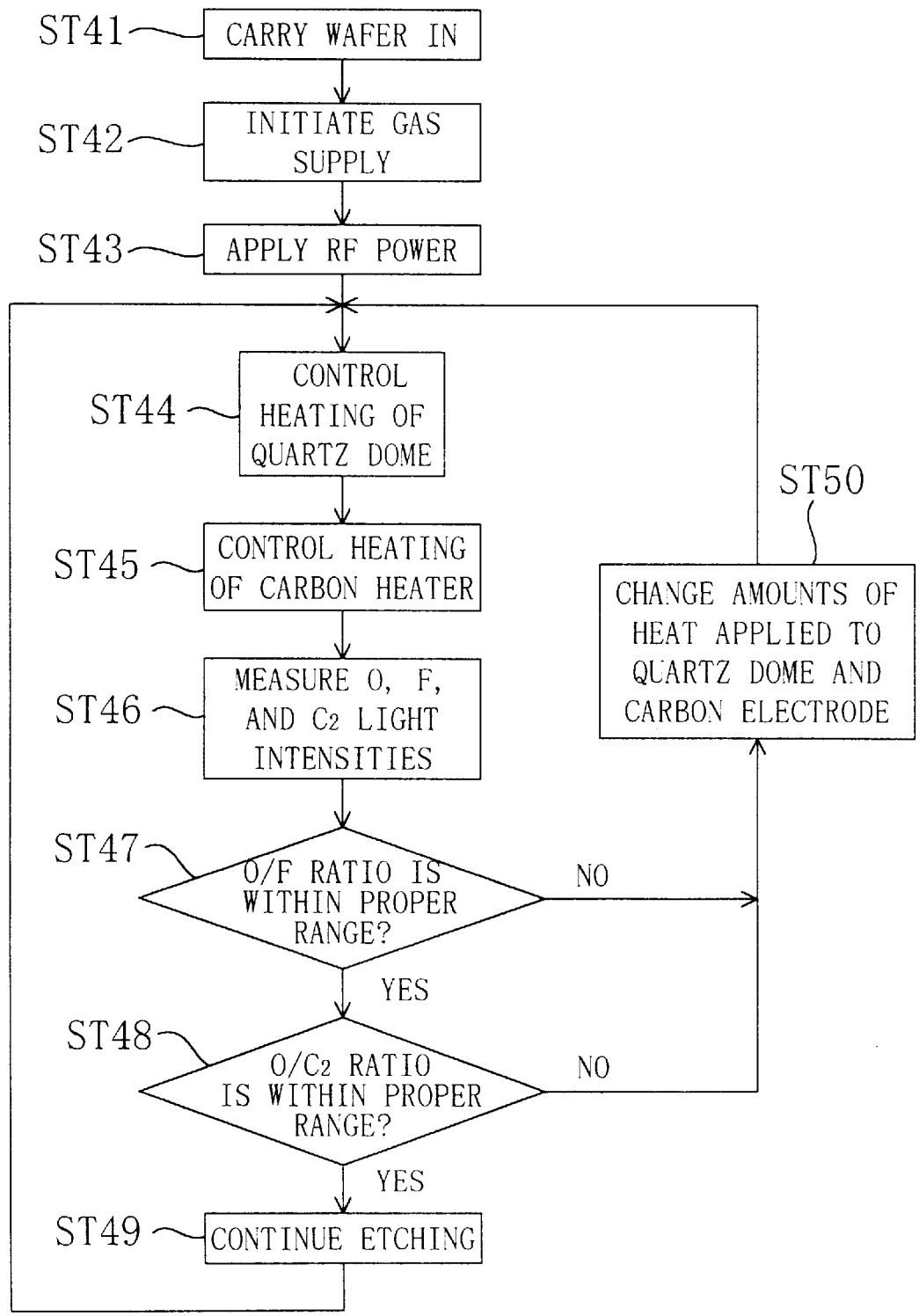
FIG. 36 is a flow chart illustrating the procedure for controlling the amount of heat applied to the quartz dome and the amount of heat applied to a carbon heater such that each of the O/F light intensity ratio and the O/$C_2$ light intensity ratio is within a proper range.
Figure 37:
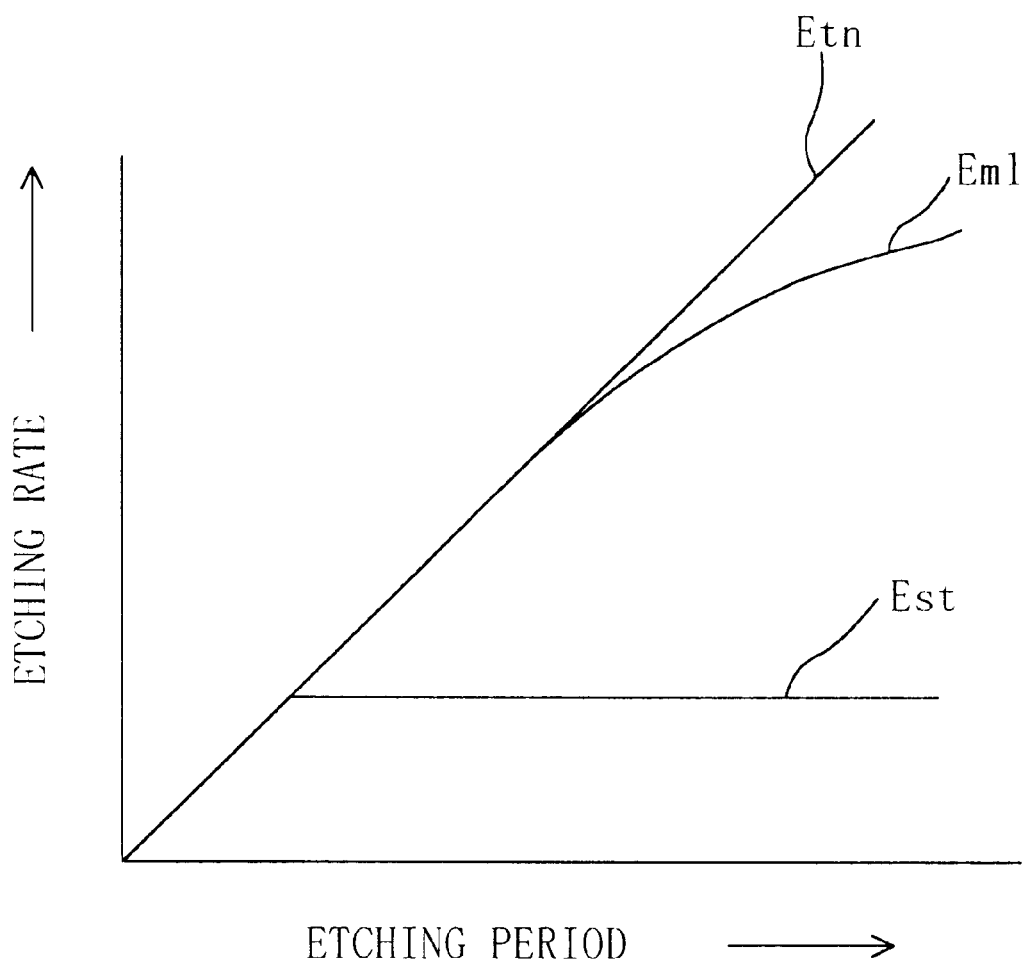
FIG. 37 shows etching proceeding in the three cases of normal etching, microloading, and etch stop.

FIG. 36 is a flow chart illustrating the procedure for preventing the etch stop by controlling the amounts of heat applied to the quartz dome and to the carbon heater such that O/F light intensity ratio and the $O/C_2$ light intensity ratio are within the proper range.

In a step ST41, the wafer is carried in the reactor. In a step ST42, the supply of gas into the reactor is initiated. In a step ST43, RF power is applied to the antenna coil 3 and to the lower electrode 10 to initiate the etching of an oxide film on the wafer. Then, in a step ST44, the quartz dome 2A is heated by the dome heater 24. In a step ST45, the carbon heater is heated. In a step ST46, the O, F, and $C_2$ light intensities are measured. Next, in a step ST47, it is judged whether or not the O/F light intensity ratio is within the proper range, followed by the judgment of whether or not the $O/C_2$ light intensity ratio is within the proper range in a step ST48. If each of the O/F light intensity ratio and the $O/C_2$ light intensity ratio is within the proper range, the whole process goes on to a step ST49 to continue etching. On the other hand, if either of the O/F light intensity ratio and the $O/C_2$ light intensity ratio is not within the proper range, the whole process goes on to a step ST50 to change the amount of heat applied to the quartz dome or to the carbon heater (or the respective amounts of heat applied to the quartz dome and to the carbon heater) and return to the step ST44.

As a result of the foregoing procedure, the O/F concentration ratio and the $O/C_2$ concentration ratio in the plasma can be adjusted to the ranges free from the etch stop.

To adjust the C/F/O concentration ratio, gas containing at least one of these elements can be used as reactive gas or additive gas.

For example, gas containing at least one of $CF_4$, $C_2F_6$, $C_3F_8$, $C_4F_8$, $C_5F_8$, and $C_6F6$ can be used as the reactive gas. Alternatively, CO gas or $O_2$ gas may be added to $C_4F_8$. The C/F concentration ratio can be adjusted more minutely by using a gas mixture of $C_6F_6$ and $C_4F_8$.

If gas represented by $C_xF_yO_z$ (such as $C_2F_2O_2$, $C_4F_6O_3$, or $C_6F_4O_2$) is used, the C/F/O concentration ratio can be held within the proper range by using one type of reactive gas without using toxic gas such as CO gas. It is also possible to add fluorocarbon gas such as $CF_4$ to the foregoing gas.

When the foregoing reactive or additive gas is used, in particular, the C/F/O concentration ratio may be adjusted properly by controlling only the flow rate of the gas without disposing a member having a surface portion exposed in the reactor composed of quartz or carbon.

Embodiment 8

An eight embodiment will describe an etch stop resulting from aluminum ions present in a reactor.

Figure 23A:
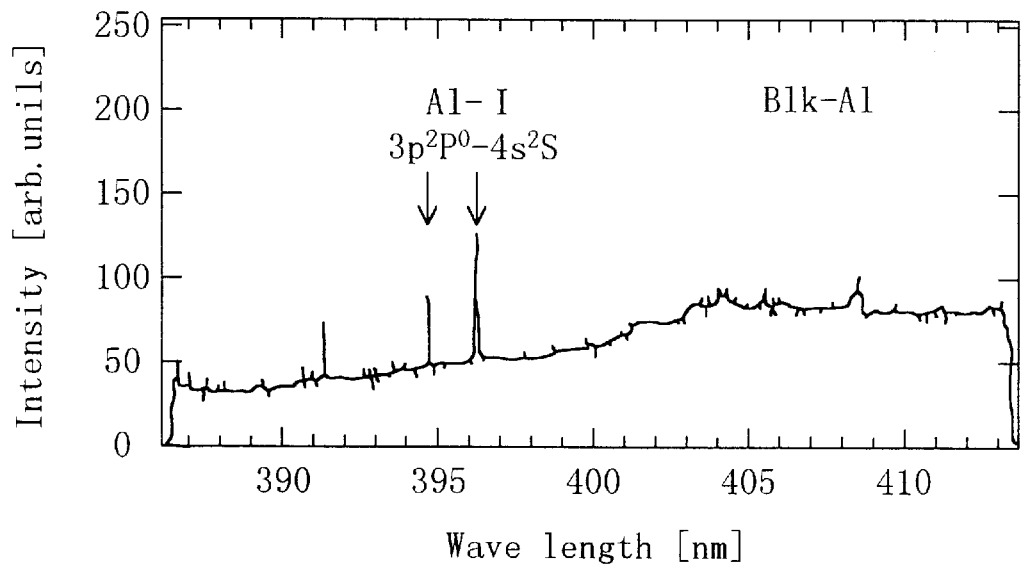
FIGS. 23(a) and 23(b) show optical emission spectra indicative of the results of emission spectral analyses performed with respect to a plasma used to etch an Al film and a Si substrate according to an eighth embodiment.
Figure 23B:
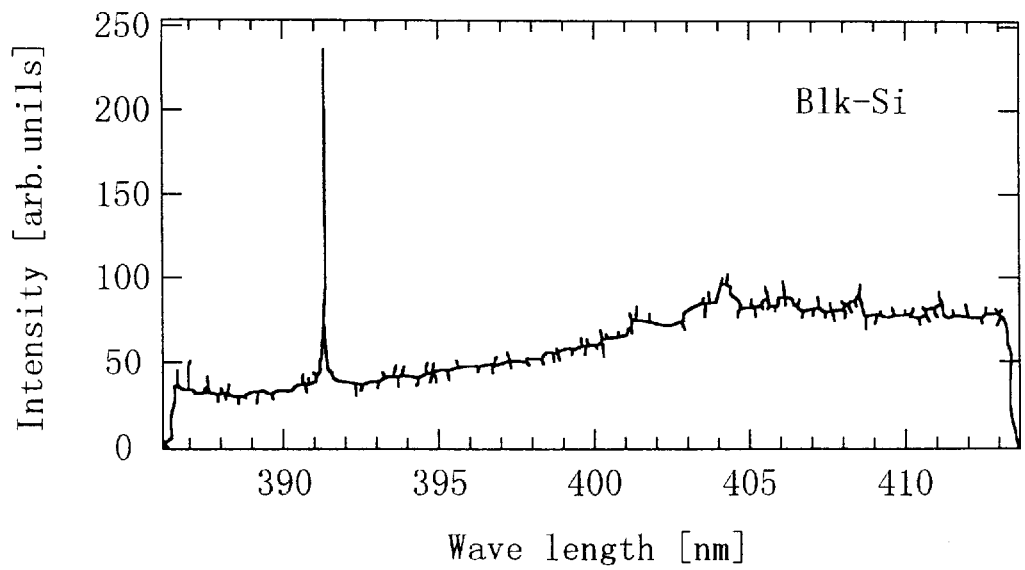

When a metal film (especially an Al film, a Ti film, a Cu film, a W film, and a Co film for wiring) is etched and when the metal film is exposed after the etching of another member (e.g., a silicon oxide film) overlying the metal film is completed, the phenomenon of metal scattered in a plasma in the reactor is generally observed. FIGS. 23(a) and 23(b) show emission spectra indicative of the results of emission spectral analyses performed with respect to the plasma when the Al film was etched and when the Si substrate was etched, respectively. In accordance with the data shown in FIG. 23(a), Al ions not shown in FIG. 23(b) were detected, which endorses the presence of Al ions scattered in the plasma.

Figure 24:
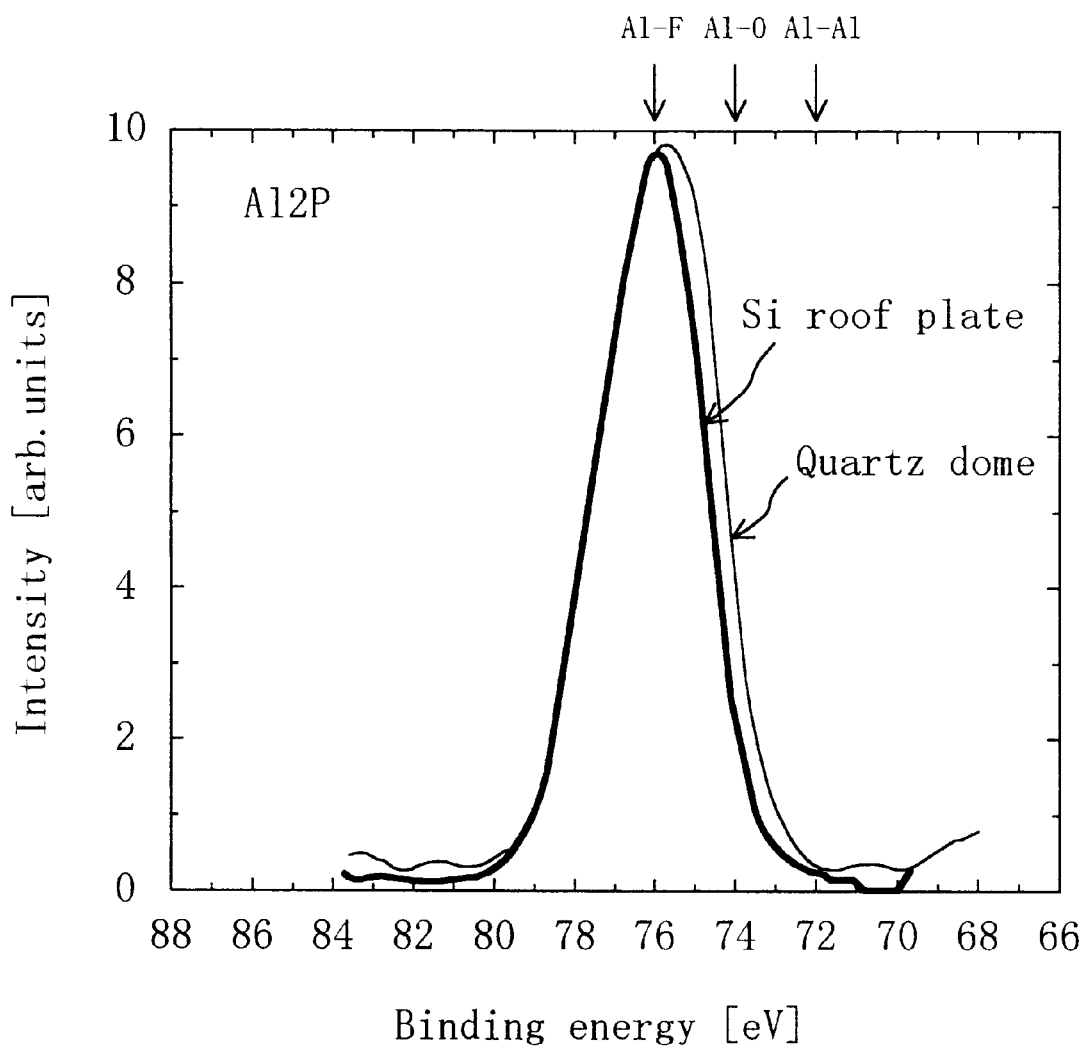
FIG. 24 shows the results of XPS analyses performed with respect to the surfaces of a silicon roof plate and a quartz dome in a chamber according to the eighth embodiment.

It can be considered that the scattered metal is attached to a member in the chamber and bonded to an etching species (F, O). FIG. 24 shows the results of XPS analyses performed with respect to the surfaces of a silicon roof plate and of the quartz dome in the chamber. In the drawing, the horizontal axis represents binding energy (eV) and the vertical axis represents measured intensity. As shown in the drawing, the presence of a substance having an Al—F bond was recognized at the both members.

Figure 25:
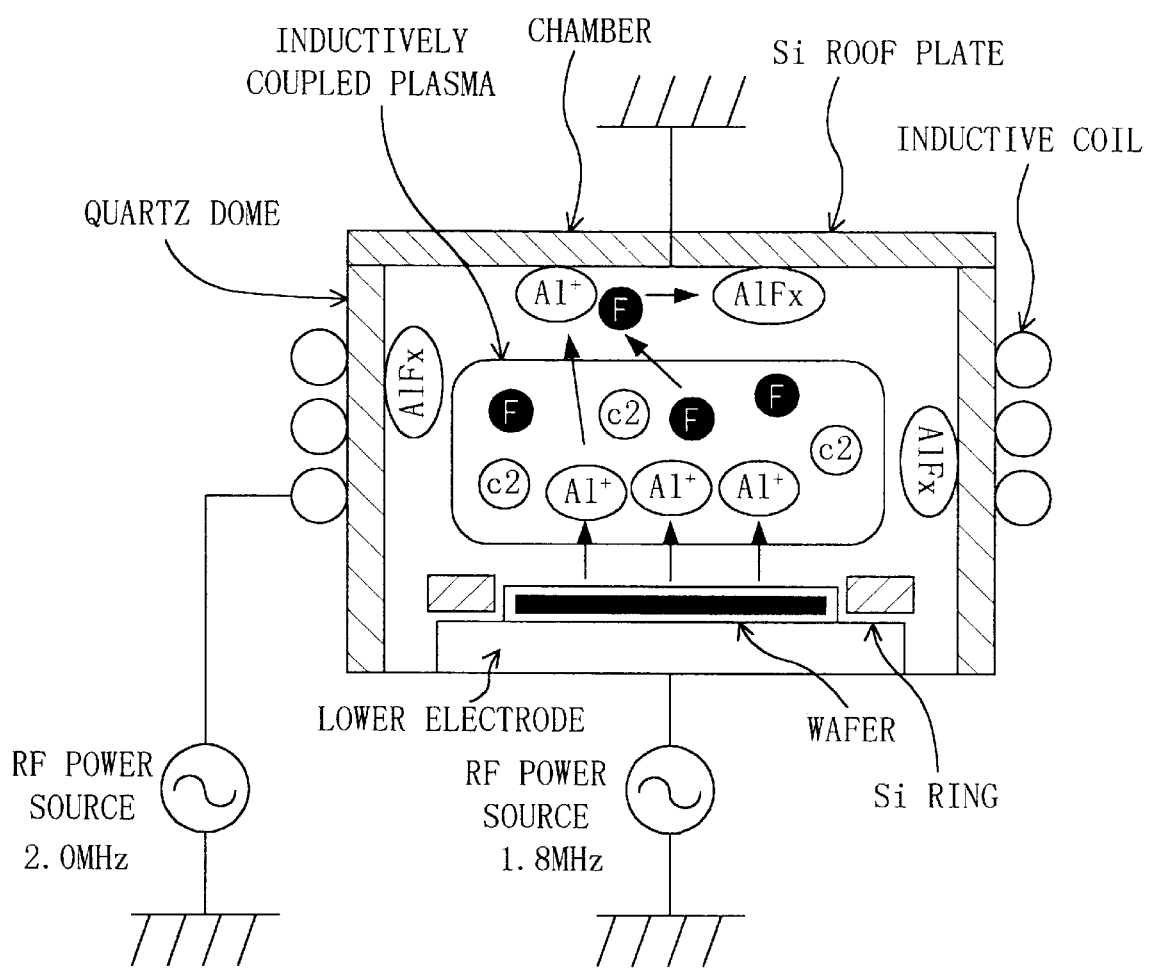
FIG. 25 is a cross-sectional view illustrating the model of an etch stop resulting from Al scattered in a chamber in the eighth embodiment.
Figure 26:
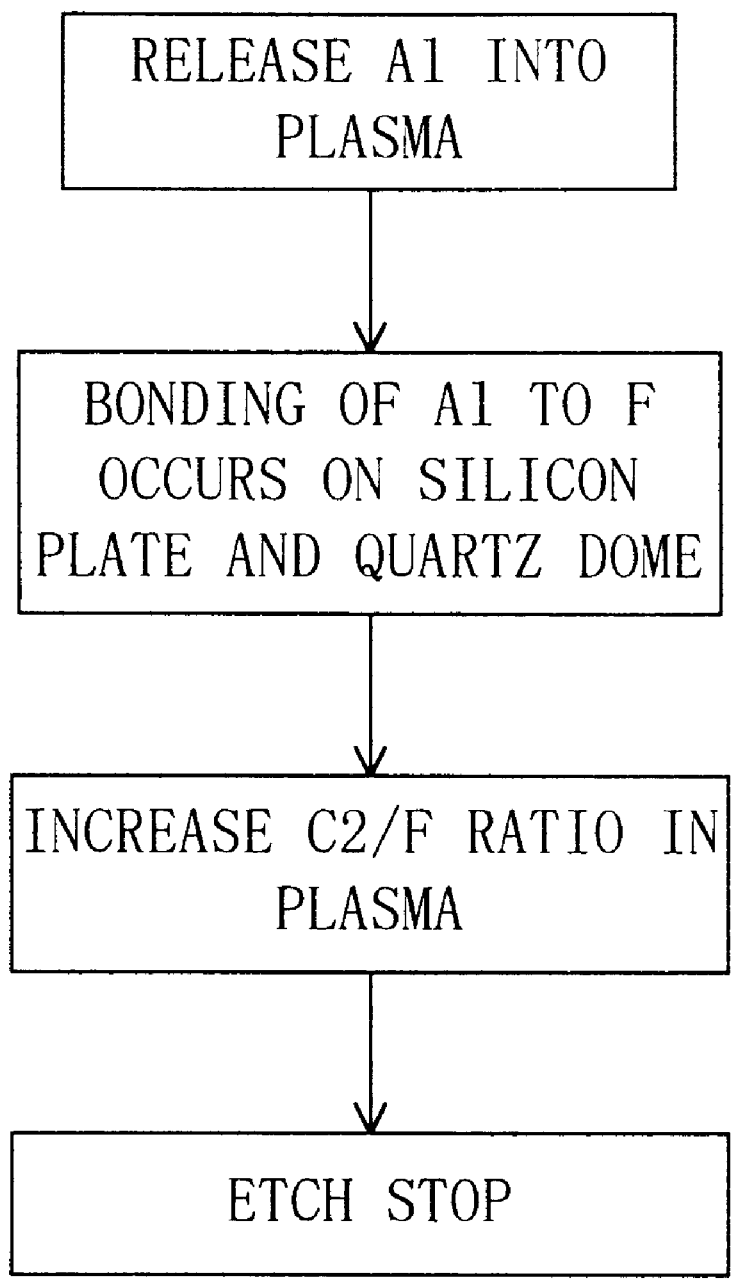
FIG. 26 is a flow chart illustrating the process of the etch stop occurred in the eighth embodiment.

FIG. 25 is a cross-sectional view showing the model of the etch stop resulting from Al scattered in the reactor. FIG. 26 is a flow chart illustrating the process in which the etch stop occurs. Referring to FIGS. 25 and 26, a description will be given to the process in which the etch stop occurs.

By way of example, the present embodiment will describe the case where an inductively coupled plasma apparatus wherein the wall portion of the chamber is composed of the quartz dome and the silicon roof plate and RF power is applied from two RF power sources to an inductive coil and to a lower electrode. An interlayer insulating film composed of a silicon oxide film is formed on the wafer. It is assumed that plasma etching is performed with respect to the interlayer insulating film to form a hole (via hole) reaching an Al wire. In the plasma, F ions, F radicals and $C_2$ ions resulting from decomposed fluorocarbon are present. If a through hole occupying a large area (e.g., a hole over a bonding pad) is formed, a surface of the Al wire is exposed therein to occupy a large area. When Al ions are scattered in the plasma, the F ions and the Al ions in the plasma combine to form a compound $AlF_x$, which is deposited on the silicon roof plate and on the quartz dome. The formation of $AlF_x$, reduces the etching species (F) in the plasma to increase the $C_2/F$ ratio. As a result, the etch stop is caused by the effect described prior to the description of the embodiments. It may be considered that such an etch stop occurs when the foregoing condition (c) is satisfied.

Figure 27:
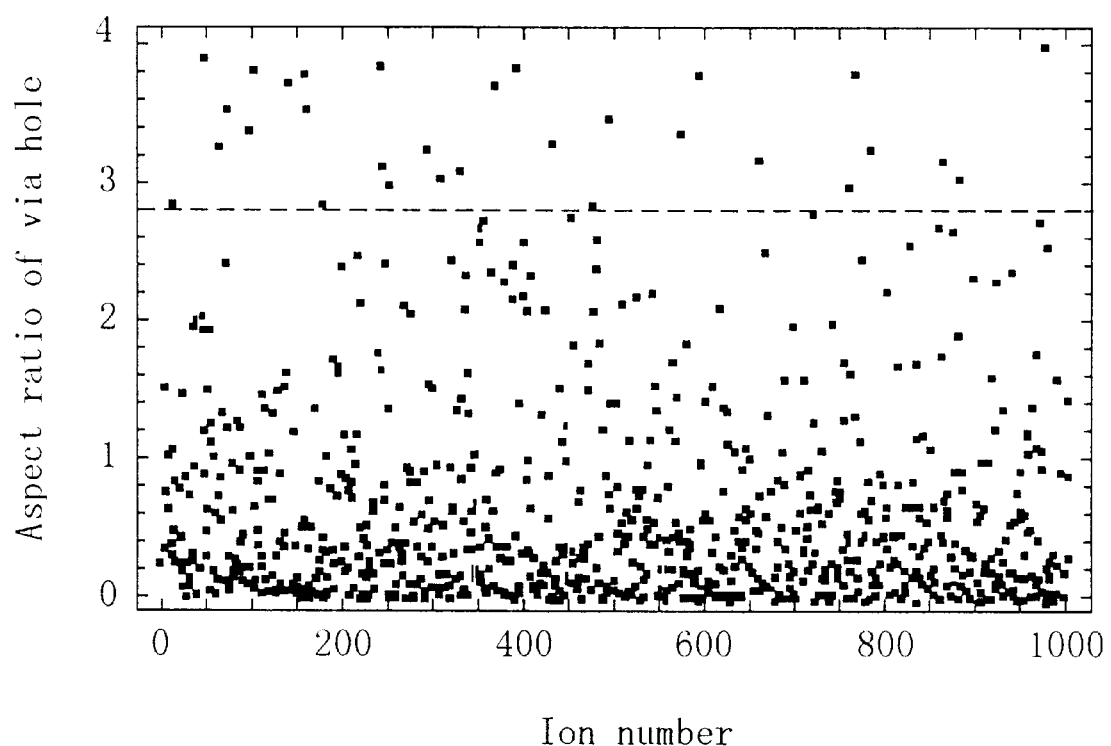
FIG. 27 shows the result of calculating the respective positions of 1000 ions present in a hole by Monte Carlo simulation in the eighth embodiment.

However, the etch stop resulting from metal contamination is less likely to occur during etching for forming a hole with a high aspect ratio. FIG. 27 shows the result of Monte Carlo simulation performed to determine the positions of 1000 ions present in the hole. In the drawing, the horizontal axis represents the numbers assigned to the 1000 ions and the vertical axis represents the height from the bottom of the hole having a given configuration as an aspect ratio. The probability of an ion trapped in the hole with a given aspect ratio can be obtained by dividing the number of ions lower in level than the position with the given aspect ratio in FIG. 27 by the total number of ions.

Figure 28:
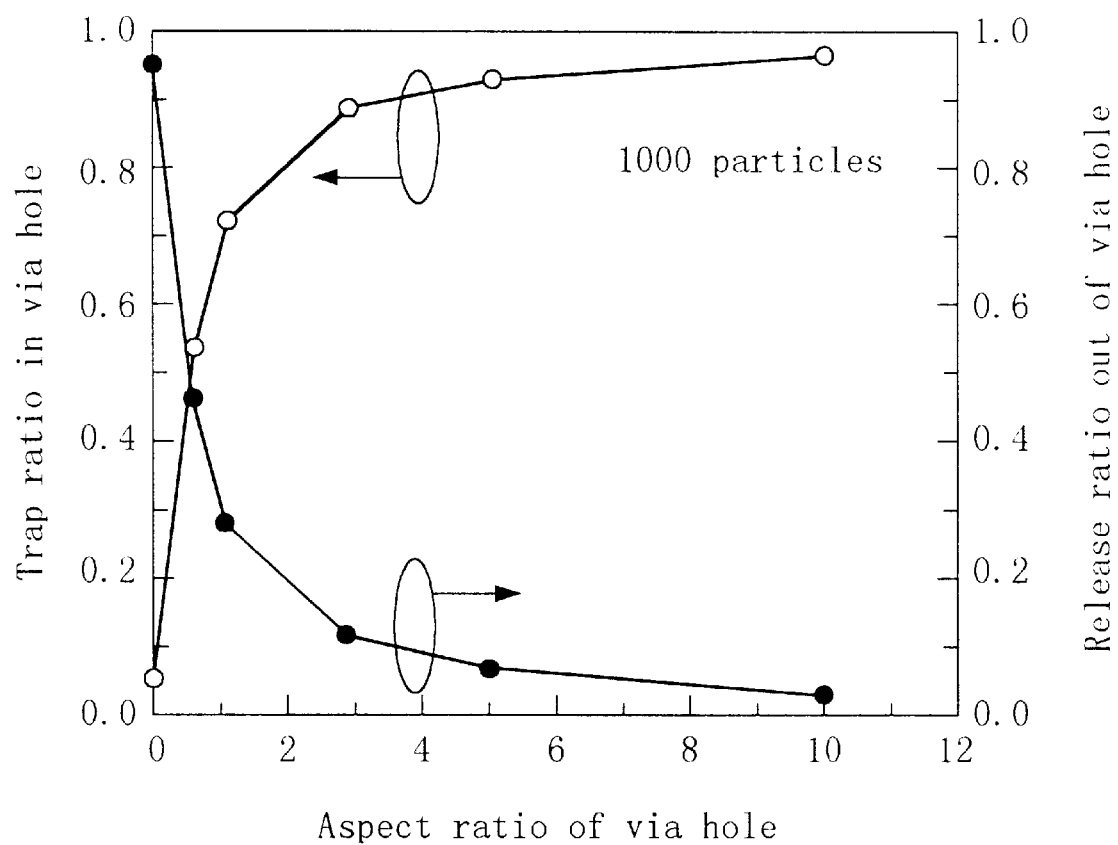
FIG. 28 shows the results of calculating the probability of an ion trapped in the hole and the probability of an ion scattered to the outside of the hole which vary depending on an aspect ratio based on the result of simulation shown in FIG. 27.

FIG. 28 shows the results of calculating the probability of an ion trapped in the hole and the probability of an ion scattered to the outside of the hole, which vary with a varying aspect ratio. As shown in FIGS. 27 and 28, Al ions are less likely to be scattered to the outside of the hole as the aspect ratio of the hole increases.

Figure 29:
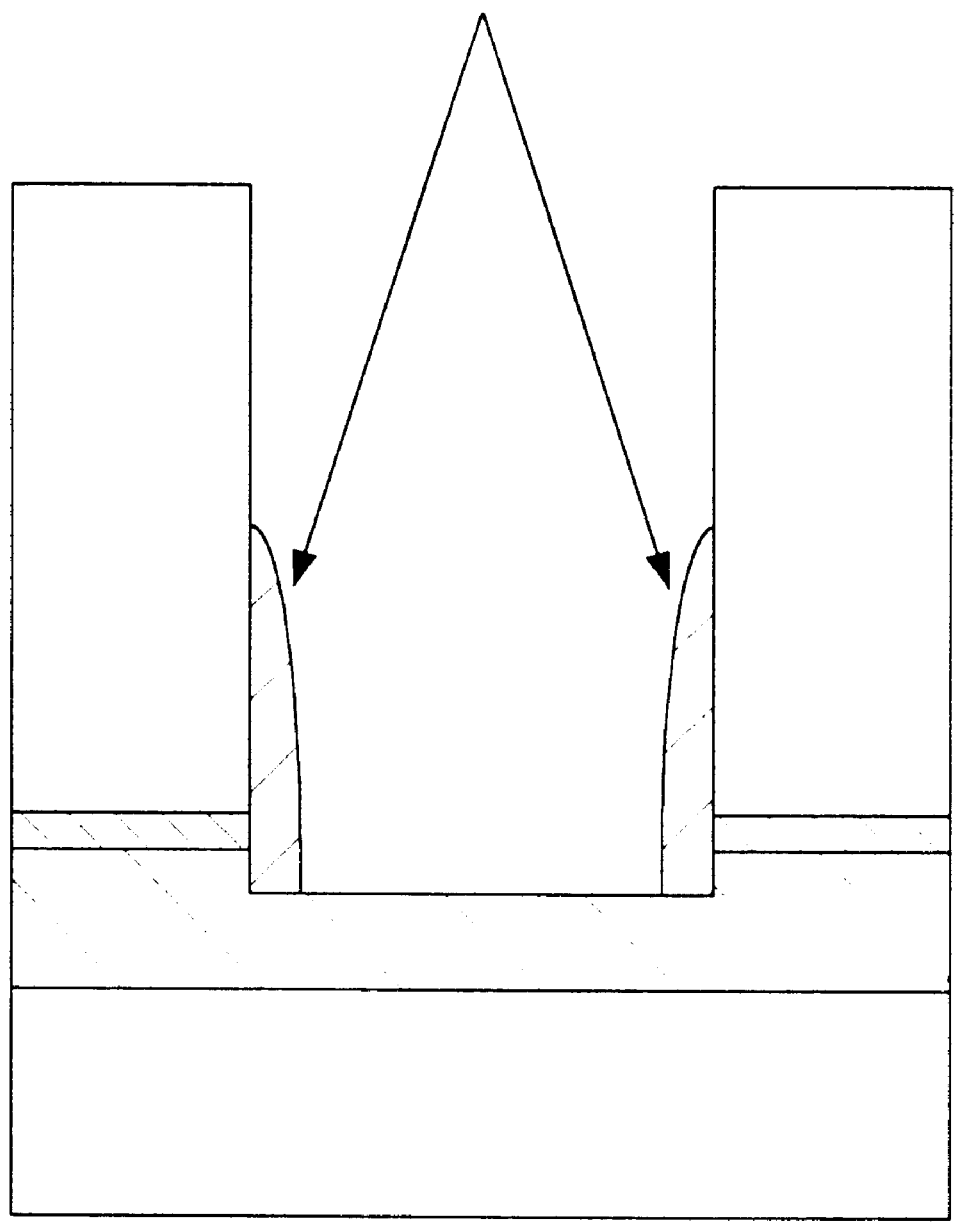
FIG. 29 is a cross-sectional view showing Al ions scattered from an Al wire and accumulated as a deposit on the side face of a hole in the eighth embodiment.

This may be because, in forming the hole with a high aspect ratio, the majority of Al ions scattered from the Al wire are accumulated as the deposit on the side face of the hole and trapped in the hole, as shown in FIG. 29.

Therefore, the probability of the occurrence of such an etch stop is high in the case of performing plasma etching to form the hole with a high aspect ratio such as the hole over the bonding pad. Every time a hole is formed over the bonding pad, metal ions are scattered and gradually accumulated in the reactor, while the etching species in the reactor is reduced, so that the etch stop occurs during processing after several wafers are etched.

To circumvent the etch stop resulting from metal contamination, the following means is effectively used.

In accordance with the first method, a surface of the metal member is prevented from being exposed in the chamber. If the surface of the metal member is exposed in the chamber, the bonding of the etching species to the metal occurs on the surface of the metal member to cause the reduction of the etching species (F or the like), resulting in the same effect as achieved when the surface of a metal wire is exposed. For example, metal may be added to an O ring used to maintain the air-tightness of the chamber but the metal used under such conditions also presents a problem. For example, the O ring 16 provided in the apparatus shown in FIG. 14 has conventionally been composed of silicon rubber with metal, such as aluminum, mixed therein. However, the O ring 16 used in the present embodiment is composed of silicon rubber containing no metal, which has proved to be effective in positively preventing the etch stop resulting from metal contamination. Preferably, a member containing ceramic using a metal oxide such as the O ring is not disposed in the chamber.

Figure 30:
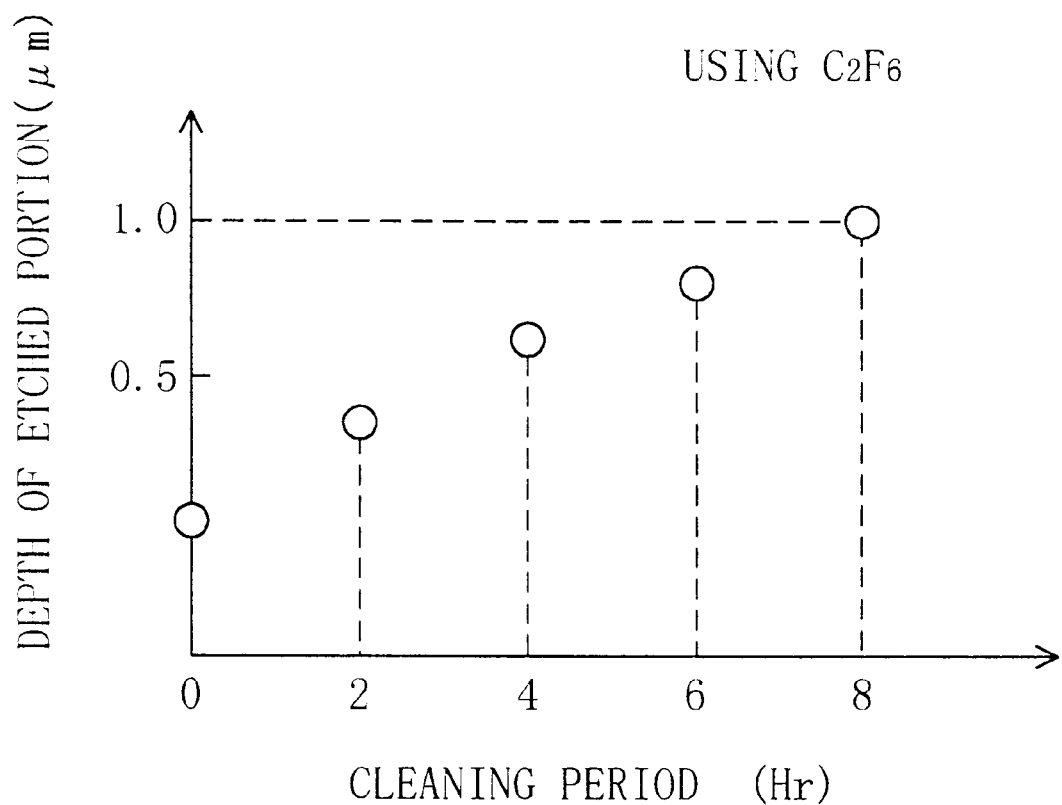
FIG. 30 shows the result of an experiment conducted to examine the degree of restoration after cleaning was performed by using a plasma of fluorocarbon under conditions under which an etch stop occurred in the eight embodiment.

In accordance with the second method, cleaning is performed by using a fluorocarbon or chlorofluorocarbon plasma in the reactor to remove metal ions. FIG. 30 shows the result of an experiment performed to examine the degree of restoration when cleaning was performed by using the fluorocarbon plasma under conditions under which the etch stop occurred. In the drawing, the horizontal axis represents a cleaning period and the vertical axis represents the depth of a hole which had been formed till a re-etching process was intercepted by the etch stop. The hole was formed in an oxide film with a thickness of 1 $\mu$m. The result of the experiment indicates that numerous metal ions were present in the reactor at the time when the etch stop occurred and that the reactor was gradually cleaned by removing the metal ions with the fluorocarbon plasma. As shown in FIG. 30, the depth of etching increases as the cleaning period increases and 8 hours is required to restore the reactor to the original state in which the concentration of metal ions is negligible. It has been proved by calculation and experiment that contamination caused by metal ions released when a hole with an aspect ratio of about 2.8 is etched is eliminated by a cleaning process of about 50 seconds per wafer, resulting in no etch stop.

As a variation of the second method, there is a method wherein a main etching process using a fluorocarbon plasma is performed for an intentionally elongated period with respect to a wafer currently processed in order to remove metal ions released in the reactor during the previous processing. Specifically, etching is performed by adjusting the bias power applied to a portion overlying the substrate to be lower than the normal value and thereby reducing the etch rate.

The typical representatives of metal used in the present embodiment include Al, Ti, and Cu but the metal is not limited thereto. Any metal reactive with the etching species (such as F) may be used in the present embodiment.

Other Embodiments

The present invention achieves particularly great effects when a region to be processed thereby is a film containing oxygen, e.g., an oxide film such as a silicon oxide film or an alumina film. This is because such a film composed of an oxide releases oxygen when it is etched and the aforesaid etch stop may occur if an etching selectivity to a silicon substrate or a polysilicon film is to be held high by utilizing the property of releasing oxygen during etching.

Although the sidewall of the chamber has been composed of the quartz dome or the silicon nitride dome in each of the foregoing embodiments, the present invention is not limited thereto. It is also possible to dispose the quartz dome or the like in the chamber. In that case, the reactor is a portion surrounded by the quartz dome or the like and oxygen may be generated from the outer wall face of the quartz dome or the like.

Although only the quartz dome has been used as an example of the oxygen containing member in each of the foregoing embodiments, it is also possible to compose the dome of an inorganic material containing another oxide as the main component.

Although each of the foregoing embodiments has described only etching as plasma processing, the present invention is not limited to such embodiments. The plasma processing in accordance with the present invention is also applicable to the case where, e.g., plasma processing is performed in an atmosphere of ammonia gas or nitrogen gas to introduce nitrogen into the semiconductor substrate and the metal wire at the bottom of the contact hole.

What is claimed is:

1. An apparatus for manufacturing a semiconductor device, said apparatus comprising:
   a reactor for performing etching with respect to a film on a wafer disposed therein;
   gas supplying means for introducing, into said reactor, etching gas containing at least carbon and fluorine;
   plasma generating means for changing said etching gas into a high-density plasma;
   concentration changing means for performing the function of changing an O concentration in said plasma, said concentration changing means being disposed in said reactor to have at least a part of a surface exposed therein; and
   adjusting means for adjusting the level of the concentration changing function performed by said concentration changing means.

2. An apparatus for manufacturing a semiconductor device according to claim 1, wherein
   said concentration changing means is an oxygen containing member,
   said adjusting means is an antenna coil disposed in proximity to said oxygen containing member, and
   said plasma generating means generates the high-density plasma in said reactor by supplying RF power to said antenna coil.

3. An apparatus for manufacturing a semiconductor device according to claim 1, wherein said plasma generating means is one of an inductively-coupled plasma generator, a helicon-wave plasma generator, and an ECR plasma generator, each for generating the high-density plasma with a density of $1\times10^{11}/cm^3$ or more.

4. An apparatus for manufacturing a semiconductor device according to claim 1, wherein said etching gas contains at least one of $CF_4$, $C_2F_6$, $C_3F_8$, $C_4F_8$, $C_5F_8$, and $C_6F_6$.

5. An apparatus for manufacturing a semiconductor device according to claim 1, further comprising:
   O-light-intensity detecting means for measuring an O light intensity in said plasma, wherein
   said adjusting means adjusts the level of the concentration changing function of said concentration changing means such that the O light intensity measured by said O-light-intensity detecting means is within a proper range.

6. An apparatus for manufacturing a semiconductor device according to claim 1, further comprising:
   O-light-intensity detecting means for measuring an O light intensity in said plasma; and
   F-light-intensity detecting means for measuring the F light intensity in said plasma, wherein
   said adjusting means adjusts the level of the concentration changing function of said concentration changing means such that the ratio of the O light intensity measured by said O-light-intensity detecting means to the F light intensity measured by said F-light-intensity detecting means is within a proper range.

7. An apparatus for manufacturing a semiconductor device according to claim 1, further comprising:
   O-light-intensity detecting means for measuring an O light intensity in said plasma; and C$_2$-light-intensity detecting means for measuring a C$_2$ light intensity in said plasma, wherein said adjusting means adjusts the level of the concentration changing function of said concentration changing means such that the ratio of the O light intensity measured by said O-light-intensity detecting means to the C$_2$ light intensity measured by said C$_2$-light-intensity detecting means is within the proper range.

8. An apparatus for manufacturing a semiconductor device according to claim 1, further comprising:

O-light-intensity detecting means for measuring an O light intensity in said plasma;

F-light-intensity detecting means for measuring a F light intensity in said plasma; and C$_2$-light-intensity detecting means for measuring C$_2$ light intensity in said plasma, wherein said adjusting means receives an output from each said of light-intensity detecting means and adjusts the level of the concentration changing function of said concentration changing means such that the ratio of O light intensity measured by said O-light-intensity detecting means to the F light intensity measured by said F-light-intensity detecting means is within a proper range and that the ratio of the O light intensity measured by said O-light-intensity detecting means to the C$_2$ light intensity measured by said C$_2$-light-intensity detecting means is within a proper range.

9. An apparatus for manufacturing a semiconductor device according to claim 1, wherein said concentration changing means is an oxygen containing member and said adjusting means is a heater for heating said oxygen containing member.

10. An apparatus for manufacturing a semiconductor device according to claim 1, wherein said concentration changing means is a silicon containing member disposed in said reactor to have at least a part of a surface exposed therein and said adjusting means is a heater for heating said silicon containing member.

11. An apparatus for manufacturing a semiconductor device according to claim 1, wherein each of said concentration changing means and said adjusting means is a carbon heater disposed in said reactor to have at least a part of a surface exposed therein.

12. An apparatus for manufacturing a semiconductor device according to claim 2, wherein said concentration changing means is composed of quartz, said etching gas is fluorocarbon gas, and said adjusting means heats said concentration changing means such that the temperature of said concentration changing means ranges from 180 to 300° C.

13. An apparatus for manufacturing a semiconductor device, said apparatus comprising:

a reactor for performing etching with respect to a film on a wafer disposed therein;

gas supplying means for introducing etching gas into said reactor; and plasma generating means for changing said etching gas into a high-density plasma, wherein a metal member having at least a part of a surface exposed in said reactor is not disposed therein.

14. An apparatus for manufacturing a semiconductor device according to claim 13, wherein said metal is at least one of Al, Ti, Cu, W, and Co.

15. A method of manufacturing a semiconductor device on a substrate, said method comprising:

a first step of disposing, in a reactor, a wafer including the substrate, a film formed on said substrate, and a mask formed on said film;

a second step of introducing gas into said reactor; and a third step of generating a plasma in said reactor and performing dry etching to form a hole in a portion of said film underlying an aperture of said mask, wherein said third step is performed while adjusting at least one of an O concentration and a C concentration in the plasma such that an etch stop which is a phenomenon caused by an abrupt transition in etch rate from a substantially constant value maintained during normal etching to zero does not occur.

16. A method of manufacturing a semiconductor device according to claim 15, wherein the O concentration in said plasma is adjusted such that a carbon containing product is deposited on said substrate after said hole is formed completely.

17. A method of manufacturing a semiconductor device according to claim 15, wherein a proper range of an O light intensity in said plasma is predetermined such that said etch stop does not occur and said third step includes adjusting the O concentration in said plasma, while measuring the O light intensity in said plasma, such that said O light intensity is within said proper range.

18. A method of manufacturing a semiconductor device according to claim 15, wherein a proper range of a ratio of an O light intensity to a F light intensity in said plasma is such that said etch stop does not occur, said second step includes introducing, into the reactor, either one of fluorocarbon gases and a gas mixture of the fluorocarbon gas and inert gas, and said third step includes adjusting a concentration ratio between O and F in said plasma, while measuring the O light intensity and the F light intensity in said plasma, such that the ratio of the O light intensity to the F light intensity is within the proper range.

19. A method of manufacturing a semiconductor device according to claim 18, wherein a proper range of the concentration ratio between O and F in said plasma is 4 to 10.

20. A method of manufacturing a semiconductor device according to claim 15, wherein a proper range of a ratio of an O light intensity to a C$_2$ light intensity in said plasma is such that said etch stop does not occur, said second step includes introducing, in the reactor, either one of fluorocarbon gases and a gas mixture of the fluorocarbon gas and inert gas, and said third step includes adjusting a concentration ratio between O and C$_2$ in said plasma, while measuring the O light intensity and the C$_2$ light intensity in said plasma, such that the ration of the O light intensity to the C$_2$ light intensity is within the proper range.

21. A method of manufacturing a semiconductor device according to claim 20, wherein a proper range of the concentration ratio between O and C in said plasma is 4 to 10.

22. A method of manufacturing a semiconductor device according to claim 15, wherein a proper range of a ratio of an O light intensity to a F light intensity in said plasma and a proper range of a ratio of the O light intensity to a $C_2$ light intensity in said plasma are such that said etch stop does not occur, said second step includes introducing, into the reactor, either one of fluorocarbon gases and a gas mixture of the fluorocarbon gas and inert gas, and said third step includes adjusting a concentration ratio between O, F, and $C_2$ in said plasma, while measuring the O light intensity, the F light intensity, and the $C_2$ light intensity in said plasma, such that the ratio of the O light intensity to the F light intensity is within the proper range and that the ratio of the O light intensity to the $C_2$ light intensity is within the proper range.

23. A method of manufacturing a semiconductor device according to claim 15, wherein a quartz member having a surface exposed in said reactor is disposed therein and said third step includes controlling the temperature of said quartz member.

24. A method of manufacturing a semiconductor device according to claim 15, wherein said third step includes introducing gas containing oxygen into said reactor and adjusting the amount of said gas containing oxygen.

25. A method of manufacturing a semiconductor device according to claim 15, wherein at least one of a carbon containing member, a fluorine containing member, and an oxygen containing member is disposed in said reactor and said third step includes adjusting a concentration ratio between O, F, and $C_2$ in said plasma by controlling at least one of the amounts of carbon, fluorine, and oxygen released from said respective members.

26. A method of manufacturing a semiconductor device according to claim 22, wherein said third step includes adjusting a concentration ratio between O, F, and $C_2$ by introducing, into said reactor, gas containing at least one of carbon, fluorine, and oxygen.

27. A method of manufacturing a semiconductor device according to claim 15, wherein said second step includes introducing, into said reactor, gas containing at least one of $CF_4$, $C_2F_6$, $C_3F_8$, $C_4F_8$, $C_5F_8$, and $C_6F_6$.

28. A method of manufacturing a semiconductor device according to claim 15, wherein said second step includes introducing, into said reactor, gas containing a compound represented by $C_xF_yO_z$ (where x, y, and z represent a component ratio).

29. A method of manufacturing a semiconductor device according to claim 15, wherein an aspect ratio of the aperture of said mask to said entire hole is 4 or higher and said hole has a diameter of 1 μm or less.

30. A method of manufacturing a semiconductor device according to claim 15, wherein said film is an oxide film.

31. A method of manufacturing a semiconductor device to be implemented by using an apparatus comprising a reactor having an oxygen containing member composed of a material containing oxygen at a wall portion thereof and an antenna coil disposed in proximity to said oxygen containing member, said method comprising:

a first step of measuring, in replacing said oxygen containing member, the amount of oxygen released from an oxygen containing member and composing said reactor of the oxygen containing member if it releases a desired amount of oxygen;

a second step of introducing gas into said reactor with a wafer to be formed with the semiconductor device being disposed in said reactor; and a third step of generating a high-density plasma in said reactor by supplying RF power to said antenna coil and performing etching for forming the semiconductor device.

32. A method of manufacturing a semiconductor device to be implemented by using an apparatus comprising a reactor having an oxygen containing member composed of a material containing oxygen at a wall portion thereof and an antenna coil disposed in proximity to said oxygen containing member, said method comprising:

a first step of measuring, in replacing said oxygen containing member, the amount of oxygen released from the oxygen containing member and determining a flow rate of gas containing oxygen such that a desired amount of oxygen is released;

a second step of introducing gas into said reactor with a wafer to be formed with the semiconductor device being disposed in said reactor;

a third step of generating a high-density plasma in said reactor by supplying RF power to said antenna coil; and a fourth step of performing etching for forming the semiconductor device, while introducing the gas containing oxygen into said chamber at the flow rate determined in said first step.

33. A method of manufacturing a semiconductor device to be implemented by using an apparatus comprising a reactor having an oxygen containing member composed of a material containing oxygen at a wall portion thereof, an antenna coil disposed in proximity to said oxygen containing member, gas supplying means for introducing gas into said reactor, plasma generating means for generating an inductively coupled plasma, a helicon-wave plasma, or an ECR plasma in said reactor by supplying RF power to said antenna coil, and light-intensity detecting means for measuring an O light intensity in said plasma, said method comprising:

a first step of introducing gas into said reactor with a wafer to be formed with the semiconductor device being disposed in said reactor;

a second step of generating a plasma in the reactor by using said plasma generating means and performing etching for forming a hole in a part of said wafer; and a third step of preventing the subsequent wafer from being etched when a detect value from said light-intensity detecting means satisfies a condition inducing an etch stop which is a phenomenon caused by an abrupt transition in etch rate from a substantially constant value maintained during normal etching to zero.

34. A method of manufacturing a semiconductor device according to claim 33, wherein said gas supplying means supplies fluorocarbon gas and said light-intensity detecting means also measures a F light intensity in said plasma, said method further comprising the step of calculating a ratio of said O light intensity to said F light intensity, wherein said third step includes preventing the subsequent wafer from being etched when the light intensity ratio calculated by said calculating means satisfies a condition inducing said etch stop.

35. A method of manufacturing a semiconductor device to be implemented by using an apparatus comprising a reactor for performing etching with respect to a film on a wafer disposed therein, gas supplying means for introducing etching gas into said reactor, plasma generating means for changing said etching gas into a high-density plasma, and a metal member disposed in said reactor to have at least a part of a surface exposed therein, said method comprising:

a first step of introducing the etching gas into said reactor with the wafer to be formed with the semiconductor device being disposed in said reactor;

a second step of generating the plasma in the reactor by using said plasma generating means and performing etching for forming a hole in a part of said wafer; and a third step of supplying, after forming said hole, a flow of said etching gas for a given period of time to remove metal ions generated from said metal member in said reactor.

36. A method of manufacturing a semiconductor device according to claim 35, wherein said second step includes performing the etching for forming a hole in a part of said wafer at an etch rate lower than a standard value to remove the metal ions generated from said metal member in said reactor, said second step also serving as said third step for the preceding wafer.

* * * * *